(12) United States Patent
Yamashita

(10) Patent No.: US 6,556,012 B2
(45) Date of Patent: Apr. 29, 2003

(54) MAGNETIC RESONANCE IMAGING APPARATUS

(75) Inventor: Masatoshi Yamashita, Otawara (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/764,221

(22) Filed: Jan. 19, 2001

(65) Prior Publication Data

US 2001/0022515 A1 Sep. 20, 2001

(30) Foreign Application Priority Data

| Jan. 21, 2000 | (JP) | 2000-013234 |
| Feb. 7, 2000 | (JP) | 2000-029601 |
| Oct. 4, 2000 | (JP) | 2000-305060 |
| Dec. 28, 2000 | (JP) | 2000-400361 |

(51) Int. Cl.$^7$ ................................. G01V 3/00
(52) U.S. Cl. ................ 324/318; 324/309; 324/307
(58) Field of Search .................. 324/318, 309, 324/322, 300, 307, 311

(56) References Cited

U.S. PATENT DOCUMENTS

| 4,652,824 A | 3/1987 | Oppelt ................ 324/318 |
| 5,053,711 A | 10/1991 | Hayes et al. .......... 324/318 |
| 5,278,502 A | 1/1994 | Laskaris et al. ........ 324/318 |
| 5,361,763 A | 11/1994 | Kao et al. ........... 128/653.1 |
| 5,404,882 A | 4/1995 | Santyr ............... 128/653.1 |
| 5,489,848 A | 2/1996 | Furukawa ............. 324/318 |
| 5,764,059 A | 6/1998 | Mansfield et al. ....... 324/318 |
| 5,793,210 A | 8/1998 | Pla et al. ............ 324/318 |
| 6,022,195 A | 2/2000 | Gaudet et al. .......... 417/27 |
| 6,043,653 A | 3/2000 | Takamori et al. ....... 324/309 |
| 6,157,276 A | 12/2000 | Hedeen et al. ......... 335/216 |
| 6,353,319 B1 | 3/2002 | Dietz et al. ........... 324/318 |
| 6,406,427 B1 | 6/2002 | Williams et al. ........ 600/301 |
| 6,437,568 B1 | 8/2002 | Edelstein et al. ....... 324/318 |
| 6,441,614 B1 | 8/2002 | Edelstein et al. ....... 324/318 |

FOREIGN PATENT DOCUMENTS

| JP | 59-174746 | 10/1984 |
| JP | 63-246146 | 10/1988 |
| JP | 6-189932 | 7/1994 |
| JP | 2642348 | 5/1997 |
| JP | 10-118043 | 5/1998 |
| JP | 10-179547 | 7/1998 |

*Primary Examiner*—Edward Lefkowitz
*Assistant Examiner*—Brij B. Shrivastav
(74) *Attorney, Agent, or Firm*—Nixon & Vanderhye P.C.

(57) ABSTRACT

A magnetic resonance imaging apparatus generates an MR signal from an object to be examined by applying a gradient field pulse generated by a gradient field coil and a high-frequency magnetic field pulse generated by a high-frequency coil onto the object in a static field generated by a static field magnet, and reconstructs an image on the basis of the MR signal. The gradient field coil is housed in a sealed vessel. A cable extending from an external power supply and connected to the gradient field coil has predetermined flexibility.

6 Claims, 28 Drawing Sheets

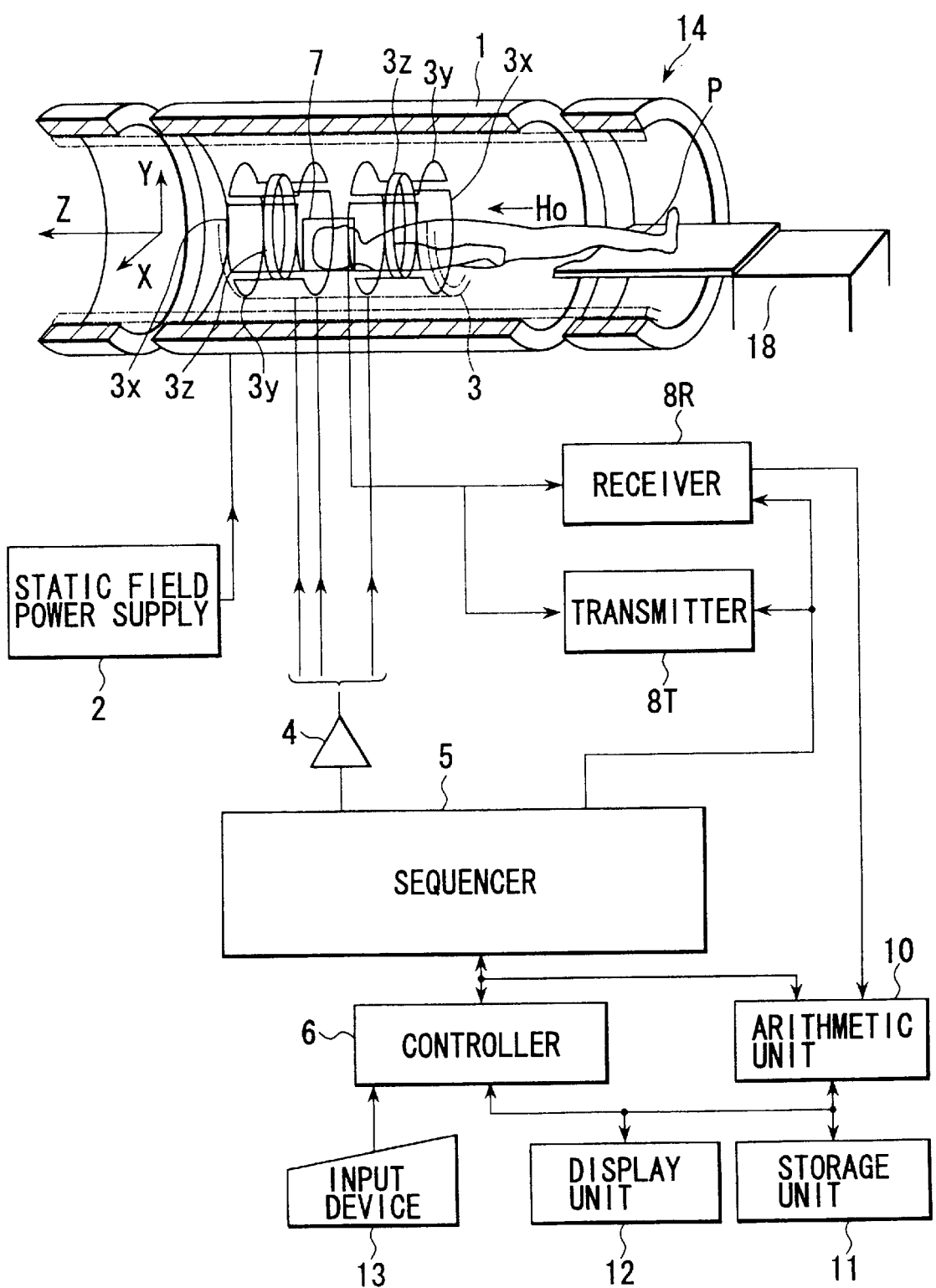
F I G. 27

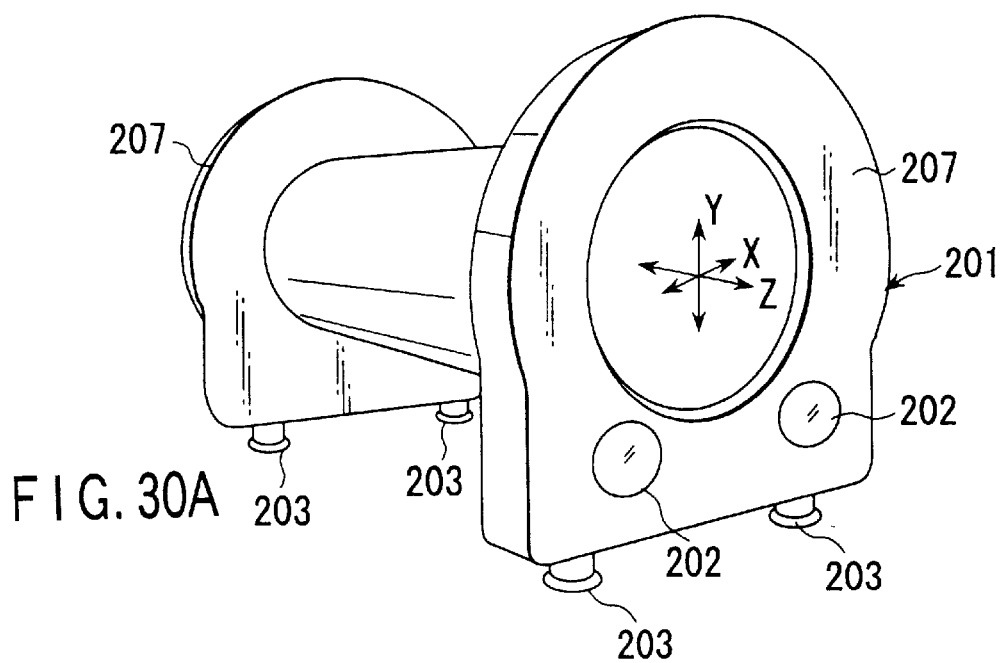
FIG. 30A
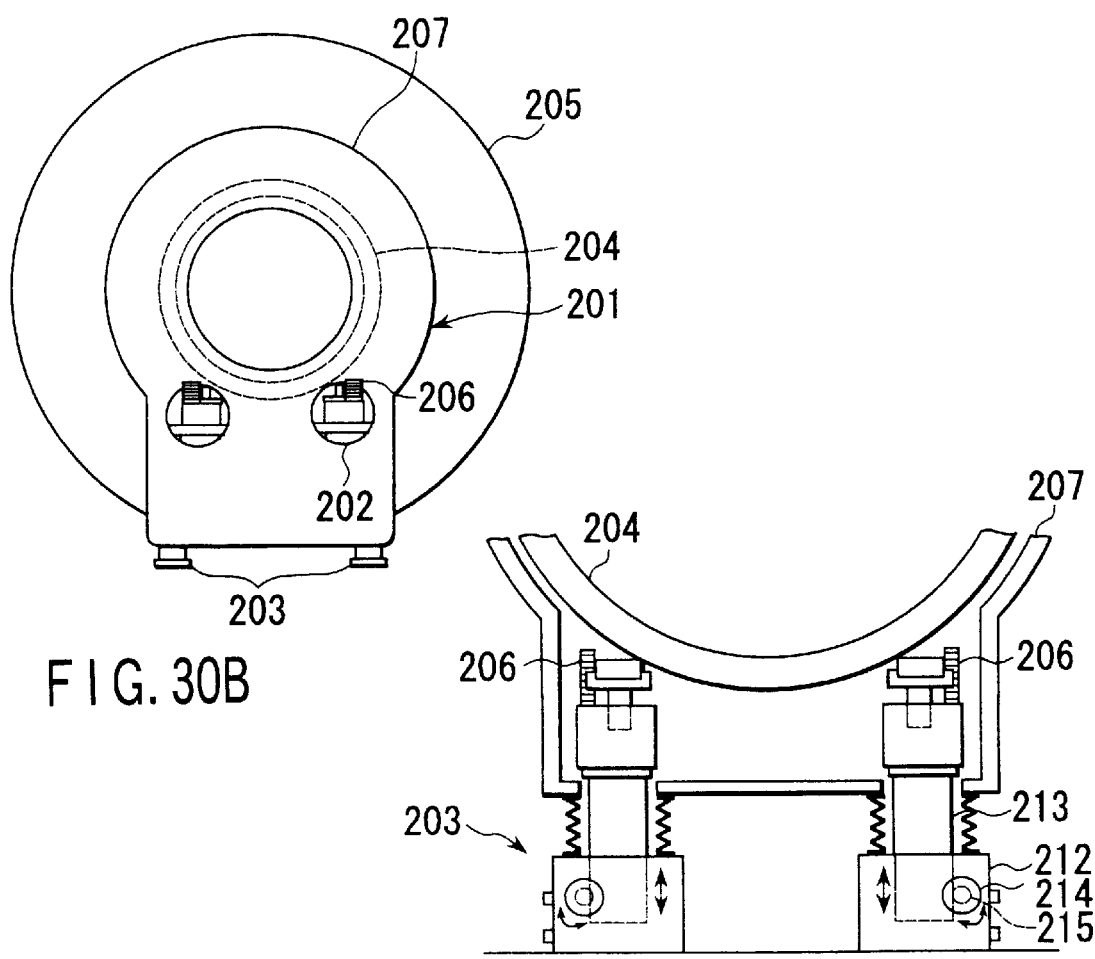
FIG. 30B
FIG. 30C

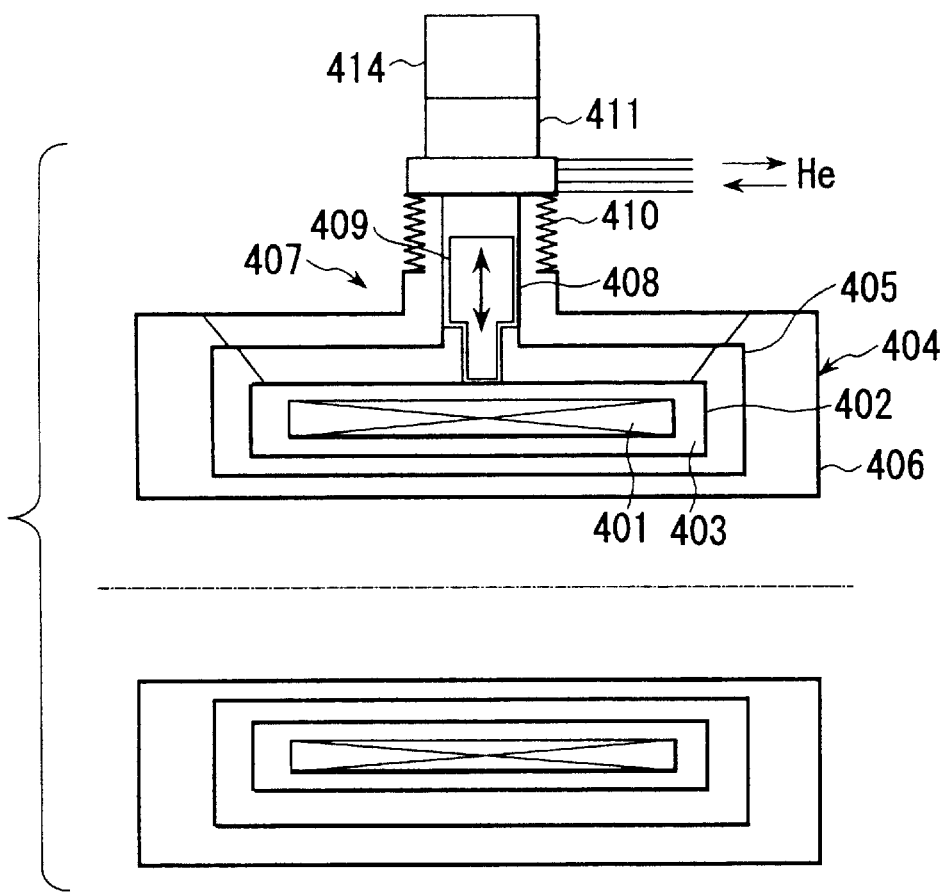
FIG. 33
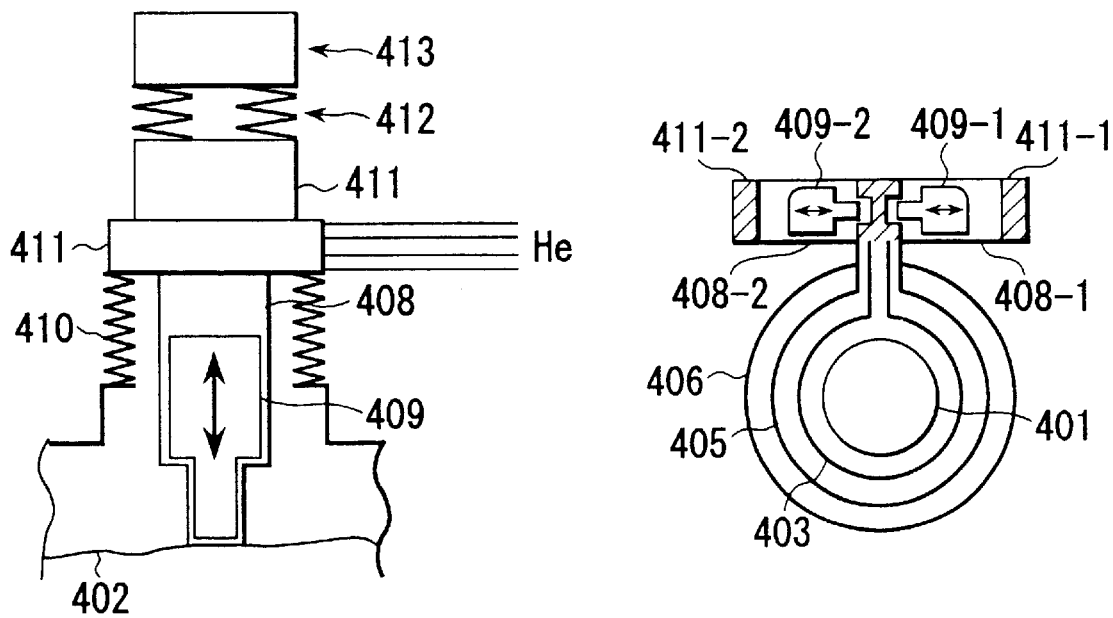
FIG. 34
FIG. 35

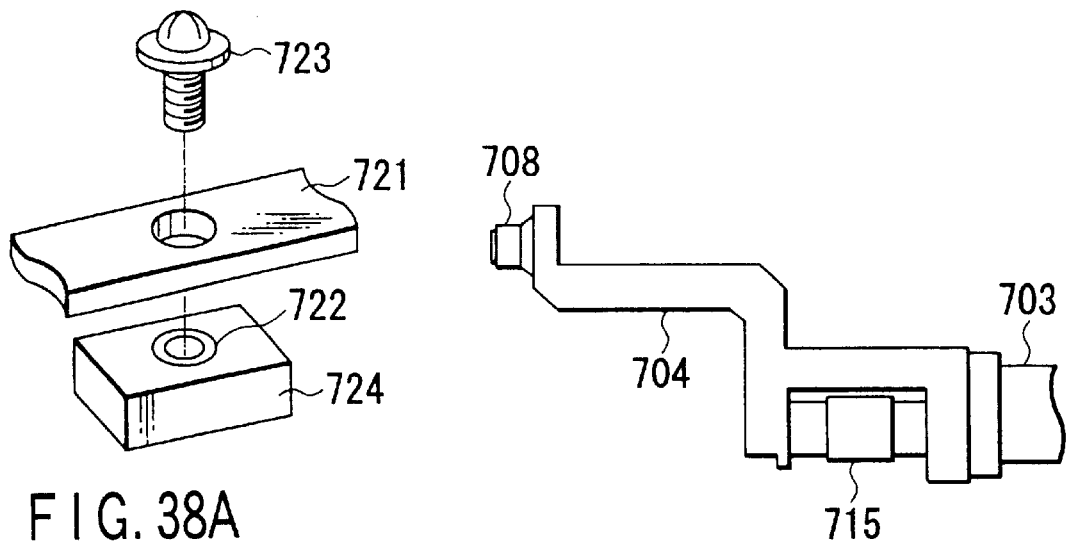
FIG. 38A
FIG. 39
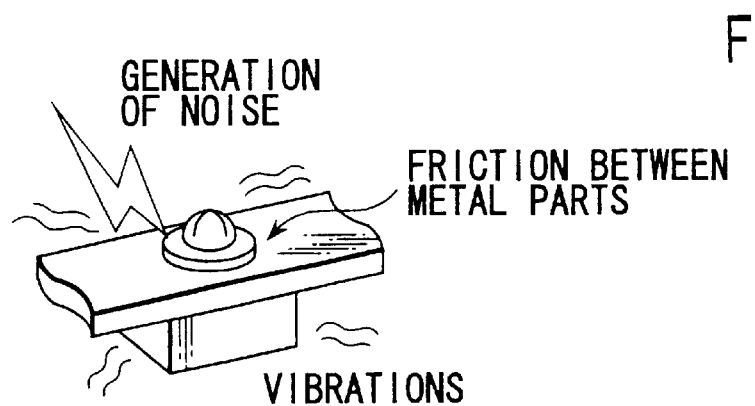
FIG. 38B
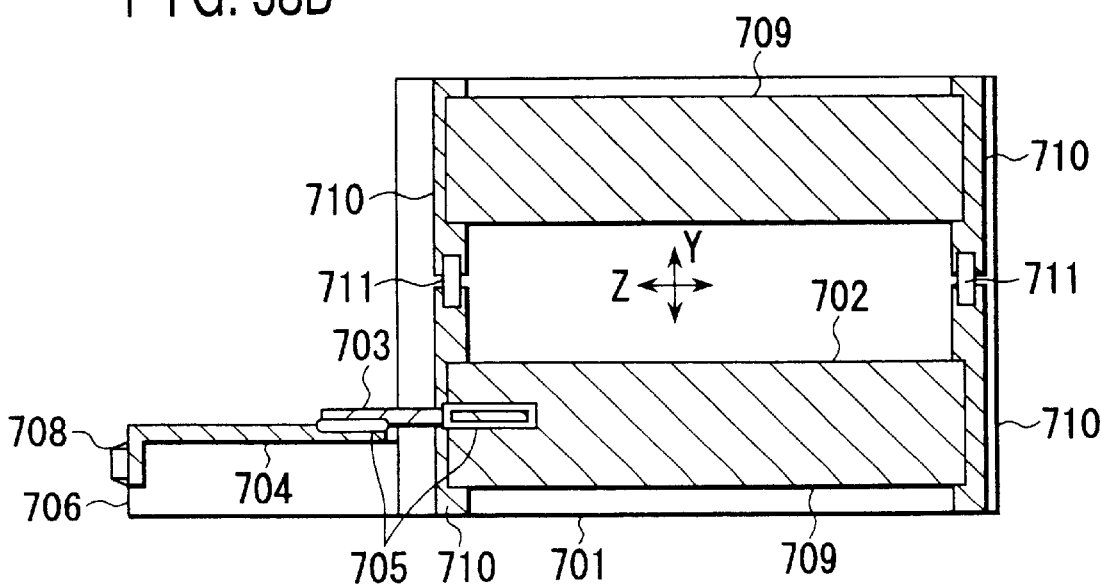
FIG. 40

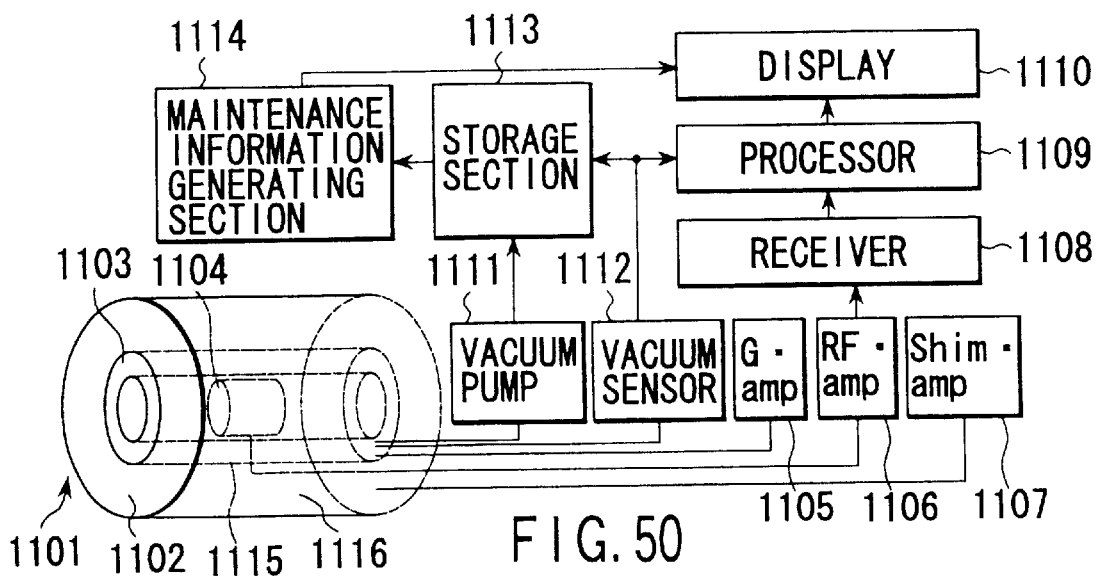
FIG. 50
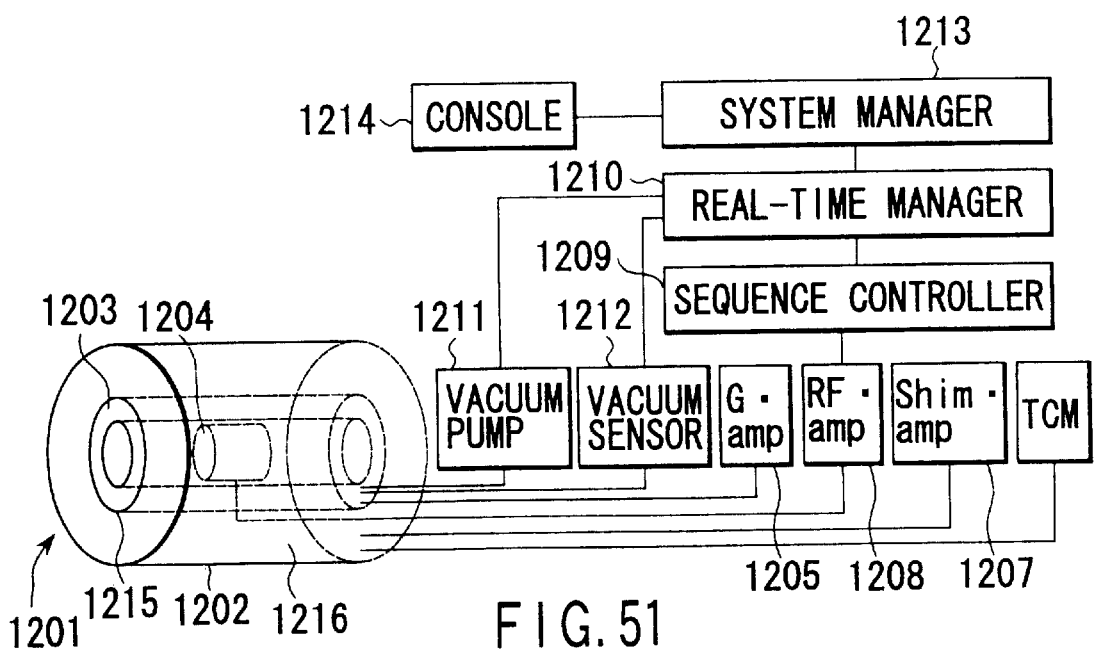
FIG. 51
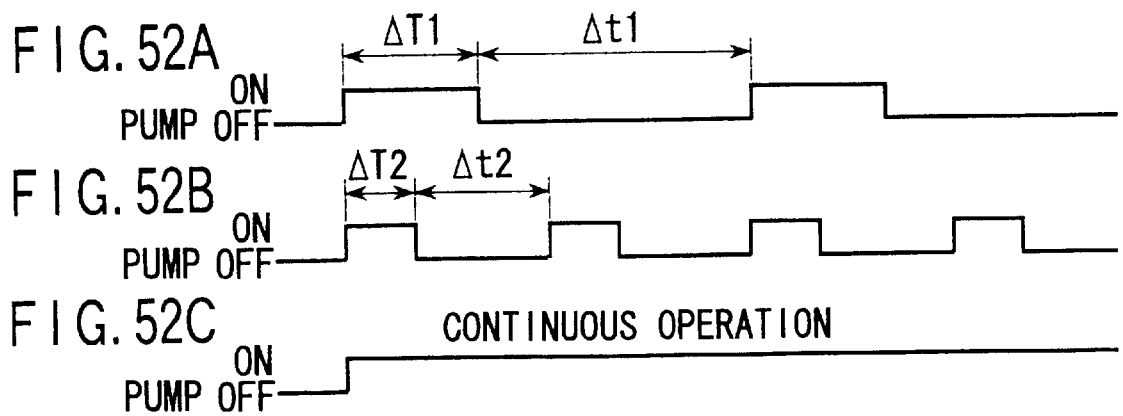
FIG. 52A
FIG. 52B
FIG. 52C

MAGNETIC RESONANCE IMAGING APPARATUS

BACKGROUND OF THE INVENTION

The present invention relates to a magnetic resonance imaging apparatus for generating a magnetic resonance signal (MR signal) by applying a gradient field pulse and high-frequency magnetic field pulse to an object to be examined which is placed in a homogeneous static field, and generating a magnetic resonance image (MR image) on the basis of this MR signal.

In general, a magnetic resonance imaging apparatus of this type includes a static field magnet for generating a static field, a gradient field coil for generating a gradient field, and an RF coil for generating a high-frequency (RF) magnetic field pulse. An object to be examined is placed in the static field formed by the static field magnet. A gradient field pulse and RF magnetic field pulse are applied to this object in accordance with an arbitrarily selected pulse sequence. As a consequence, an MR signal is generated from the object. This MR signal is received via the RF coil. An MR image is reconstructed on the basis of the, received MR signal.

In the recent technical field of magnetic resonance imaging apparatuses, with improvements in fast imaging technology, research and development have been vigorously carried out. MRI fast imaging requires fast switching of a gradient field and an increase in strength. For this reason, the gradient field coil vibrates. The vibrations cause noise. This noise sometimes reaches 100 db(A) or higher. This makes it necessary for an object to wear earplugs or headphones.

A typical measure against noise is to house a gradient field coil in a sealed vessel, as disclosed in Jpn. Pat. Appln. KOKAI Publication No. 63-246146, U.S. Pat. No. 5,793,210, and Jpn. Pat. Appln. KOKAI Publication No. 10-118043. The sealed vessel is evacuated to a nearly vacuum to suppress air-born propagation of noise.

Another typical measure against noise is to support a gradient field coil by a damper. This suppresses solid-born propagation of the vibrations of the gradient field coil to the sealed vessel and other parts.

Noise can be reduced to a certain degree by such measures against noise. However, it is impossible to further reduce the noise. This is because it is assumed that the gradient field coil is not the only noise source.

BRIEF SUMMARY OF THE INVENTION

It is an object of the present invention to provide a magnetic resonance imaging apparatus which has an excellent effect of reducing noise and vibrations.

A magnetic resonance imaging apparatus generates an MR signal from an object to be examined by applying a gradient field pulse generated by a gradient field coil and a high-frequency magnetic field pulse generated by a high-frequency coil onto the object in a static field generated by a static field magnet, and reconstructs an image on the basis of the MR signal. The gradient field coil is housed in a sealed vessel. A cable extending from an external power supply and connected to the gradient field coil has predetermined flexibility.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out herein after.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 27 is a view showing the basic arrangement of a magnetic resonance imaging apparatus according to the fourth embodiment;

FIG. 30A is a perspective view of a sealed vessel according to the fourth embodiment;

FIG. 30B is a front view of a sealed vessel according to the fifth embodiment;

FIG. 30C is a partial sectional view of the closed vessel according to the fifth embodiment;

FIG. 33 is a longitudinal sectional view of the cryostat of a static field magnet according to the seventh embodiment;

FIG. 34 is a view showing the internal structure of a dynamic vibration absorber in FIG. 33;

FIG. 35 is a view showing the internal structure of a cold head portion in another example of the eighth embodiment;

FIG. 38A is a perspective view showing the principle of the occurrence of noise radio waves in the 10th embodiment;

FIG. 38B is a perspective view showing the principle of the occurrence of noise radio waves in the 10th embodiment;

FIG. 39 is a view showing a tuner copper-plate and its connection parts in the 10th embodiment;

FIG. 40 is a view showing an example of how metal parts are connected to each other in the 10th embodiment;

FIG. 50 is a view showing the arrangement of the main part of a magnetic resonance imaging apparatus according to the 15th embodiment;

FIG. 51 is a view showing the arrangement of the main part of the magnetic resonance imaging apparatus according to the 15th embodiment;

FIG. 52A is a timing chart showing the first driving pattern of a vacuum pump in the 15th embodiment;

FIG. 52B is a timing chart showing the second driving pattern of the vacuum pump in the 15th embodiment; and FIG. 52C is a timing chart showing the third driving pattern of the vacuum pump in the 15th embodiment.

DETAILED DESCRIPTION OF THE INVENTION

Embodiment 1

Figure 1:
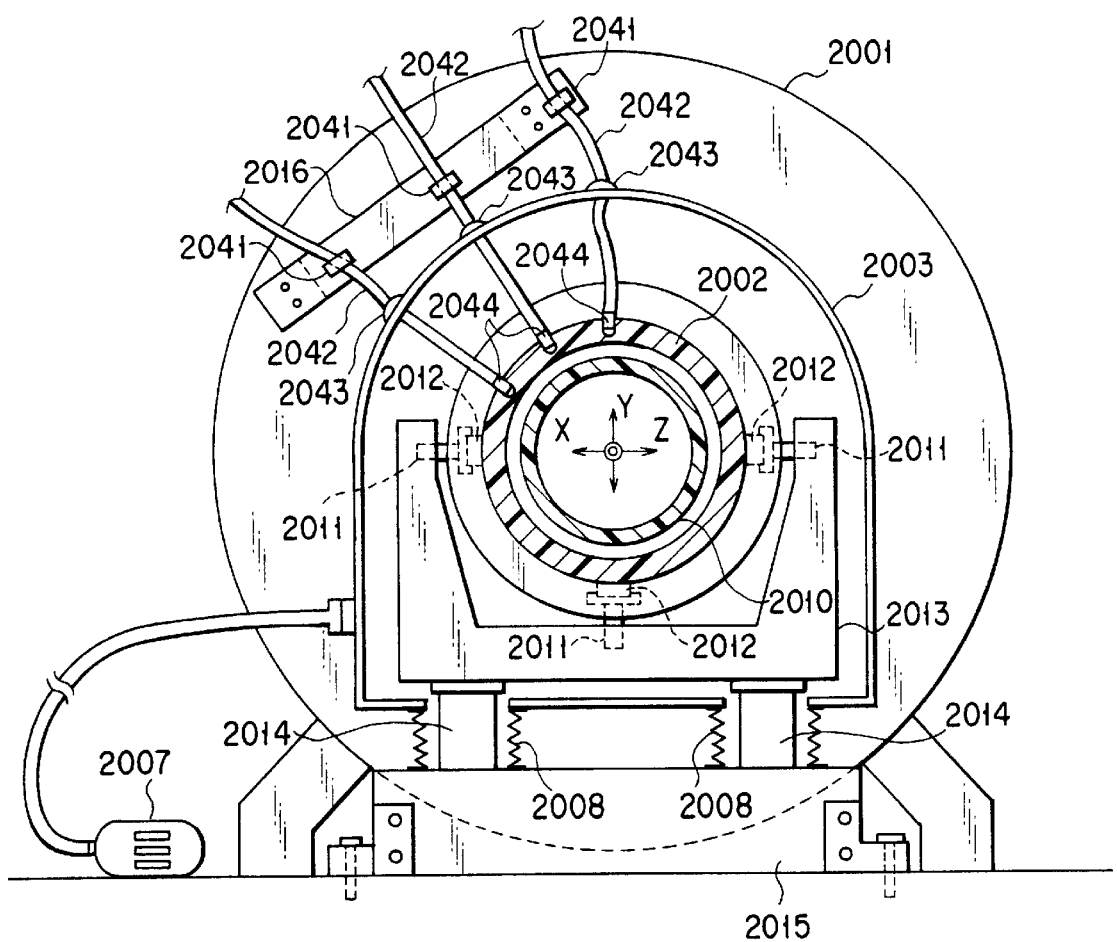
FIG. 1 is a front view showing the interior of the gantry of a magnetic resonance imaging apparatus according to Embodiment 1 of the present invention.
Figure 2:
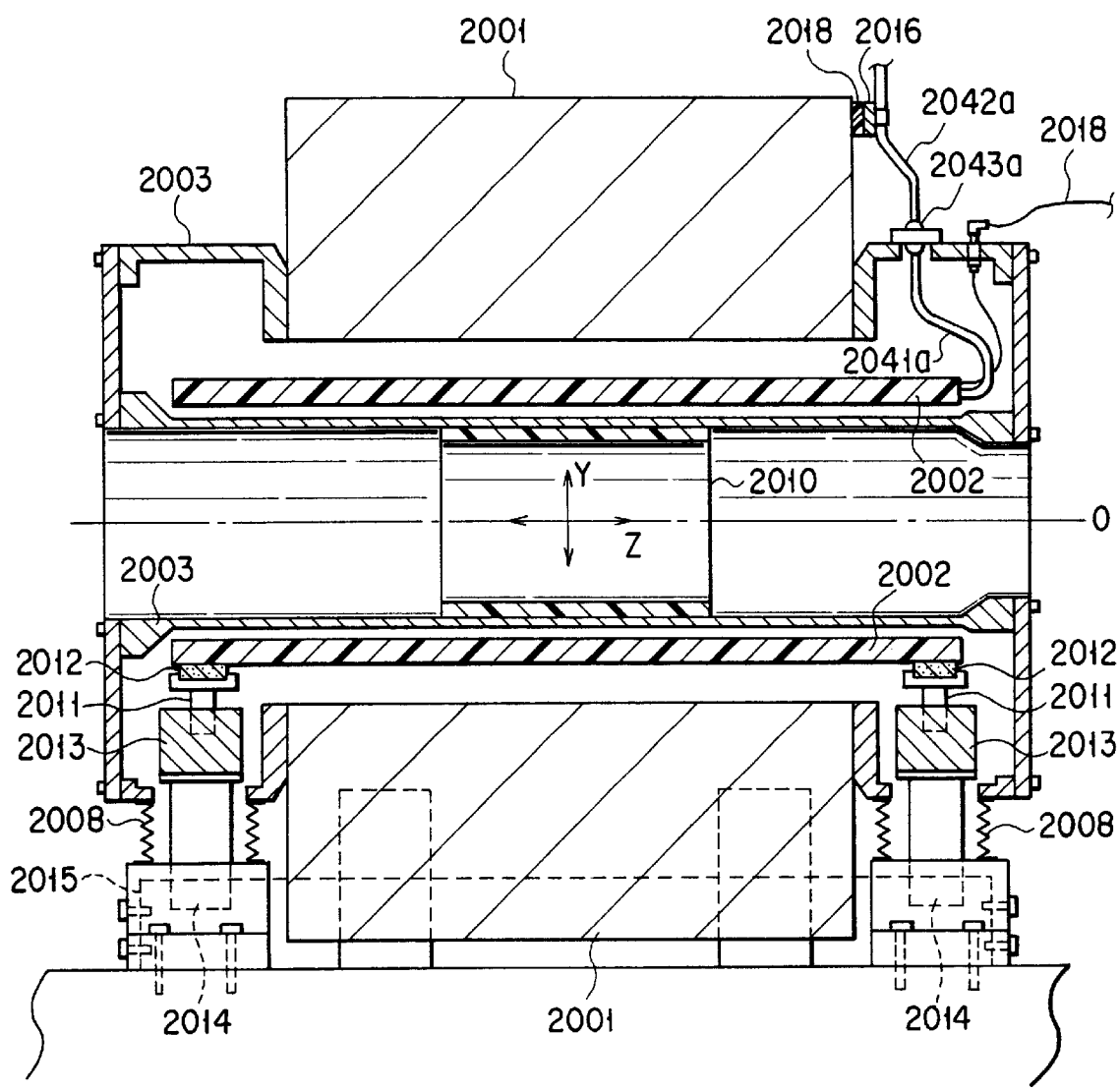
FIG. 2 is a longitudinal sectional view of the gantry according to Embodiment 1.

FIG. 1 is a view showing the internal arrangement of the gantry of a magnetic resonance imaging apparatus according to Embodiment 1. FIG. 2 is a longitudinal sectional view of FIG. 1. A substantially cylindrical static field magnet 2001 is comprised of, for example, a superconductive coil that is set in a superconductive state at an extremely low temperature and generates a homogenous static field and a cryostat for maintaining the extremely low temperature state of the superconductive coil. For the sake of convenience, three orthogonal axes (X-, Y-, and Z-axes) are defined with the central axis of the static field magnet 2001 being regarded as the Z-axis.

A substantially cylindrical gradient field coil 2002 is placed inside the static field magnet 2001. The gradient field coil 2002 is an ASGC (Actively Shielded Gradient Coil). The actively shielded gradient coil 2002 is made up of a main coil for generating a gradient field and an active shield coil which is placed outside the main coil to generate a magnetic field in the opposite direction to the gradient field so as to prevent it from leaking out. An RF coil 2010 for transmitting a high-frequency (RF) magnetic field to the object and receiving a magnetic resonance (MR) signal from the object is placed inside the gradient field coil 2002.

The gradient field coil 2002 is supported on an arm 2013 via vibration absorbing members 2012 and position adjustment bolts 2011. The vibration absorbing member 2012 is made of an elastic material, e.g., rubber, and serves to prevent or suppress the propagation of the solid vibrations of the gradient field coil 2002 to the arm 2013 via the position adjustment bolt 2011. The arm 2013 is supported on a column 2014 on a base 2015.

The gradient field coil 2002 is housed in a sealed vessel 2003 for an anti-noise measure. The bore of the cryostat of the static field magnet 2001 also serves as the outer wall of the sealed vessel 2003. The airtightness between the sealed vessel 2003 and the base 2015 is ensured by a metal bellows 2008.

A vacuum pump 2007 is connected to the sealed vessel 2003. The vacuum pump 2007 evacuates the sealed vessel 2003. This evacuation maintains a vacuum or a pressure at least lower than the atmospheric pressure in the sealed vessel 2003. A sound insulating effect is given by $$S=20 \log_{10}(P1/1.01325 \times 10^5) \text{(decibel: dB)}$$

where P1 is the pressure in the sealed vessel 2003.

If the pressure in the sealed vessel 2003 is, for example, 1,000 pascals, a sound insulating effect of about 40 dB can be obtained.

A tube 2018 is connected to the gradient field coil 2002 via the sealed vessel 2003. Cooling water is circulated via the tube 2018.

The gradient field coil 2002 vibrates due to high-speed switching. The leakage of noise due to this vibration is reduced by the sealed vessel 2003. Most of solid vibrations are absorbed by the vibration absorbing member 2012, and the vibrations hardly propagate to the base 2015. In addition, the following measures are taken against noise and vibrations.

The first measure is taken against the vibrations of a cable for supplying a current from an external power supply to the gradient field coil 2002. The cable passes through a static field. Owing to high-speed switching, the direction of the current flowing in the cable is inverted at high speed. This current inversion generates the Lorents force in opposite directions alternately. The cable itself therefore vibrates.

The Lorents force is generated by a current component crossing magnetic lines of force in a static field. The Lorents force can be reduced by reducing this current component.

For this purpose, in this embodiment, as shown in FIG. 1, cables 2042 are radially arranged along the radial direction of the cylinder of the static field magnet 2001 to be substantially parallel to the magnetic lines of force in the static field.

Each cable 2042 extends from the gradient field coil 2002, passes through a hole 2043 formed in the sealed vessel 2003, and is mounted on a cable mount plate 2016 of the cryostat of the static field magnet 2001. A cable mount portion 2041 of the cable mount plate 2016, the hole 2043 of the sealed vessel 2003, and a lead portion 2044 of the cable 2042 from the gradient field coil 2002 are arranged on a straight line passing through the Z-axis.

By radially arranging the cables 2042 in this manner, the current component crossing the magnetic lines of force can be reduced to reduce the Lorents force. This makes it possible to reduce the vibrations of the cables 2042 themselves.

The second measure is taken to reduce the solid-born propagation of the vibrations caused by the gradient field coil 2002 and cables 2042 to the sealed vessel 2003 and the cryostat of the static field magnet 2001 via the cables 2042.

The cable 2042 is given flexibility to have a minimum bend radius equal to or less than four times the outer diameter of the cable. This flexibility can be realized by thinning the cable 2042 and selecting a proper coating material. To thin the cable 2042, a plurality of conductive wires are bundled into a plurality of cables instead of one cable. This can decrease the outer diameter of each cable. In addition, polyethylene or silicone is selected as a coating material for the cable 2042.

An increase in the flexibility of the cable 2042 suppresses the solid-born propagation of the vibrations of the gradient field coil 2002 and static field magnet 2001 to the sealed vessel 2003 and the cryostat of the static field magnet 2001 via the cables 2042.

Figure 3:
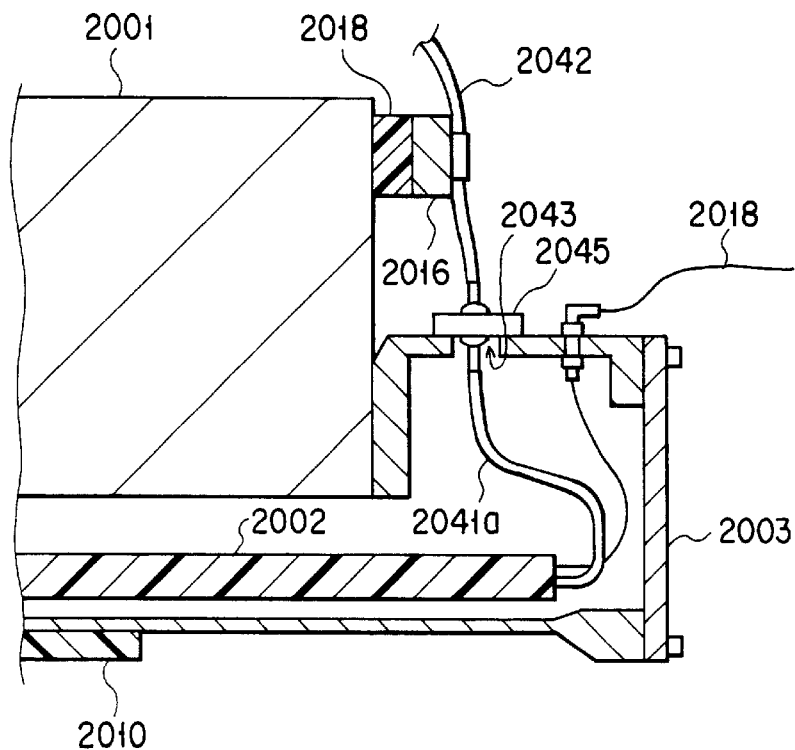
FIG. 3 is an enlarge view of a portion in FIG. 2.

The third measure is taken for the same purpose as that of the second measure. As described above, the cables 2042 are mounted on the cable mount plate 2016 of the cryostat of the static field magnet 2001. As shown in FIG. 3, the cable mount plate 2016 is attached to an end face of the cryostat of the static field magnet 2001 via the elastic member 2018 such as an antivibration rubber member. With this structure, even if vibrations propagate to the cable mount plate 2016 via the cables 2042, the vibrations are damped by the elastic member 2018 and hardly propagate to the cryostat of the static field magnet 2001.

The cable 2042 are provided outside via the holes 2043 of the sealed vessel 2003. Elastic members 2045 as antivibration rubber members are bonded to the holes 2043. Holes are formed in the elastic members 2045, and the cables 2042 extend through the holes. With this structure, the vibrations of the cables 2042 are damped by the elastic members 2045 and hardly propagate to the sealed vessel 2003.

The fourth measure is to fix the cable mount plate 2016, 2021 on which the cables 2042 are mounted not only to the cryostat of the static field magnet 2001 and but also to the base 2015. The base 2015 is made of concrete and very heavy and is firmly fixed to a concrete floor with bolts. The base 2015 therefore hardly vibrates.

By fixing a cable mount plate 2016, 2021 to the base 2015 in this manner, the vibrations of the cable mount plate 2016, 2021 can be suppressed.

The present invention is not limited to the above embodiment and can be practiced in various modifications.

For example, the above four types of measures against noise are independent of each other, and the effect of the present invention can be obtained even if each of the measures is executed singly. In addition, the present invention can be applied to a magnetic resonance imaging apparatus having an apparatus arrangement in which the gradient field coil is not housed in a sealed vessel or an apparatus arrangement in which no vibration absorbing unit is provided for the gradient field coil. Furthermore, the static field generating scheme to be used is not limited to the one using the superconductive coil, and the gradient field coil to be used is not limited to the actively shielded gradient coil.

Embodiment 2

Problems in the prior art which are solved by Embodiment 2 will be described first.

Figure 5:
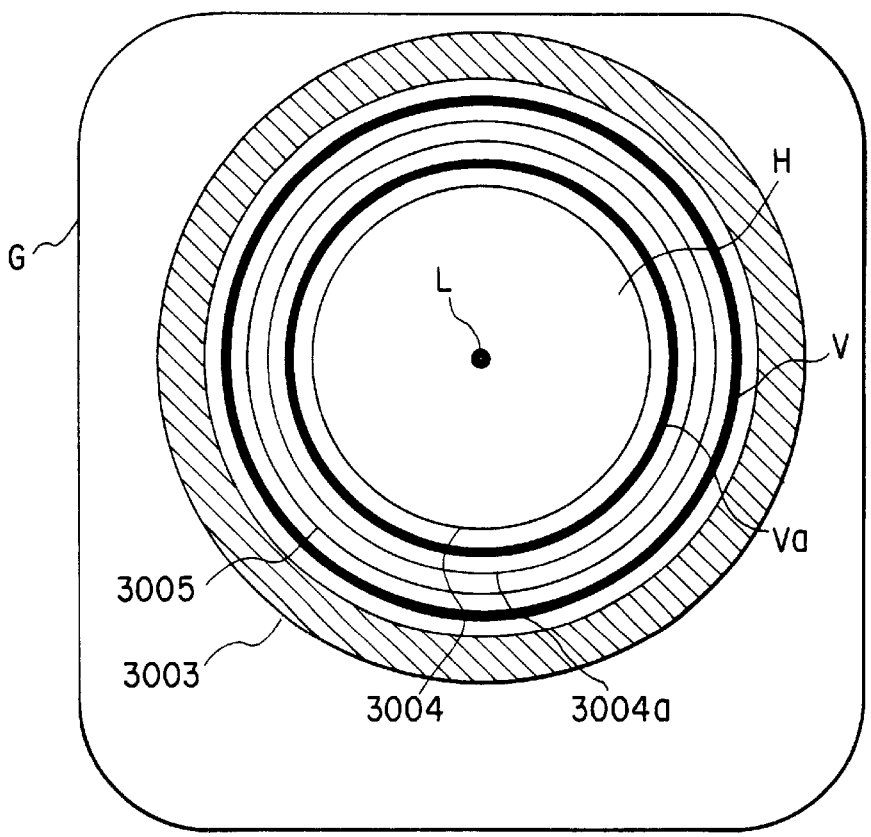
FIG. 5 is a supplementary view of Embodiment 2.
Figure 4:
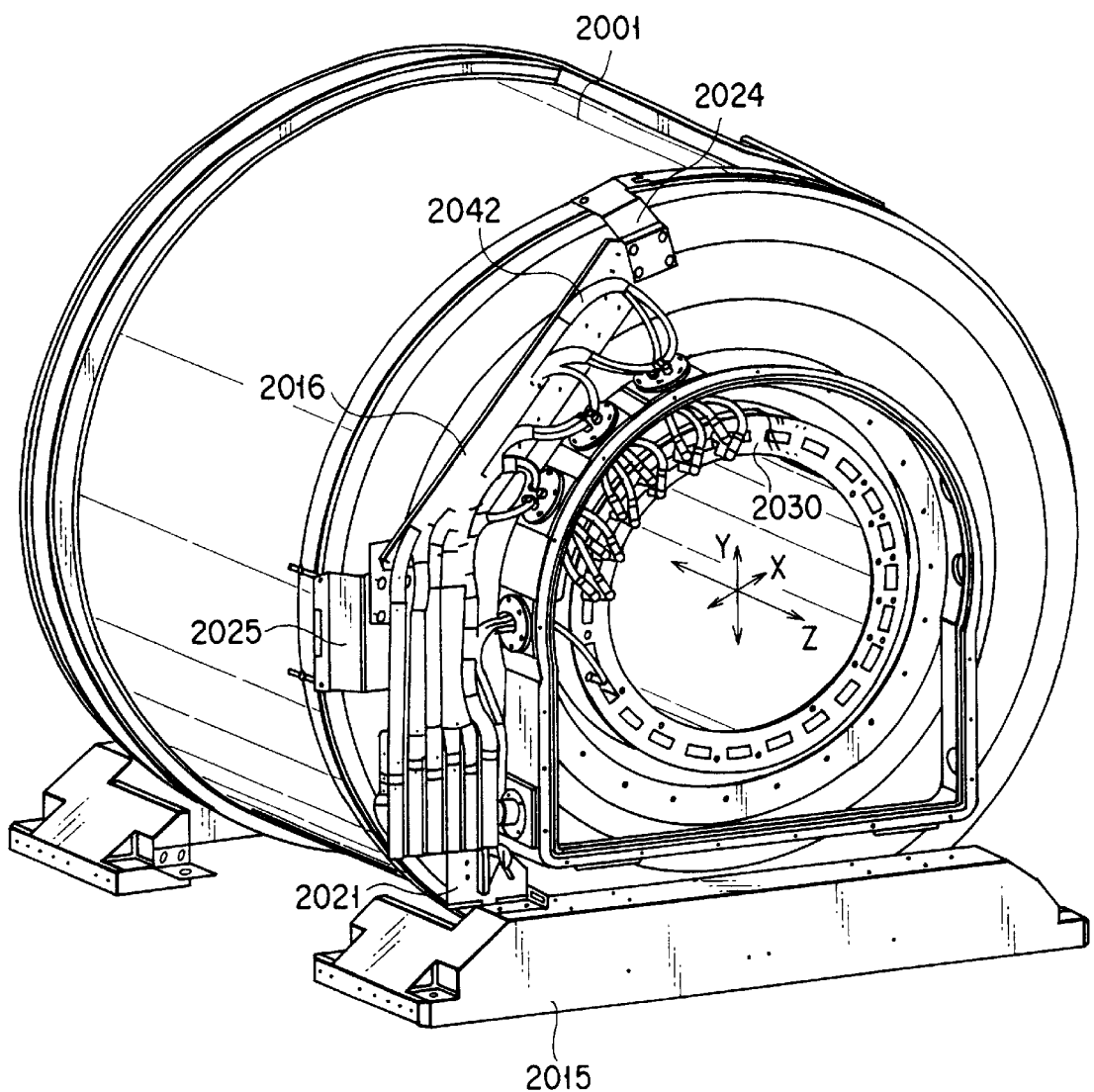
FIG. 4 is a perspective view of the gantry according to Embodiment 1.

As shown in FIG. 5, an air-core portion (imaging space) H is formed in a gantry G of an MRI apparatus. A main magnet 3003 for forming a strong static field, a whole body high-frequency coil 3004 for generating an RF magnetic field, and a gradient field coil 3005 are arranged in this air-core portion H, with its central axis L serving as a co-axis. In imaging operation, an object P to be examined is placed on the bed and inserted into the air-core portion H. A compact RF coil is sometimes mounted on the top independently of the whole body high-frequency coil 3004 to observe a small region such as the elbow or knee of the object P. This compact RF coil can be configured for reception only or both transmission and reception.

In an MRI apparatus having such an arrangement, de-coupling must be performed between the compact RF coil and the whole body high-frequency coil 3004. For example, this "de-coupling" is realized by so-called "de-tuning", i.e., a technique of shifting (de-tuning) the resonance frequency of the compact RF coil from that of the whole body high-frequency coil 3004. More specifically, such de-tuning is often executed by a technique of short-circuiting the whole body high-frequency coil 3004 to an RF shield 3004a mounted outside the coil. In any case, such a treatment is required to prevent a deterioration in detection sensitivity and the like due to electromagnetic coupling or coupling between the whole body high-frequency coil 3004 and the compact RF coil.

In some cases, the noise caused by the gradient field coil 3005 is regarded as a problem. This noise is generally the pulse sound generated when the gradient field coil 3005 is driven in accordance with a pulse sequence. In general, this sound may reach 90 dB or 100 dB, which unnecessarily makes the object feel pain or fatigue during an MRI examination.

In the prior art, therefore, as shown in FIG. 5 as well, a means of eliminating the above noise has been proposed, which uses an arrangement in which the gradient field coil 3005 is contained in the region surrounded by an outer wall V and inner wall Va of the sealed vessel. According to such an arrangement, the RF shield 3004a is mounted in the sealed vessel, together with the gradient field coil 3005. This arrangement is used because it is preferable that the whole body high-frequency coil 3004 be located at the greatest distance from the RF shield 3004a.

The following problems, however, arise in the above arrangement. Since the whole body high-frequency coil 3004 and RF shield 3004a are disposed outside and inside the sealed vessel, respectively, many electric conductors extending through the inner wall Va of the sealed vessel are required to short-circuit the whole body high-frequency coil 3004 to the RF shield 3004a for the purpose of de-tuning.

In this arrangement, first, it may be difficult to maintain a predetermined vacuum in the sealed vessel. Second, cumbersome and complicated operations are required to install the MRI apparatus, and maintenance after installation is difficult to perform.

Embodiment 2 is configured to solve these problems. The same reference numerals as in FIG. 5 denote the same parts in the figures to be referred to in the following description.

Figure 6:
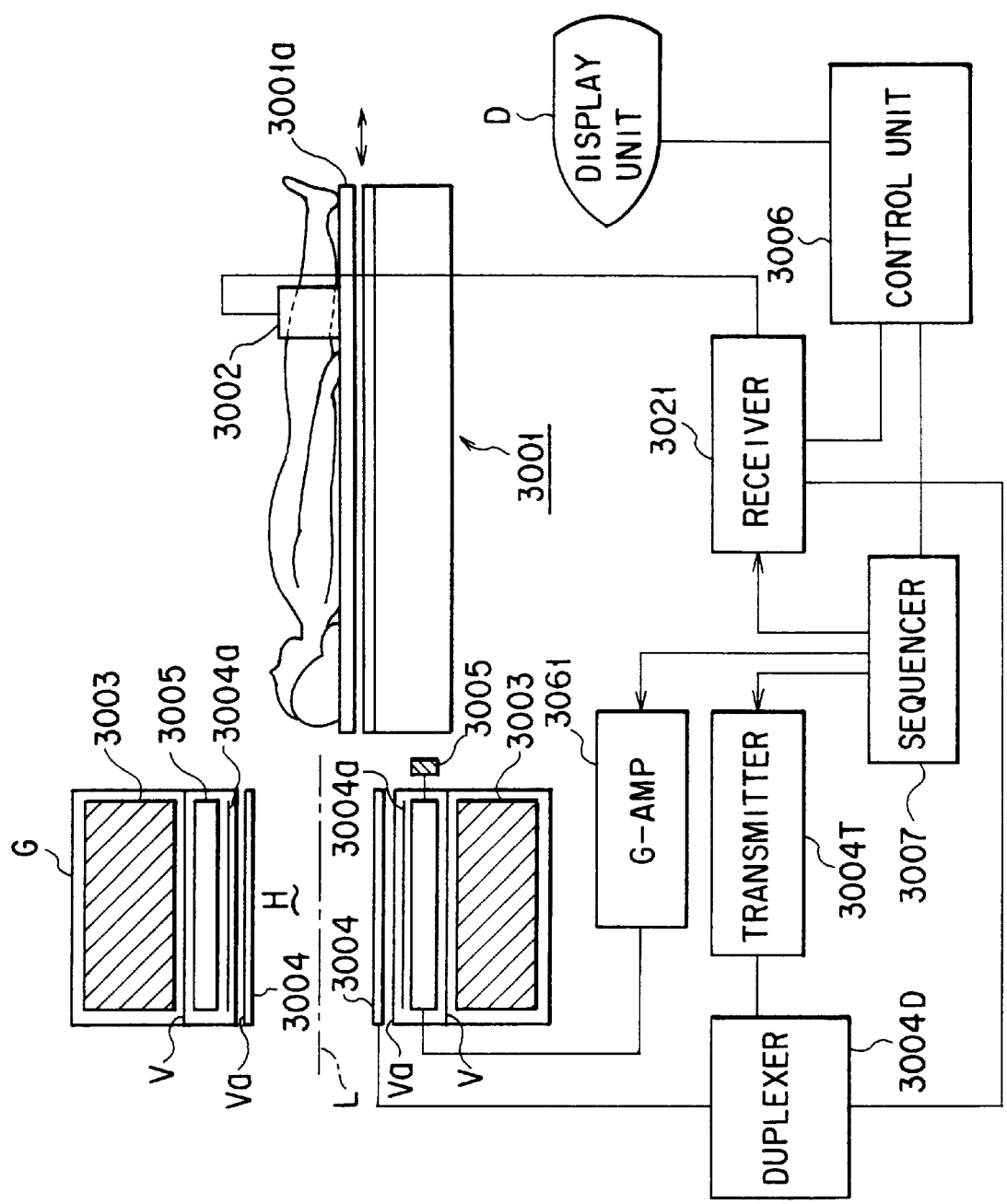
FIG. 6 is a schematic view showing an example of the arrangement of a nuclear magnetic resonance imaging apparatus according to Embodiment 2.

FIG. 6 is a schematic view showing an example of the arrangement of an MRI apparatus according to Embodiment 2. Referring to FIG. 6, the MRI apparatus includes a bed 3001, gantry G, control unit 3006, and the like. As has been described above, the bed 3001 has a top 3001a on which the object P is to be placed. The top 3001a can be moved along the body axis of the placed object P. With this movement, the object P can be inserted into the air-core portion (imaging space portion) H in the gantry G. The main magnet 3003, whole body high-frequency coil 3004, and gradient field coil 3005 are concentrically arranged around the air-core portion H, with an axis L of the air-core portion H serving as a co-axis.

The main magnet 3003 forms a strong static field in the air-core portion H. As this magnet, any of the following magnets can be used: a permanent magnet, electromagnet, superconductive magnet, and the like.

The whole body high-frequency coil 3004 is a coil for applying an RF magnetic field (excitation magnetic field) to the object P in the static field to cause nuclear magnetic resonance absorption in the object P. This whole body high-frequency coil 3004 is connected to a transmitter 3004T via a duplexer 3004D and driven discretely in terms of time, i.e., on the basis of a pulse signal. A receiver 3021 is connected to the whole body high-frequency coil 3004 via the duplexer 3004D and receives an NMR signal associated with the object P which is acquired by application of an RF magnetic field.

Figure 7:
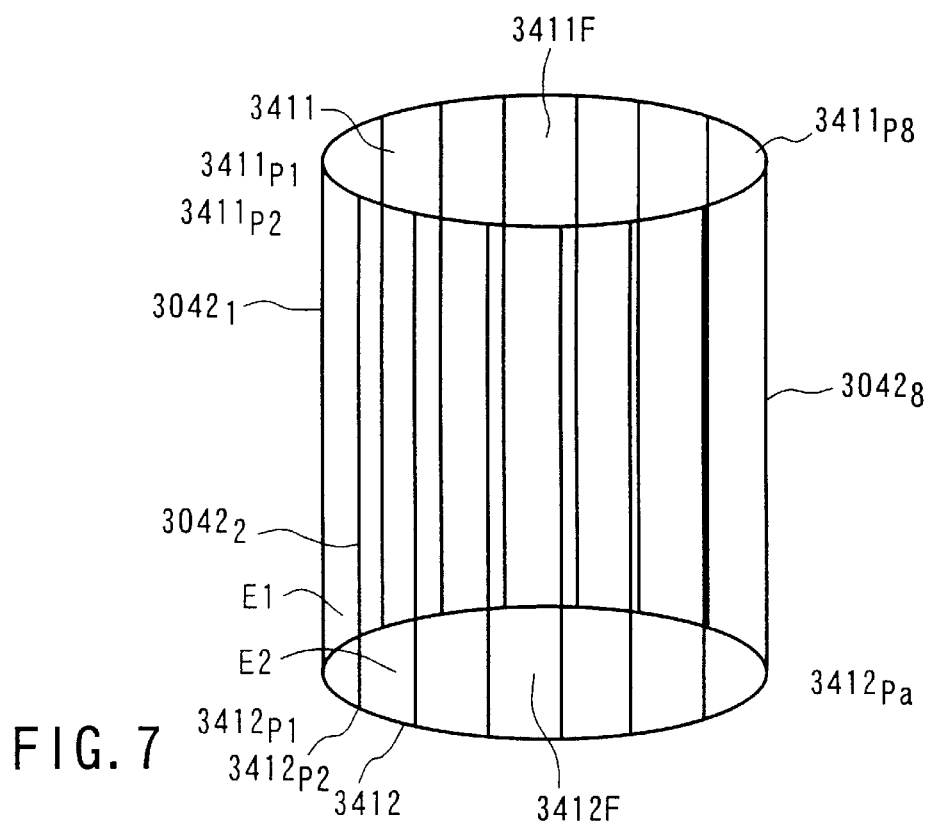
FIG. 7 is a view showing the arrangement of a whole body RF coil in FIG. 6.

As shown in FIG. 7, the whole body high-frequency coil 3004 is formed into a shape similar to a so-called "birdcage" such that a substantially cylindrical space is covered with two ring-like conductors 3411 and 3412 that oppose each other and a plurality of linear conductors 30421, 30422, ..., 3042n each having two ends connected to a corresponding one of nodes 3411p1, 3411p2, ..., 3411pn and a corresponding one of nodes 3412p1, 3412p2, ..., 3412pn on the peripheral portions of the ring-like conductors 3411 and 3412. Note that all the ring-like conductors 3411 and 3412 and the plurality of linear conductors 30421, 30422, ..., 3042n are formed by electric conductors made of copper or the like, and are "conductive members" of the whole body high-frequency coil 3004. The above form is generally known as a "birdcage" type".

As described above, the ring-like conductors 3411 and 3412 oppose each other, and surfaces 3411F and 3412F respectively surrounded by the conductors are parallel to each other. Each of the linear conductors 30421, 30422, ..., 3042n is disposed such that it connects a given node (e.g., 3411p2) on the periphery of the ring-like conductor 3411 to a positionally corresponding one node (e.g., 3412p2) on the periphery of the ring-like conductor 3412 and is perpendicular to the surfaces 3411F and 3412F. These linear conductors 30421, 30422, ..., 3042n are therefore parallel to each other. In addition, these linear conductors 30421, 30422, ..., 3042n are arranged at predetermined intervals on the peripheries of the ring-like conductors 3411 and 3412. Note that the respective areas on the side surface of the whole body high-frequency coil 3004 which are defined by the linear conductors 30421, 30422, ..., 3042n and ring-like conductors 3411 and 3412 will be referred to as element loops E1, E2, ..., En hereinafter. For example, the element loop E1 is a closed loop surrounded by the four nodes 3411p1, 3412p1, 3412p2, and 3411p2.

A capacitor is inserted in a proper portion of this whole body high-frequency coil 3004, and resonates with the inductance of a conductive member forming the whole body high-frequency coil 3004. Various known methods can be used to insert this capacitor. In general, they can be classified into a high-pass type, low-pass type, and bandpass type. The present invention can use any of these forms.

The gradient field coil 3005 is a coil for applying different magnetic fields (Gx, Gy, Gz.) along three orthogonal axes (x, y, z) defined in the air-core portion H. The degree of gradient of each magnetic field is set by a gradient field power supply system 51. The positional intersect of an NMR-signal received by the whole body high-frequency coil 3004 or a compact RF coil 3002 described below is performed on the basis of the above degree of gradient.

In the MRI apparatus of this embodiment, the gradient field coil 3005 is placed in the area surrounded by the outer wall V and inner wall Va of the sealed vessel in the gantry G, as shown in FIG. 6. This arrangement is configured to prevent noise caused by the gradient field coil 3005 from propagating into the air-core portion. The whole body high-frequency coil 3004 is placed outside the sealed vessel, whereas the RF shield 3004a for preventing coupling between the whole body high-frequency coil 3004 and the gradient field coil 3005 is mounted in the sealed vessel. Note that an MRI apparatus having such a sealed vessel will be referred to as a "silent MRI apparatus" hereinafter.

This embodiment includes the compact RF coil 3002 which is connected to the receiver 3021, mounted on the top 3001a, and used to receive an NMR signal. Although the compact RF coil 3002 is "used to receive", this coil may be used for transmission by receiving a transmission signal from the transmitter 3004T via a switch and duplexer (not shown). In some cases, there are merits in terms of imaging operation in letting the compact RF coil 3002 have a transmission function. For example, the transmission energy required by the compact RF coil 3002 located at a knee portion as shown in FIG. 6 can be reduced by performing transmission from the coil 3002, and nuclear spins in unnecessary portions are not excited. In a surface coil or the like, the flip angle of an RF pulse changes in accordance with the sensitivity distribution of the coil, resulting in a decrease in NMR signal strength. In general, therefore, the whole body high-frequency coil 3004 is in charge of transmission, and the compact RF coil 3002 is used for reception alone.

Referring to FIG. 6, the compact RF coil 3002 covers the knee portion of the object P. For example, to observe a small region other than the knee portion, e.g., the elbow of the object P, a coil conforming to the shape of the corresponding small region may be used.

According to this embodiment, in the above case, coupling between the two coils 3004 and 3002, the prevention of which is an object of the present invention, occurs.

As shown FIG. 6, in addition to the above constituent elements, the MRI apparatus of this embodiment includes, for example, a sequencer 3007 for driving the transmitter 3004T, a gradient field power supply system 3051, and the like, the control unit 3006 which performs overall control on the respective constituent elements described above and has an image generating means for reconstructing a tomographic image on the basis of the NMR signal reception result obtained by the whole body high-frequency coil 3004 or compact RF coil 3002, and a display unit D for displaying the tomographic image and the like.

Since the function of the MRI apparatus having the above arrangement is not directly associated with the gist of the present invention and known, a detailed description thereof will be omitted, with only a brief explanation thereof given below. The object P and compact RF coil 3002 on the top 3001a are inserted into the air-core portion H of the gantry G, in which a static field is generated by the main magnet 3003, together with the top 3001a. The nuclear magnetic moments in the object P are aligned, and Larmor precession of the nuclear magnetic moments is caused along the static field direction as an axis. The RF magnetic field generated by the whole body high-frequency coil 3004 (or compact RF coil 3002) is applied to the object to cause magnetic resonance absorption (spin excitation). The resultant NMR signal is then received by the whole body high-frequency coil 3004 or compact RF coil 3002, and a tomographic image of the object P is reconstructed by the image generating means in the control unit 3006. In forming the tomographic image, its positional orientation can be performed by the application of a gradient field from the gradient field coil 3005.

In addition, the noise caused when the gradient field coil 3005 is driven (on the basis of a pulse sequence) is reduced by placing the coil 3005 in the sealed vessel. The object P can therefore receive an examination comfortably.

The arrangement and function/effect of the whole body high-frequency coil 3004 as a characteristic element of the present invention will be described in further detail below.

Figure 8:
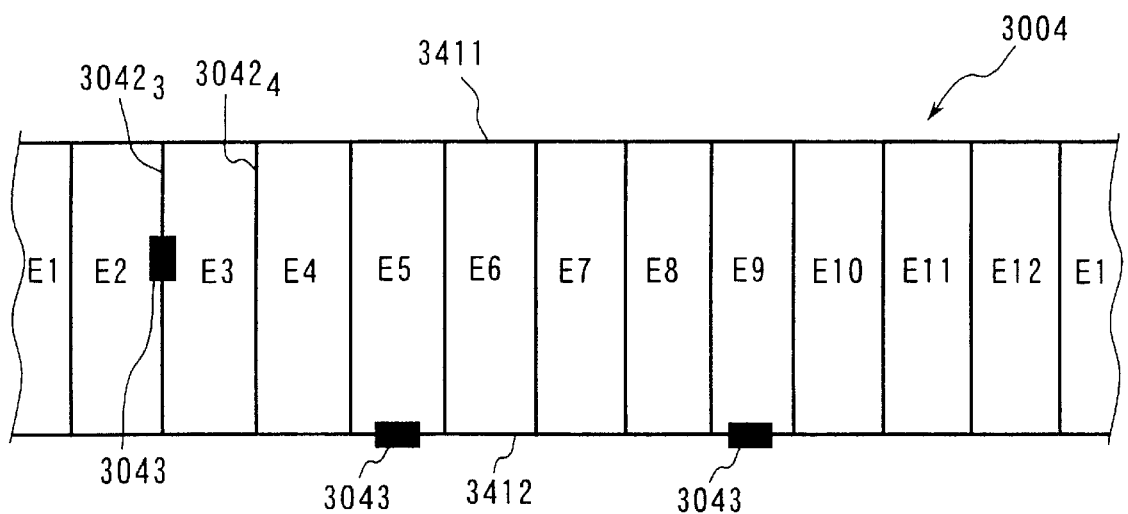
FIG. 8 is a developed view of the whole body RF coil in FIG. 7.

FIG. 8 is a view obtained by cutting the whole body high-frequency coil 3004 at one point of each of the ring-like conductors 3411 and 3412, and developing the resultant structure into a plan view. As described with reference to FIG. 7, the whole body high-frequency coil 3004 is of the birdcage type constituted by the ring-like conductors 3411 and 3412 and linear conductors 30421, 30422, . . . , 304212. Therefore, FIG. 8, which is the developed view of the above structure, shows a "ladder-like" structure. In addition, the element loop E1 on the left end of FIG. 8 is "identical" to the element loop E1 on the right end. In addition, FIG. 8 shows the whole body high-frequency coil 3004 in which the number of element loops is "12" as an example. In general, the birdcage type whole body high-frequency coil 3004 shown in FIG. 8 is sometimes called a "12-element" whole body high-frequency coil.

Figure 9:
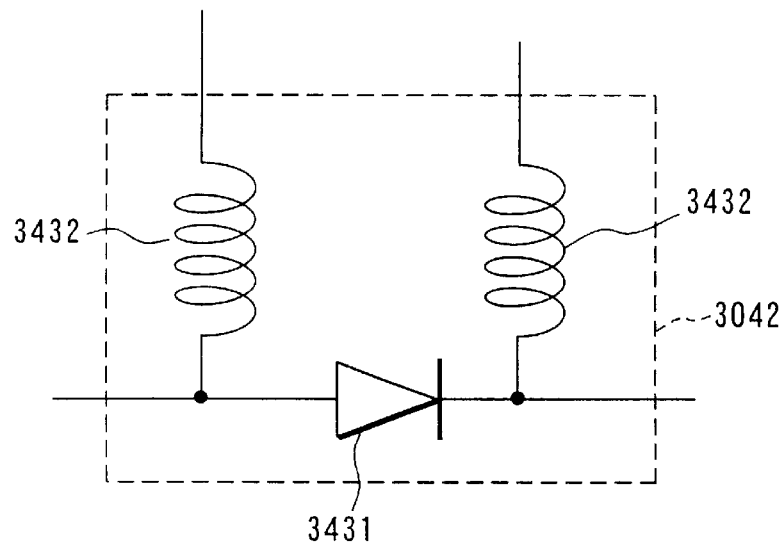
FIG. 9 is a circuit diagram showing an example of the arrangement of a switch provided for the whole body RF coil.

As shown in FIG. 8, in the whole body high-frequency coil 3004, a plurality of switches 3043 are connected in series with the ring-like conductors 3411 and 3412 and linear conductors 30421, 30422, . . . , 304212. As a specific form of this switch 3043, for example, the arrangement shown in FIG. 9 can be used. Referring to FIG. 9, the switch 3043 includes a PIN diode 3431 and inductor 3432. A control line (not shown) is connected to an end of the inductor 3432.

With these switches 3043, electromagnetic coupling or coupling between the whole body high-frequency coil 3004 and the compact RF coil 3002 can be disconnected (decoupling).

In the case shown in FIG. 8, since the switches 3043 are arranged for the element loops E2, E3, E5, and E9 and a closed loop "including" the element loops E2, E3, E5, and E9 (e.g., the closed loop defined by the overall periphery of the element loops E9 and E10), coupling can be prevented at least for these loops. That is, in general, to prevent coupling between the compact RF coil 3002 and the whole body high-frequency coil 3004, the switches 3043 are preferably connected to all the loops constituting the whole body high-frequency coil 3004 so as to perform disconnection of the loops.

The gist of the present invention is to provide a technique of de-tuning the whole body high-frequency coil 3004 by properly "connecting" or "arranging" the above switches 3043 to the conductor members constituting the whole body high-frequency coil 3004 so as not to cause the above coupling. This "preferred connection form" will be described below.

Figure 10:
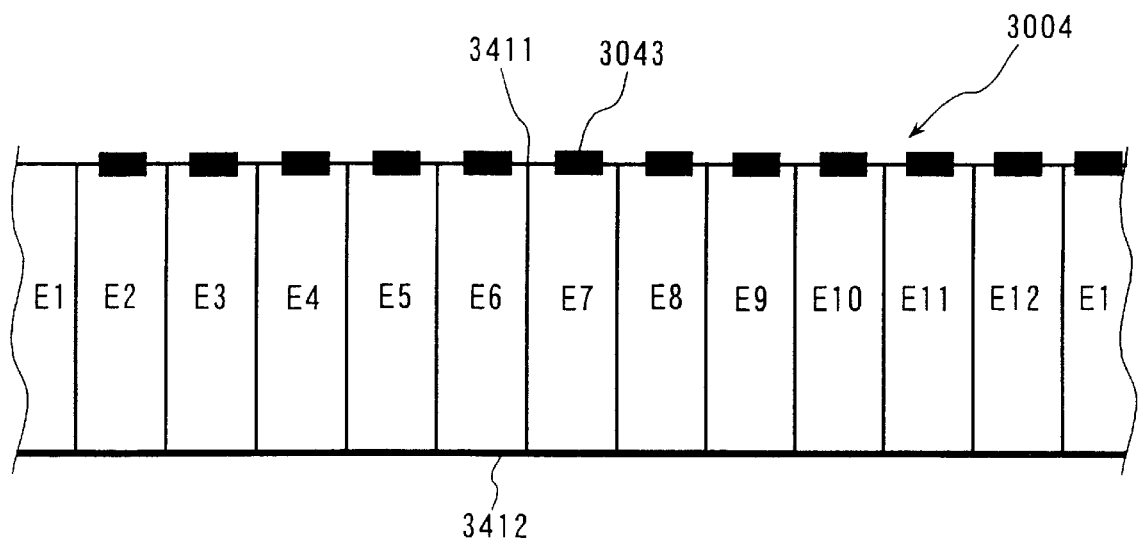
FIG. 10 is an explanatory view showing one connection form of the switches in FIG. 9 with respect to the whole body RF coil.

The case shown in FIG. 10 will be described first as a precondition. Referring to FIG. 10, the 12 switches 3043 are connected in series with the ring-like conductor 3411. At first glance, all the element loops E1, . . . , E12 constituting the whole body high-frequency coil 3004 are disconnected in this form. However, a large closed loop corresponding to the ring-like conductor 3412 is left, as indicated by the thick line in FIG. 30. This is clear from the perspective view of FIG. 7 instead of the developed view of FIG. 8. In this case, therefore, effective coupling prevention cannot be expected. That is, for the preferred connection/arrangement form of the switches 3043, consideration must always be given to the form of the whole body high-frequency coil 3004 as a stereoscopic form.

In the form shown in FIG. 10, as described above, sufficient decoupling cannot be performed because a closed loop associated with the ring-like conductor 3412 is left. As is obvious from FIG. 11, this problem can be solved by connecting or inserting a 13th switch 3043 to or in the ring-like conductor 3412 in addition to the switches 3043 in FIG. 10. With this arrangement, all the closed loops constituting the whole body high-frequency coil 3004 can be disconnected from each other, and hence perfect decoupling can be executed. This connection/arrangement form of the switches 3043 also falls within the range of the present invention.

Figure 11:
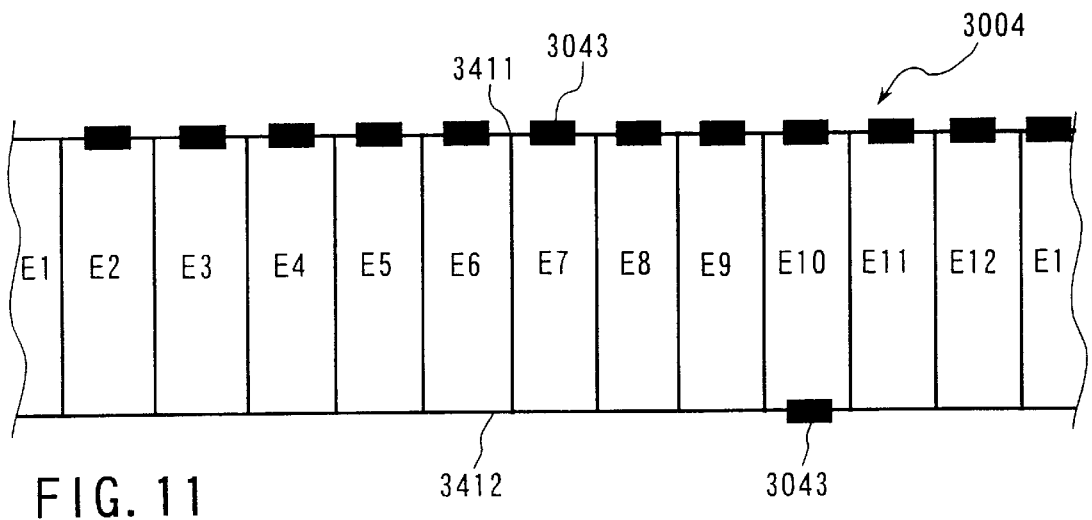
FIG. 11 is an explanatory view showing a switch connection form different from the one shown in FIG. 10.

There is no denying that the arrangement form of the switches 3043 in FIG. 11 is inefficient. More specifically, with such a means, decoupling can be reliably performed. However, since many switches 3043 must inevitably be prepared, the manufacturing cost increases (the apparatus becomes expensive) accordingly. In addition, the arrangement of the whole body high-frequency coil 3004 itself becomes unnecessarily complicated.

With awareness of the problem associated with the form shown in FIG. 11, the present inventors propose a more preferable arrangement form of the switches 3043. To realize "this more preferable arrangement form of the switches 3043", consider the following general background idea. As the peripheral length or area of a closed loop of various closed loops recognized in the whole body high-frequency coil 3004 in FIG. 7 or 8 decreases, the degree of coupling to the compact RF coil 3002 decreases. As a consequence, the occurrence of an inconvenience becomes less noticeable. In this case, "various closed loops" include a closed loop defined by the overall periphery of the element loops E2, E3, and E4 as indicated by the dashed line in FIG. 12, a closed loop including the ring-like conductors 3411 and 3412 as its route as indicated by the chain line in FIG. 12, and the like.

Figure 12:
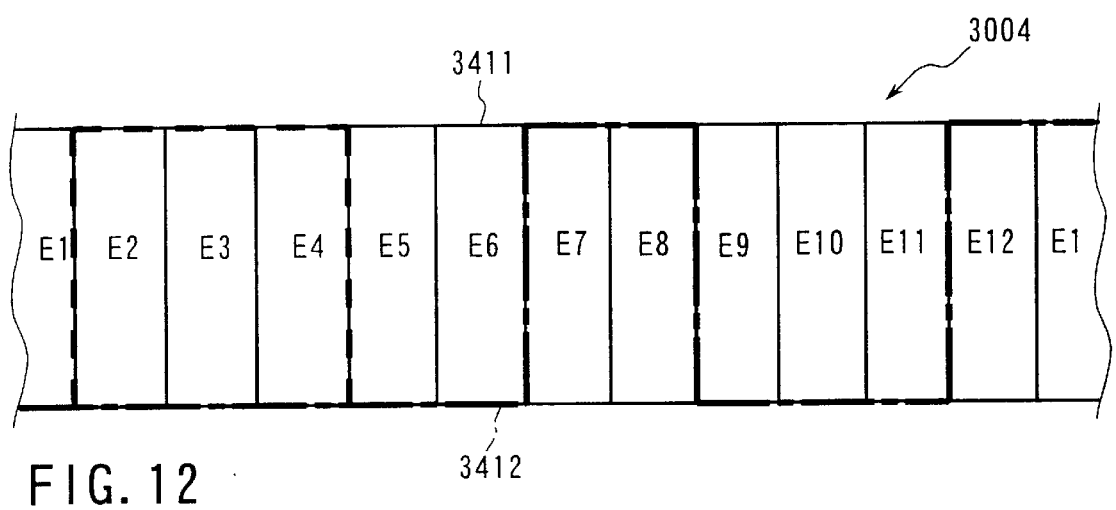
FIG. 12 is an explanatory view showing a "closed loop" assumed in the whole body RF coil in Embodiment 2.

In consideration of this, if it is checked again whether each of the element loops E1, E, . . . , E12 in the case shown in FIG. 12 or the like is a "closed loop with the minimum peripheral length", it is expected that some of these elements need not be disconnected by using the switches 3043.

Figure 13:
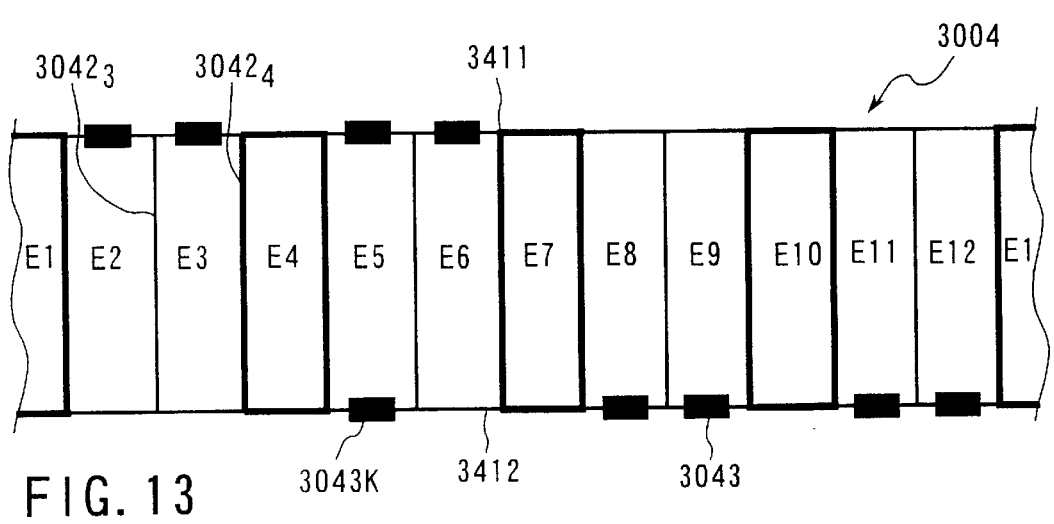
FIG. 13 is an explanatory view showing a switch connection form different from those shown in FIGS. 10 and 11.

Referring to FIG. 13, on the basis of the above general idea, 30 switches 43 are not provided for the four element loops E1, E4, E7, and E10 indicated by the thick lines, and the "closed loops" are left established. Although there is a possibility that the above high-frequency current will flow in these element loops E1, E4, E7, and E10 as well, it can be easily expected that the influence of the above inconvenience is at least much smaller than that in the case where the "closed loop corresponding to the ring-like conductor 3412" shown in FIG. 10 is present. It was also confirmed that practically sufficient decoupling could be realized when this whole body high-frequency coil 3004 was actually used.

Figure 14:
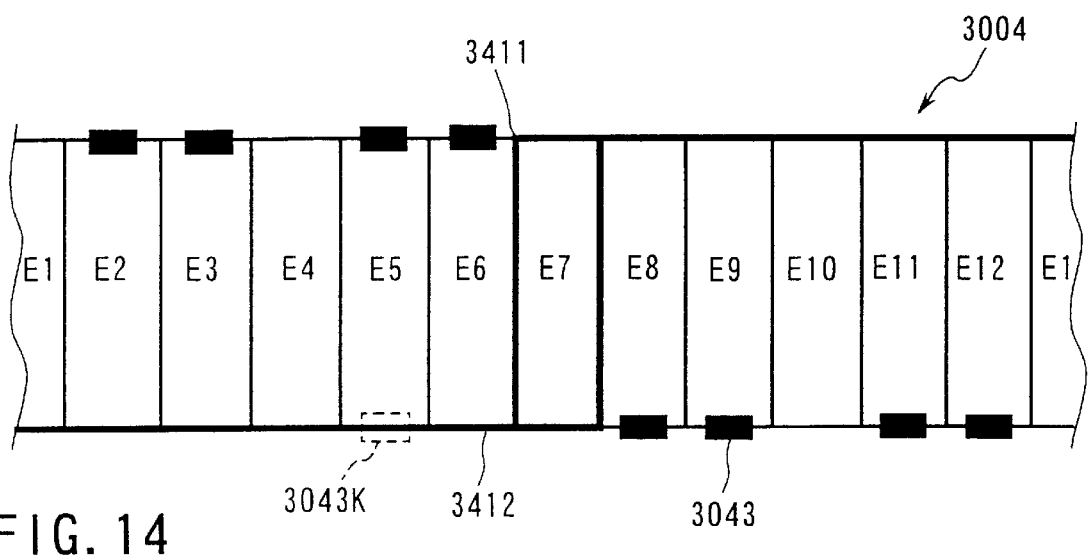
FIG. 14 is a view for explaining a case where one switch 43k is omitted from the switch connection form in FIG. 13.
Figure 15:
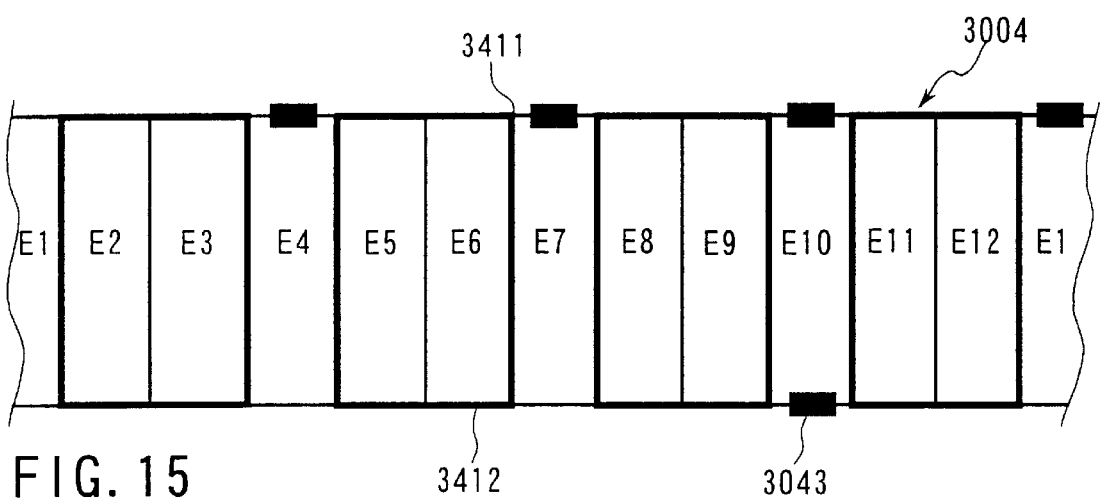
FIG. 15 is an explanatory view showing a switch connection form in which adjacent element loops are left as closed loops in Embodiment 2.

In the case shown in FIG. 13, a switch 3043k provided for the element loop E5 (or the other switch 3043 provided for the loop E5) plays an important role. More specifically, consider a case where the switch 3043k is omitted as shown in FIG. 14. In this case, the large closed loop indicated by the thick line in FIG. 14 is left as in the case shown in FIG. 10. As is apparent from this, two switches 3043 must be connected/arranged to/for at least one of the closed loops with the minimum peripheral length, i.e., the element loops. A large loop in FIG. 15 is not left.

In general, therefore, it is not preferable that two or more element loops, of the element loops E1, . . . , E12, which have no switches 3043 are continuously present. More specifically, as shown in FIG. 15, if no switches 3043 are provided for pairs of adjacent element loops, e.g., the element loops E2 and E3, E5 and E6, E8 and E9, and E11 and E12, and they cannot be disconnected from each other, the closed loops indicated by the thick lines are left. Obviously, the decoupling effect in this case is slightly inferior to that in the case shown in FIG. 13. Therefore, such a form is preferably avoided.

Figure 16:
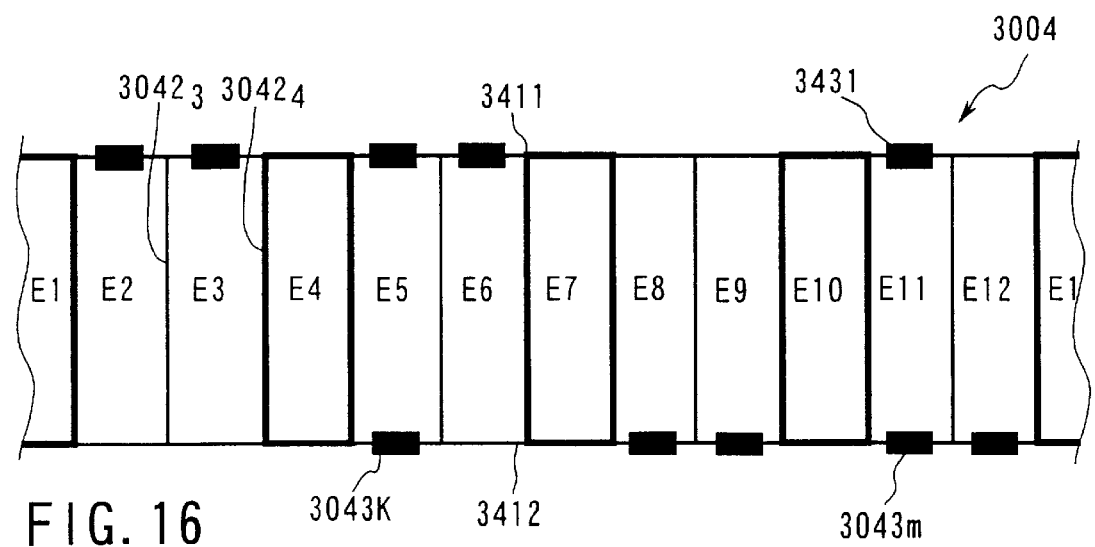
FIG. 16 is an explanatory view showing a switch connection form as a modification of the form shown in FIG. 13.

As a modification of the form shown in FIG. 13, the connection form of the switches 3043 shown in FIG. 16 is more preferable. The form shown in FIG. 16 differs from that shown in FIG. 13 in that another switch 3043j is connected to the element loop E11. Although the element loop E11 has already been disconnected by the presence of a switch 3043m, the presence of this switch 3043j makes it possible to hold symmetry with respect to the switch 3043k and reliably obtain a decoupling effect.

As described above, according to the whole body high-frequency coil 3004 in this embodiment, a sufficient decoupling effect can be obtained as a whole by determining the connection/arrangement form of the switches 3043 such that at least no large closed loop is left even though some of the element loops E1, . . . , E12 are allowed to have closed loops left as the element loops (minimum peripheral length). This form can decrease the number of switches 3043 to be installed as compared with the form shown in FIG. 11, and hence prevents an increase in the manufacturing cost of the whole body high-frequency coil 3004 and complexity of its arrangement.

Making the connection form of the switches 3043 in the whole body high-frequency coil 3004 preferable alone contributes to decoupling realized in this embodiment. Therefore, in a silent type MRI apparatus having a sealed vessel like the one shown in FIG. 6 as well, decoupling between the whole body high-frequency coil 3004 and the compact RF coil 3002 can be realized without posing any problem.

Although the above embodiment has exemplified only the "12-element" whole body high-frequency coil, the present invention is not limited to this form. The present invention can be theoretically applied to the whole body high-frequency coil 3004 regardless of the number of elements.

The so-called "birdcage type" whole body high-frequency coil 3004 has been described above. However, the present invention is not limited to this form. As is known, various forms have currently been proposed as the forms of whole body high-frequency coils 4, generally the forms of "NMR probes". Basically, the present invention can be applied to these forms as long as "decoupling" is required.

Figure 17:
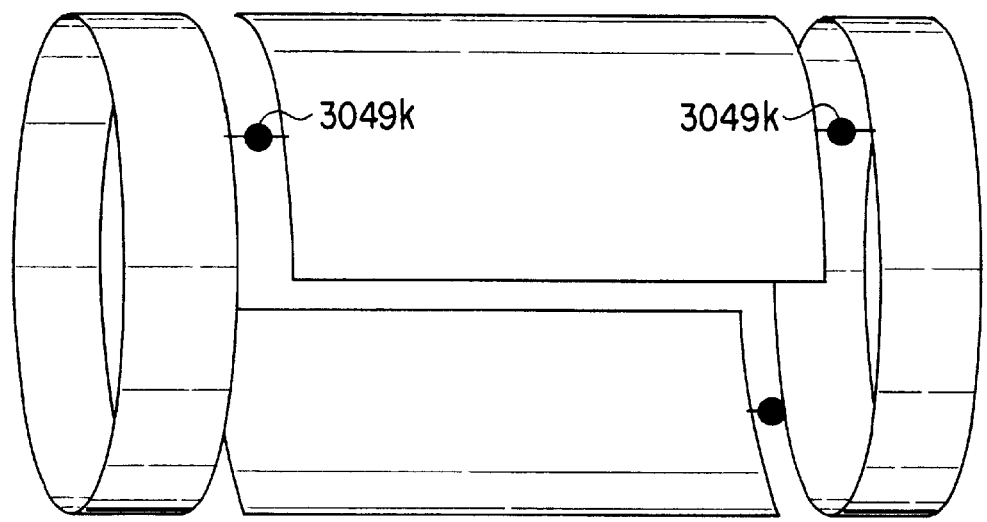
FIG. 17 is a perspective view showing an example of the arrangement of an STR type probe in Embodiment 2.

The various NMR probes described above include a STR (Slotted Tube Rotator) type probe having a cylindrical conductor member like the one shown in FIG. 17 and the like. In this case, switches-denoted by reference numeral 3049k in FIG. 17 are preferably connected. In general, decoupling is required for a QD (Quadrature) probe formed by combining a plurality of tuning coils and a multi-surface coil probe, and hence the present invention can be applied to them.

In the above embodiment, decoupling between the whole body high-frequency coil 3004 and the compact RF coil 3002 is attained by devising the connection form of the switches 3043 in the whole body high-frequency coil 3004. This purpose can also be achieved from another viewpoint or by another technique. This technique will be described below as an embodiment different from the above embodiment.

Figure 18:
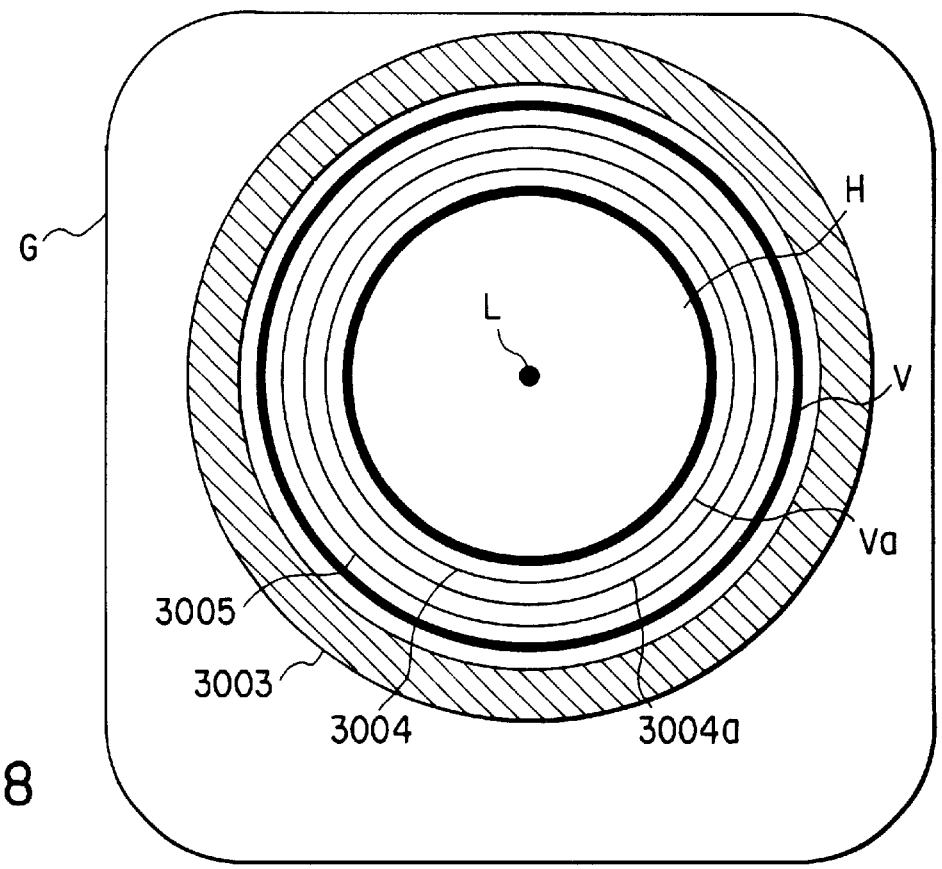
FIG. 18 is a schematic view showing another arrangement in Embodiment 2.

FIG. 18 is a schematic view of an MRI apparatus according to another embodiment. Similar to FIG. 5, FIG. 18 is a front view of a gantry G, which transparently shows part of the interior of the gantry. A characteristic feature of this arrangement in FIG. 18 is the arrangement form of a whole body high-frequency coil 3004. More specifically, in the arrangement shown in FIG. 5, the whole body high-frequency coil 3004 is placed outside the sealed vessel or on the air-core portion H side with respect to the inner wall Va of the sealed vessel opposing the air-core portion H. The arrangement in FIG. 18, however, differs from that in FIG. 5 in that the whole body high-frequency coil 3004 is also placed in the sealed vessel (the region surrounded by the outer wall V and inner wall Va).

In this form, in performing decoupling between the whole body high-frequency coil 3004 and a compact RF coil 3002, the whole body high-frequency coil 3004 may be de-tuned by short-circuiting the whole body high-frequency coil 3004 to an RF shield 3004a as in the technique used in the prior art. In this case, unlike in the arrangement in FIG. 5, there is no need to use electric conductors extending trough the wall Va to realize the above short-circuiting. In other words, in the arrangement in FIG. 18, since both the whole body high-frequency coil 3004 and the RF shield 3004a are arranged in the sealed vessel, the electric conductors connecting them need not extend through the inner wall Va.

In this manner, as shown in FIG. 18, decoupling between the whole body high-frequency coil 3004 and the compact RF coil 3002 can be achieved.

In the form shown in FIG. 18, some consideration must be given to the following point. In this case, electric discharge may occur at the two ends of the capacitor forming the whole body high-frequency coil 3004. To prevent this electric discharge, therefore, a proper molding process is preferably performed for the whole body high-frequency coil 3004 in advance.

Embodiment 3

The problem to be solved by Embodiment 3 will be described first.

As a gradient field coil, a shield type coil assembly having a shield coil for suppressing a magnetic field that leaks out is frequently used. As an example of this coil, an ASGC (Actively Shielded Gradient Coil) is known. An ASGC is disclosed in U.S. Pat. Nos. 4,733,189 and 4,737,716. The ASGC has coil assemblies for the generation of magnetic fields corresponding to the X, Y, and Z channels of the MRI apparatus. Each coil assembly has a main coil and shield coil, thus realizing a shield structure for each channel in which a gradient field hardly leaks out.

In an MRI apparatus having a conventional shield type gradient field coil, e.g., an ASGC, a leak flux from the ASGC is magnetically coupled to a metal cover located inside a bore forming a diagnosing opening portion (worm bore) and covering a static field magnet to generate an eddy current on the cover. This causes noise. That is, the Lorents force generated by the eddy current strikes the cover member of the static field magnet to cause noise.

For example, in an ASGC, in consideration of the shield performance, a shield coil must ideally (analytically) wound in nearly infinite pattern length. The "pattern length" is the length of a copper wire wound around a bobbin in a predetermined pattern in the bobbin axial direction (to be referred to as the axial direction hereinafter), and simply called the axial length in some cases.

In practice, the pattern length of the shield coil has its own limit. As a product, in particular, the shorter the pattern length is, the better the product is. On the other hand, a leak flux from an end portion of the shield coil in the axial direction has no influence on the imaging area spatially formed in the diagnosing opening portion. In consideration of the above two states, only the winding pattern of a copper wire on the end portion of the shield coil in the axial direction is packed as much as possible toward the central portion in the axial direction, thus decreasing the pattern length of the overall coil.

In such a shield coil, a leak flux is produced from the central portion of the coil pattern in each channel of the ASGC in the axial direction, as a matter of course, regardless of whether the pattern length is decreased or not. This magnetic field causes noise as well. When the pattern length of the shield coil is not decreased at the end portion in the axial direction, a leak flux from the ASGC is maximized at the central portion of the pattern. However, as the pattern length is decreased in the above manner, the leak flux from the end portion of the shield coil in the axial direction increases. That is, when the pattern length is decreased, the leak flux at the end portion in the axial direction increases, and the noise generated at the end portion of the static field magnet in the axial direction increases. As a consequence, the overall noise increases.

According to the prior art, noise generated by a leak flux at the end portion in the axial direction which does not directly influence the magnetic characteristic of the imaging area, i.e., homogeneity of a magnetic field, has been neglected because of high priority given to a decrease in the axial length of the shield coil.

Embodiment 3 has been made in consideration of such situation to maintain the pattern length of a shield coil in the axial direction at the minimum value in an MRI apparatus having an actively (self) shielded gradient coil (ASGC) and suppress noise generated by a leak flux from the end portion in the axial direction.

An MRI (Magnetic Resonance Imaging) apparatus according to Embodiment 3 will be described with reference to FIGS. 19 to 24. This magnetic resonance imaging apparatus is of a type which includes an actively (self) shielded gradient coil (ASGC).

Figure 19:
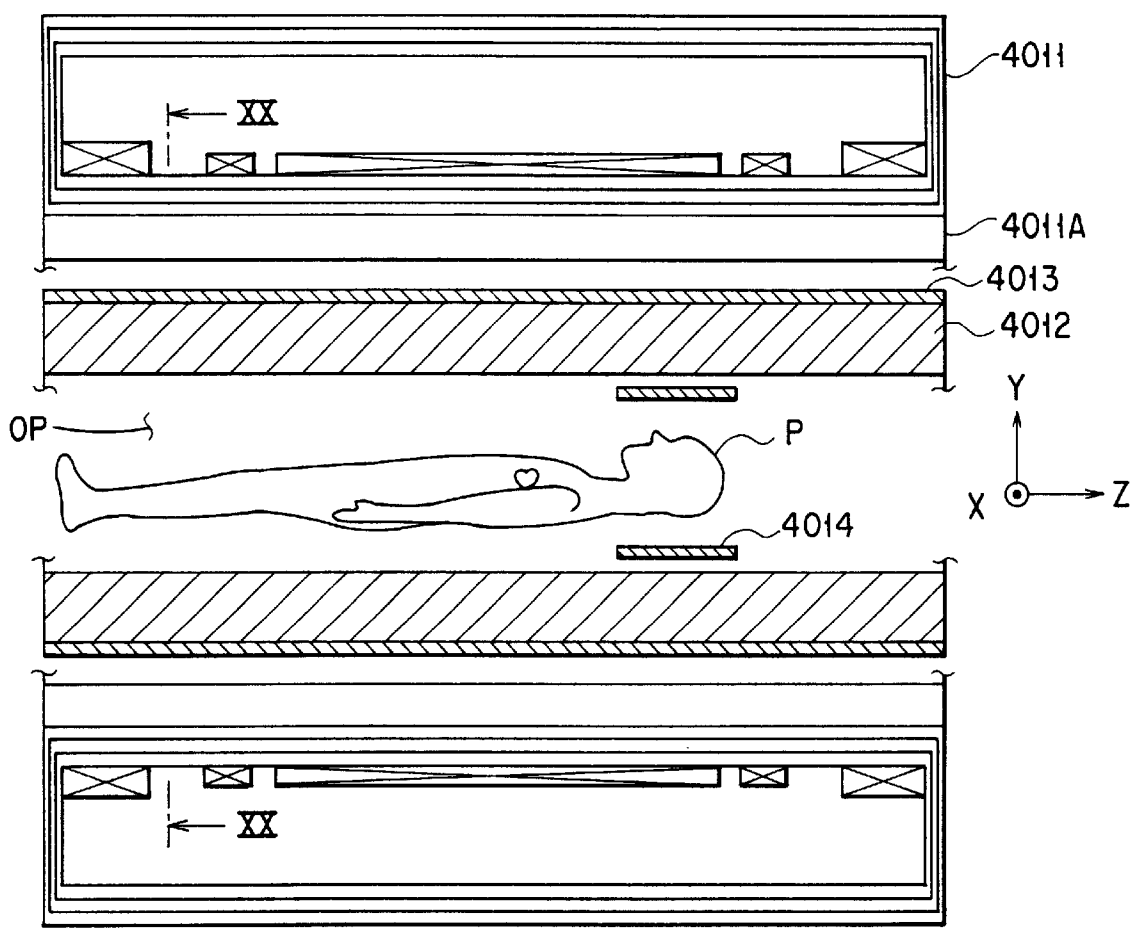
FIG. 19 is a schematic sectional view of the gantry of a magnetic resonance imaging apparatus according to Embodiment 3.

FIG. 19 is a schematic sectional view showing a gantry 4001 of this MRI apparatus along the axial direction. The gantry 4001 has a cylindrical shape as a whole. A worm bore in the gantry serves as a diagnosing space OP. In a diagnosis, an object P to be examined can be inserted into the bore. Note that an X-Y-Z orthogonal coordinate system is set, with the axial direction of the gantry 4001 being defined as the Z-axis.

The gantry 4001 includes a static field magnet 4011 which is formed into a substantially cylindrical shape and substantially forms the above bore, a shim coil 4013 attached to, for example, the outer circumferential surface of the gradient field coil 4012, and an RF coil 4014 placed in the bore of the gradient field coil 4012. The object P is placed on the top of the bed (not shown) and set in the bore (diagnosing space) while the RF coil 4014 is disposed around the object P.

The static field magnet 4011 is formed by an superconductive magnet. That is, a plurality of heat radiation shield vessels and a single liquid helium vessel are housed in an outer vacuum vessel, and a superconductive coil is wound and placed in the liquid helium vessel. The outer circumferential surface of the outer vacuum vessel is covered with a metal cover 4011A.

The ASGC 4012 is formed into an active shield type. This coil 4012 has different coil assemblies for X, Y, and Z channels. Each of the coil assemblies for the respective channels has a shield structure designed to almost prevent a magnetic field from leaking out. In this shield state, the coil generates pulse-like gradient fields in the X-axis, Y-axis, and z-axis directions.

Figure 20:
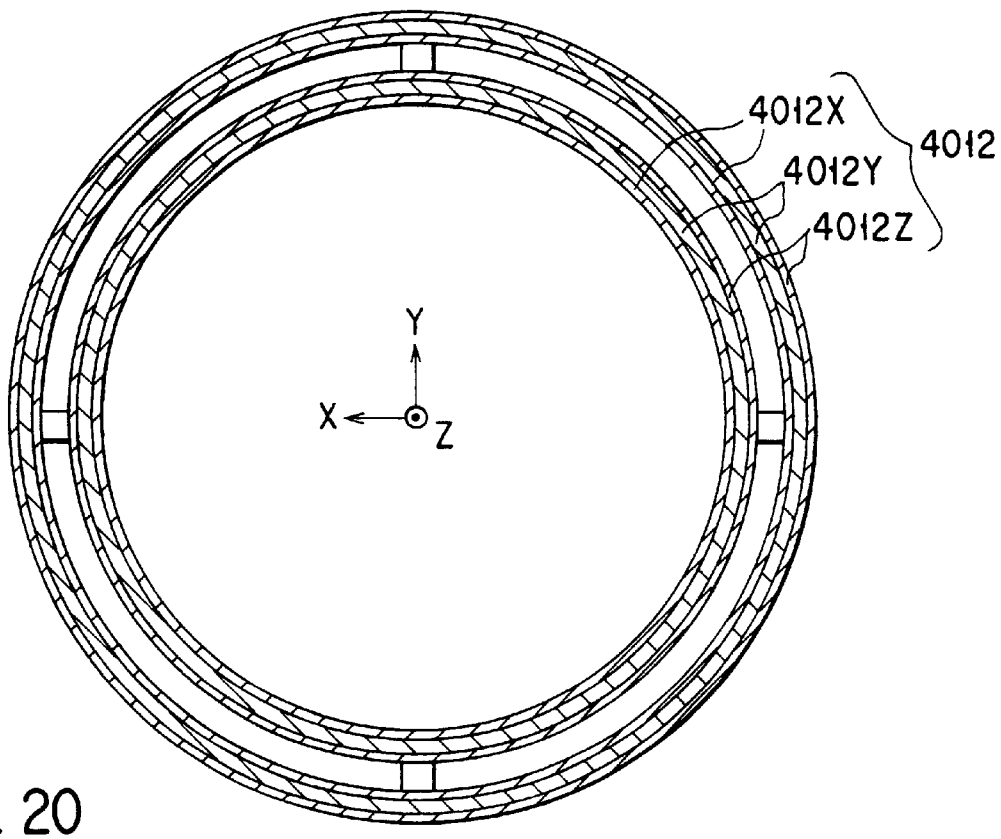
FIG. 20 is a schematic sectional view taken along a plane perpendicular to the Z-axis direction of an ASGC (a plane taken along a line II—II in FIG. 19)

More specifically, as shown in FIG. 20, the ASGC 4012 has an X coil assembly 4012X, Y coil assembly 4012Y, and Z coil assembly 4012Z corresponding to the X, Y, and Z channels, which are stacked in units of coils layers in an insulated state to form a substantially cylindrical shape as a whole. Each of the X coil assembly 4012X, Y coil assembly 4012Y, and Z coil assembly 4012Z includes a main coil having a plurality of winding portions for generating a gradient field in a corresponding one of the X-, Y-, and Z-axis directions and a shield coil having a plurality of so-called shield winding portions for suppressing or reducing a leak gradient field (pulse) generated by the winding portions of the main coil. Note that the respective coil assemblies 4012X, 4012Y, and 4012Z are connected to independent gradient field power supplies corresponding to the respective channels.

Figure 21:
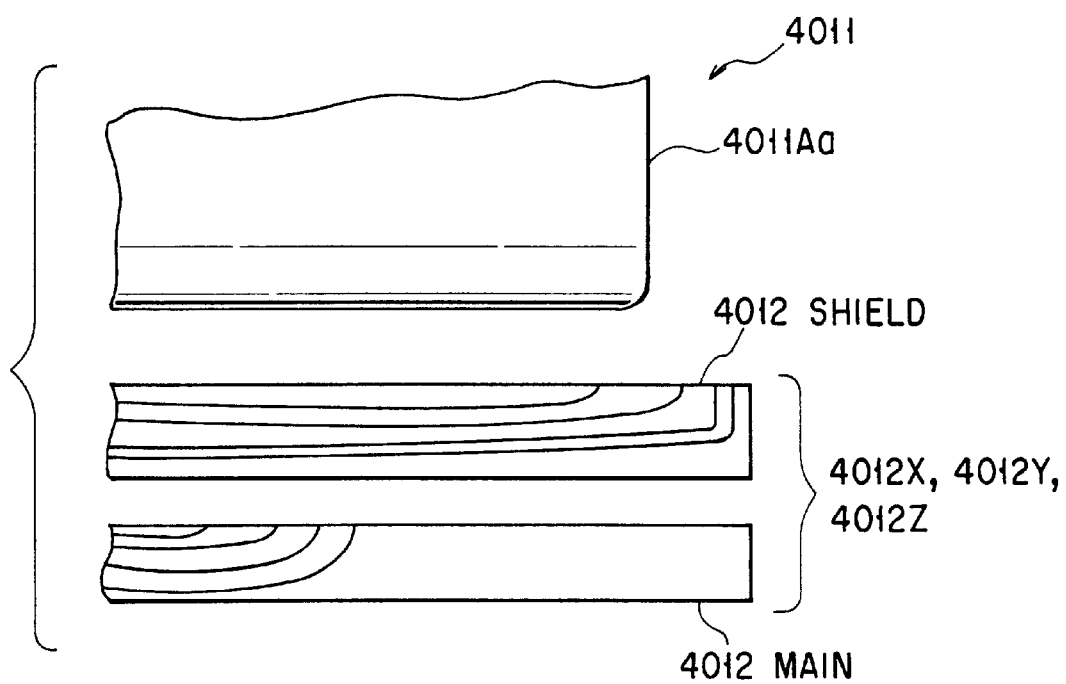
FIG. 21 is a view for explaining the positional relationship between the shield coil of the ASGC and a side end portion of a static field magnet according to Embodiment 3.

FIG. 21 shows an example of the positional relationship between the main coil and shield coil of the X coil assembly 4012X or Y coil assembly 4012Y and a side end face (side end portion) 4011Aa of the static field magnet 4011.

The Y coil assembly 4012Y includes four saddle type winding portions (coil patterns) wound around a bobbin B, together with the main coil and shield coil. That is, each coil has two saddle type winding portions juxtaposed in the Z-axis direction and connected in series with each other. Two pairs of such winding portions are arranged to oppose each other in the Y-axis direction. A total of eight winding portions of the main coil and shield coil are electrically connected in series with each other and connected to, for example, a common gradient field power supply. In this case, energization routes are formed such that currents flow in the main coil and shield coil in opposite directions. This makes it possible to generate a gradient field in the Y-axis direction while maintaining the shield function.

Figure 22:
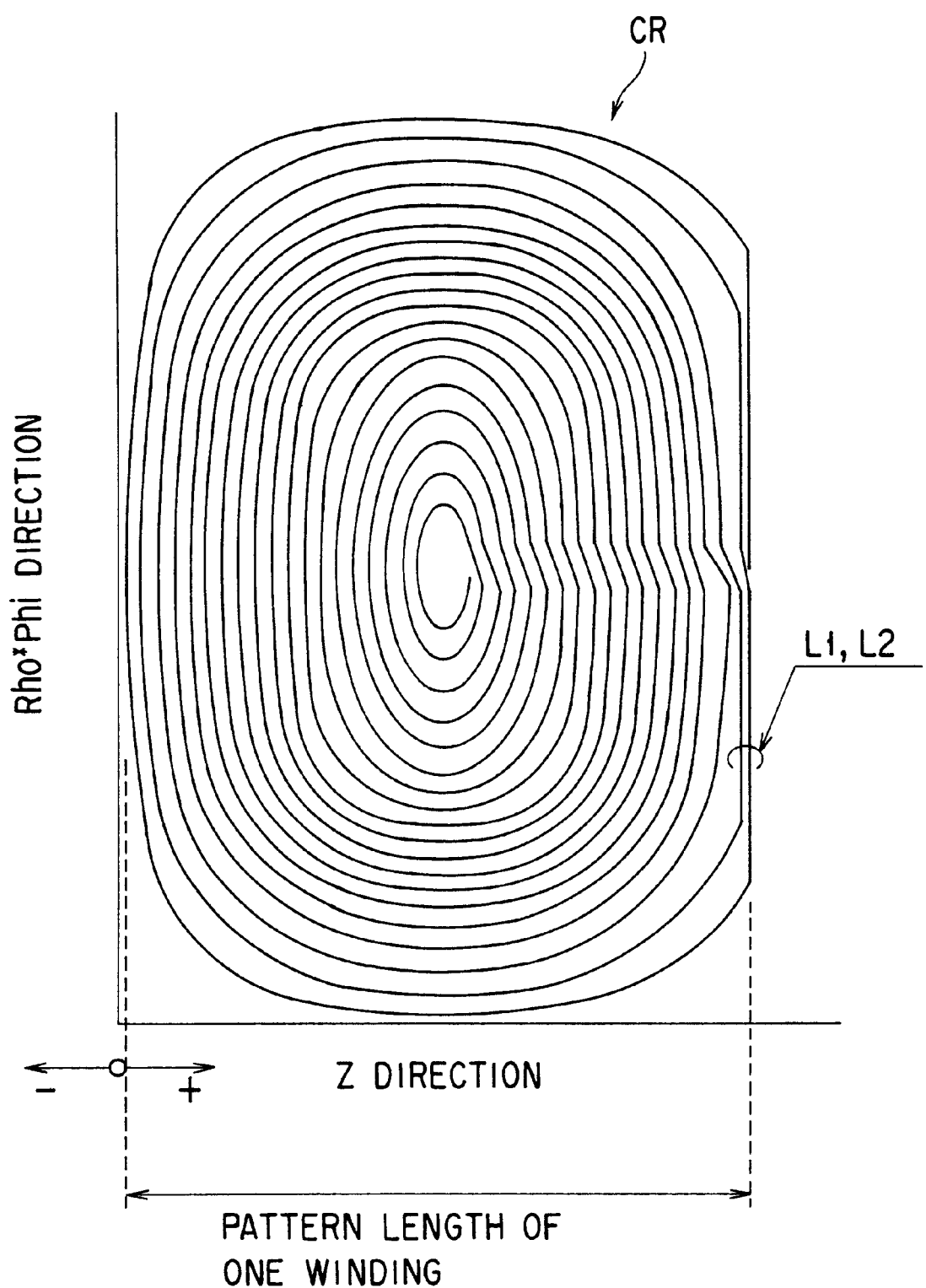
FIG. 22 is a view for explaining the compacted winding of the winding portion of the shield coil and a pattern length in Embodiment 3.

FIG. 22 shows the coil pattern drawn by one of the four saddle type winding portions of the shield coil. This winding portion CR is actually wound around the bobbin in the form of a saddle, but FIG. 22 is a plan view of this portion. Each winding portion CR is formed by winding a flat conductor along a substantially spiral pattern in this manner. The winding position of the conductor is analytically obtained on the basis of a predetermined magnetic flux distribution condition.

The X coil assembly 4012X is disposed in the same state as that of the Y coil assembly 4012Y except that it is rotated about the Z-axis through 90°.

The main coil and shield coil of the Z coil assembly 4012Z are formed by spirally winding flat conductors around the bobbin along analytically obtained winding positions. Each winding portion of the Z coil assembly 4012Z therefore has a spiral coil pattern. Each of the main coil and shield coil is formed by electrically connecting two winding portions in series, which are wound around the left and right sides of the bobbin in the Z-axis direction. This coil assembly can generate a linear Z-channel gradient field while maintaining a shield function with currents flowing in the respective coils in opposite directions.

In each of the coil assemblies 4012X, 4012Y, and 4012Z of the actively shielded gradient coil 4012 having this structure, the winding portion CR of a shield coil $4012_{shield}$ is wound according to a winding method of the present invention. That is, the shield function of the gradient field coil 4012, i.e., the degree of a leak magnetic field, is determined in association with noise.

Figure 23:
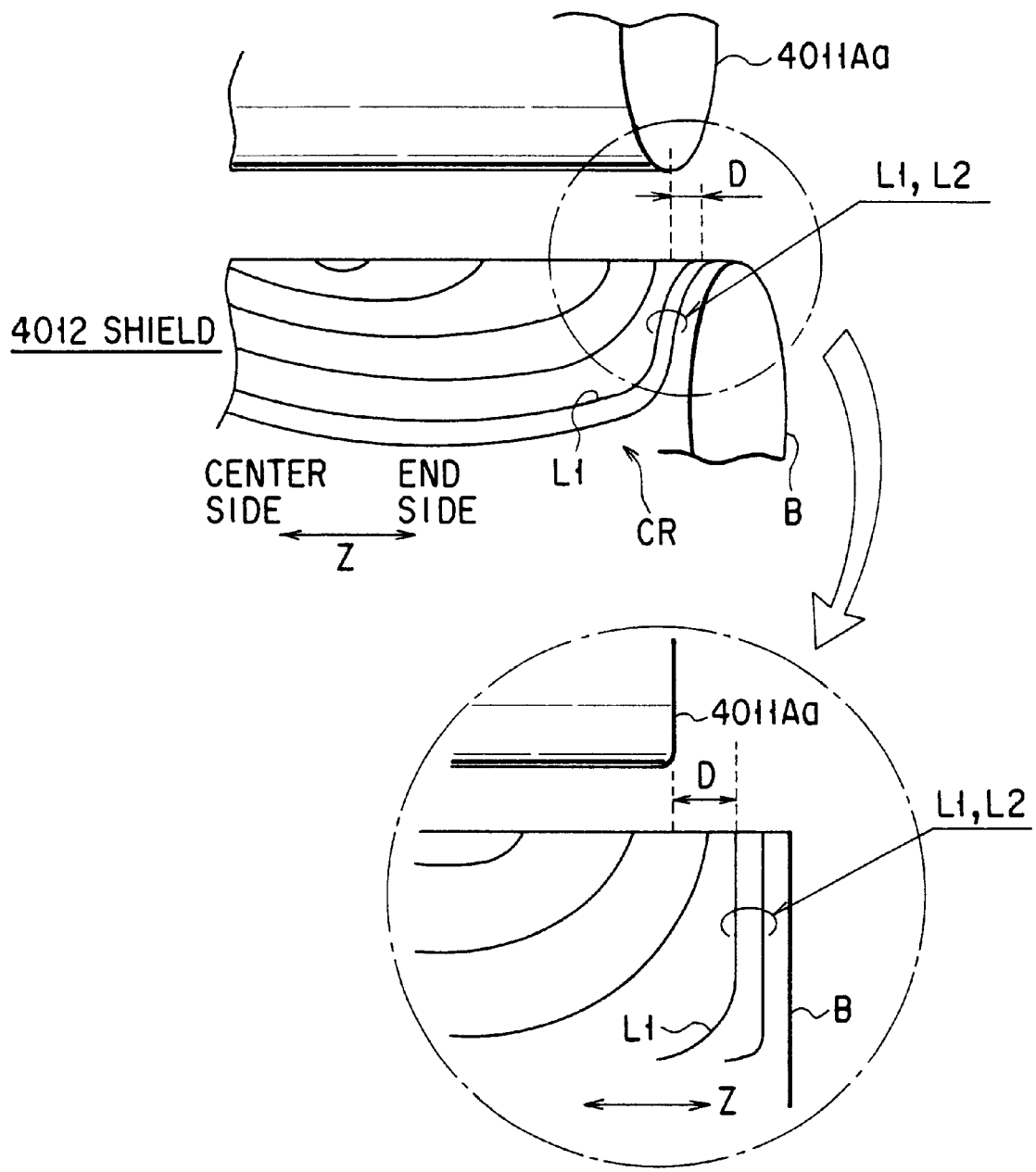
FIG. 23 is a view for explaining the positional relationship between the shield coil of the ASGC and the side end portion of the static field magnet.

More specifically, as shown in FIGS. 22 and 23, windings L1 and L2 are wound around an end portion of the winding portion CR in the Z-axis direction at positions closer to the middle portion in the Z-axis direction than analytically obtained winding positions. The analytically obtained positions of the windings L1 and L2 are located outside in the Z-axis direction as indicated by the virtual line in FIG. 23. By bringing these winding positions closer to the middle portion, the pattern length of the winding portion CR (see FIG. 22) is decreased, which in turn can decrease the required length of the bobbin B in the axial direction. In this case, the desired magnetic field characteristics of the imaging area formed in the diagnosing opening portion are maintained.

When the pattern length is decreased in this manner, the magnetic field that leaks out of an end portion of the shield coil $4012_{shield}$ and reaches the metal cover (outer end face) 4011A placed outside the static field magnet 4011 increases in amount as compared with a case where the pattern length is not decreased. The eddy current generated on the metal cover 4011A increases due to this leak magnetic field, resulting in an increase in noise due to magnetic coupling. In this embodiment, therefore, a pattern length is set to reduce the amount of noise due to a leak flux from an end portion while maintaining the pattern length of the shield coil $4012_{shield}$ at a small value.

FIGS. 24A, 24B, 24C, and 24D show the simulation results provided for this setting. Each figure shows changes in leak magnetic field Bz and eddy current NI with changes in length D as a parameter which is used to compare the substantial pattern length of the shield coil $4012_{shield}$ in the Z-axis direction and the position of a side end face of the static field magnet 12.

More specifically, referring to FIGS. 24A, 24B, 24C, and 24D, in each graph on the left column, the abscissa represents the position of the shield coil $4012_{shield}$ in the Z-axis direction; and the ordinate, the amount of leak magnetic field, whereas in each graph on the right column, the abscissa represents the position of the shield coil $4012_{shield}$ in the Z-axis direction; and the ordinate, the magnitude of eddy current. In both graphs, the abscissa represents the position of the shield coil $4012_{shield}$ in the axial direction on one side (e.g., the positive side) from the center in the Z-axis direction. As both leak magnetic field and eddy current, the values obtained by simulations at predetermined positions on the surface of the metal cover of the gradient field coil 4012 are shown.

The "substantial pattern length" in setting the length D indicates a distance to the winding L1 of the compacted windings L1 and L2 forming the shield coil $4012_{shield}$ which is located on the innermost side.

Figure 24A:
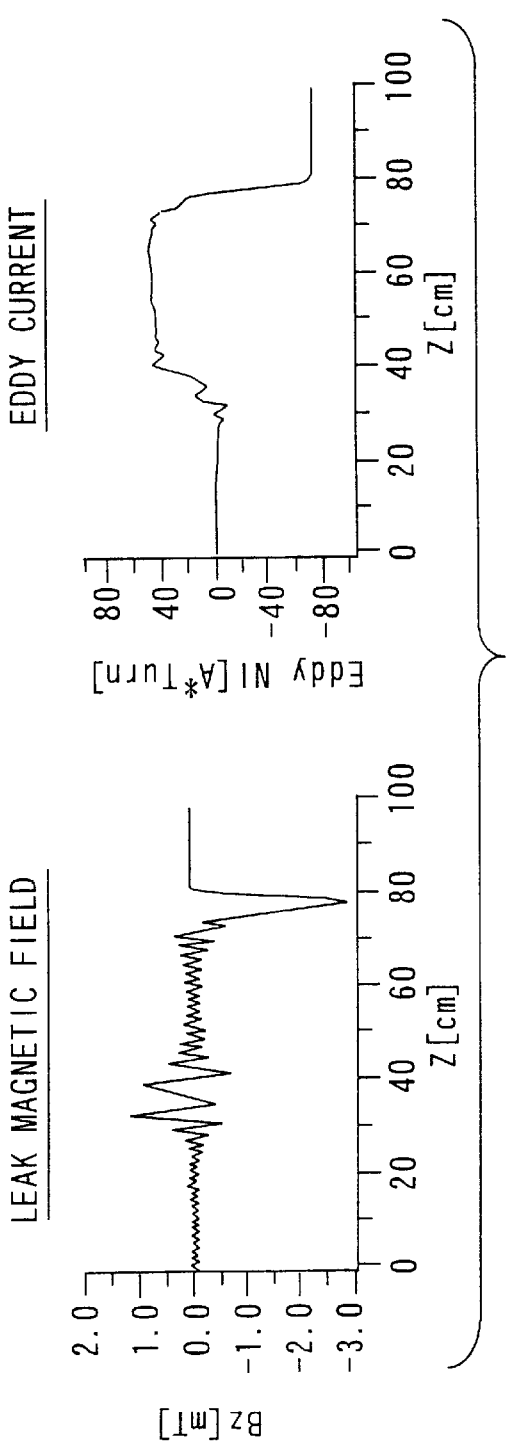
FIG. 24A is a graph showing simulation results on a leak magnetic field and eddy current in a case where the substantial pattern length of the shield coil is equal to the axial length of the magnet.
Figure 24B:
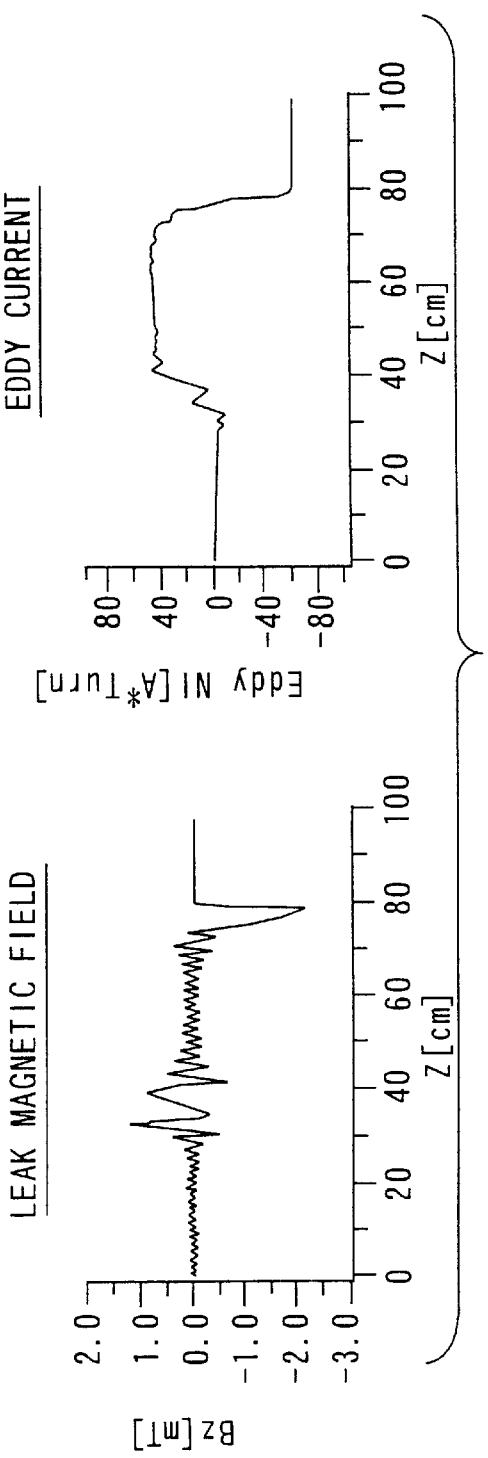
FIG. 24B is a graph showing simulation results on a leak magnetic field and eddy current in a case where the substantial pattern length of the shield coil is longer than the axial length of the magnet by 10 mm.
Figure 24C:
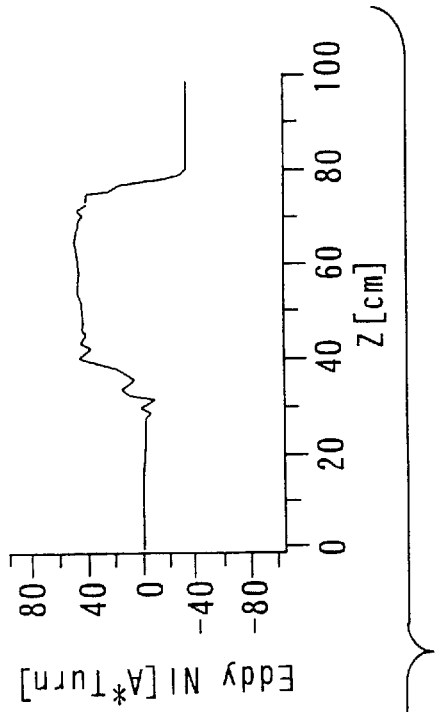
FIG. 24C is a graph showing simulation results on a leak magnetic field and eddy current in a case where the substantial pattern length of the shield coil is longer than the axial length of the magnet by 20 mm.
Figure 24C:
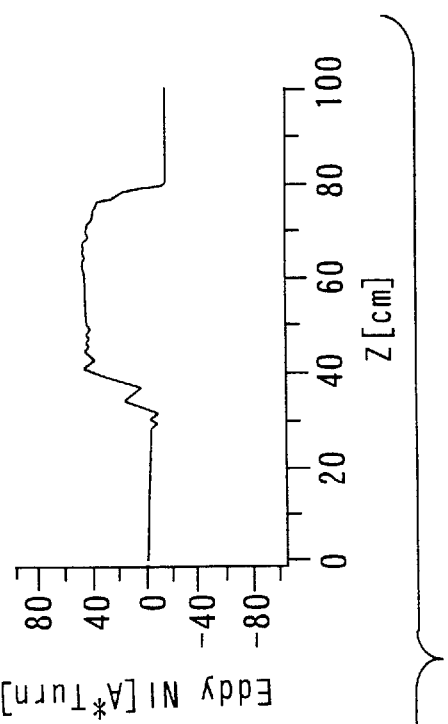
Figure 24C:
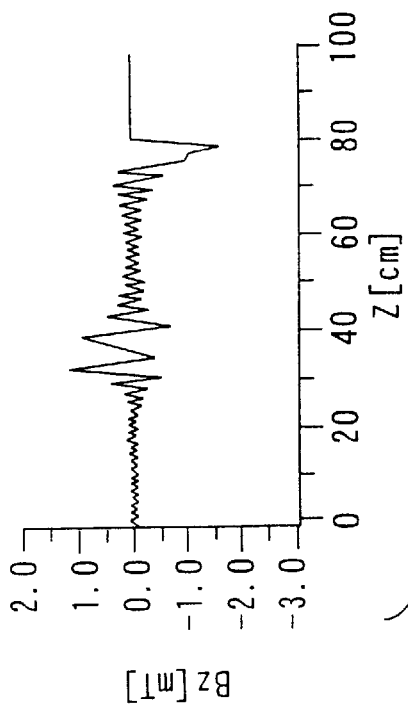
Figure 24D:
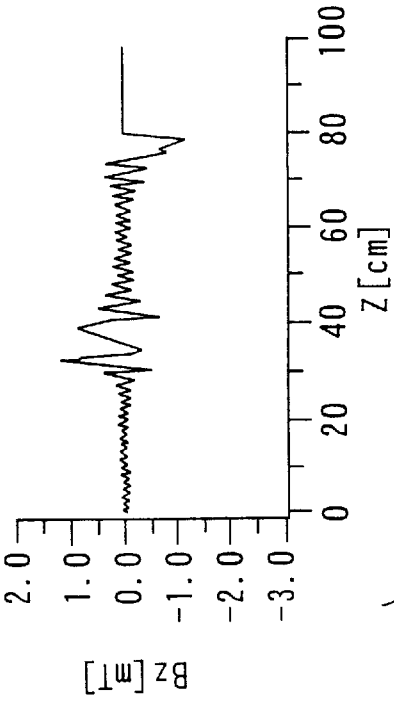
FIG. 24D is a graph showing simulation results on a leak magnetic field and eddy current in a case where the substantial pattern length of the shield coil is longer than the axial length of the magnet by 30 mm.

FIG. 24A shows a case where the substantial pattern length of the shield coil $4012_{shield}$ is equal to the axial length of the static field magnet 4011 (i.e., D=0 in FIG. 23). FIG. 24B shows a case where the substantial pattern length is longer than a side end face of the static field magnet 4011 by 10 [cm] (i.e., D=10 [cm] in FIG. 23). FIG. 24C shows a case where the substantial pattern length is longer than a side end face of the static field magnet 4011 by 20 [cm] (i.e., D=20 [cm] in FIG. 23). FIG. 24D shows a case where the substantial pattern length is longer than a side end face of the static field magnet 4011 by 30 [cm] (i.e., D=30 [cm] in FIG. 23).

As is obvious from these figures, the magnetic field leaking out of the central portion (near the portion represented by Z=30 to 40 [cm]) in the Z-axis direction and the magnitude of eddy current generated by this magnetic field hardly change even with changes in the parameter D representing the positional relationship between the substantial pattern length and the position of the static field end face. In contrast to this, in the end portion (near the portion represented by Z=70 to 80 [cm]) in the axial direction, these amounts greatly change depending on the position relationship parameter D.

More specifically, the case shown in FIG. 24C (D=20 [cm]) indicates a tendency for the eddy current generated by a leak magnetic field in the end portion (near the portion represented by Z=70 to 80 [cm]) of the static field magnet in the axial direction to become equal or less in magnitude to or than the eddy current generated in the central portion (near the portion represented by Z=30 to 40 [cm]) in the axial direction. That is, if D=20 [cm], the noise produced from the end portion of the static field magnet is equal to or less than the noise produced from the remaining portion of the magnet. Therefore, to suppress noise, the structure represented by D=20 [cm] is optimal.

With D=0 or 10 [cm] in FIG. 24A or 24B, the magnitude of eddy current produced in the end portion of the magnet in the axial direction is still larger than that in the central portion. In contrast to this, with D=30 [cm] in FIG. 24D, although the magnitude of eddy current produced in the end portion of the magnet in the axial direction is smaller than that in the central portion, since the eddy current in the central portion can be regarded as a fixed amount determined by other conditions, it is useless in terms of noise suppression to decrease the magnitude of eddy current produced in the end portion below that in the central portion.

The substantial pattern length of the shield coil $4012_{shield}$ of each channel of the ASGC 4012 is therefore maintained at a small value representing a position located outside the side end face of the static field magnet 4011 in the axial direction by distance D= about 20 cm, and noise caused by a leak flux from the end portion can be reduced in amount to that in the central portion. This makes it possible to prevent an increase in size by maintaining the axial length of the shield coil of the ASGC 4012 (i.e., the axial length of the gantry 4001) at the minimum value and reduce overall noise as compared with the prior art.

Embodiment 3-1

Embodiment 3-1 of the present invention will be described with reference to FIG. 25. The same reference numerals as in Embodiment 3 denote the same or equivalent constituent elements in Embodiment 3-1, and a description thereof will be simplified or omitted. A gantry 4001 of Embodiment 3-1 is designed to improve the shape of a side end face of a static field magnet 4011 in consideration of a leak magnetic field from an end portion of a shield coil in the axial direction, i.e., noise due to the resultant eddy current.

Figure 25:
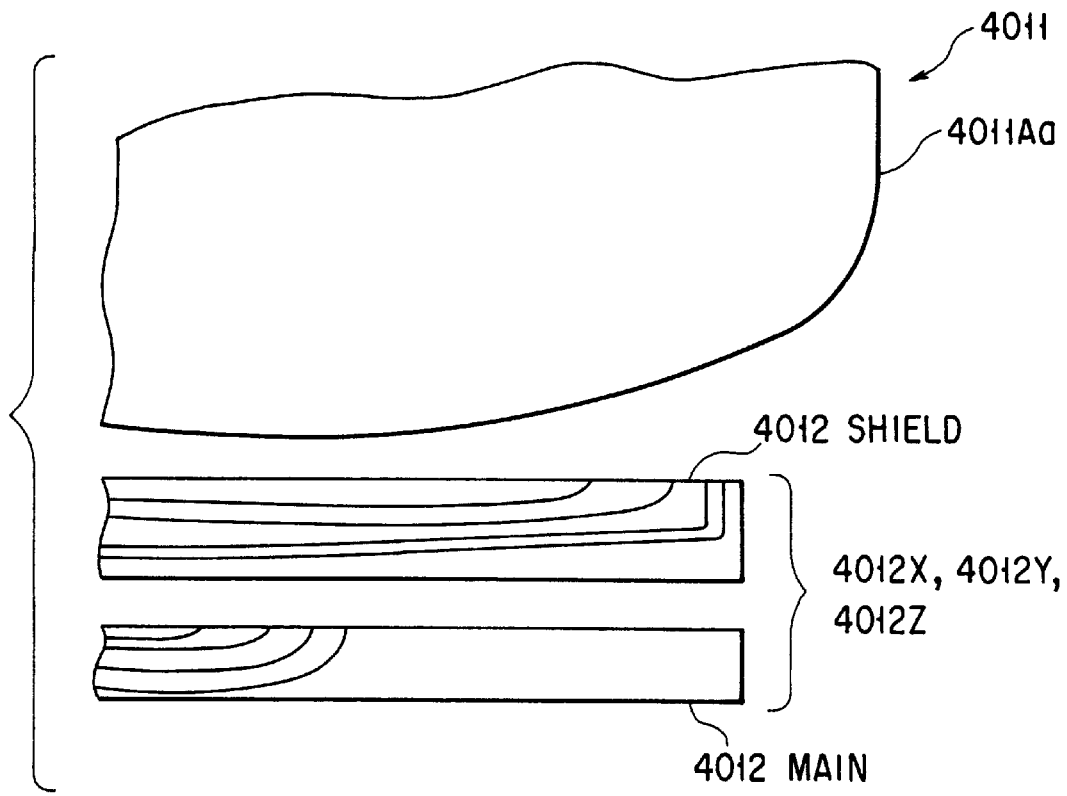
FIG. 25 is a view for explaining the positional relationship between the shield coil of an ASGC and a static field magnet according to Embodiment 3–1.

As shown in FIG. 25, a side end face (side end portion) 4011Aa of the magnet 4011 is rounded and spread from the inner circumferential surface side to the outside in the axial direction, thereby forming a "wide opening shape". The characteristic feature of this shape can be clearly understood in comparison with the "cylindrical shape" shown in FIG. 21.

With this shape, as the side end face (side end portion) 4011Aa extends in the axial direction, the distance in the radial direction by which it reaches the metal cover of the magnet increases. As a consequence, the amount of eddy current produced decreases as the end face extends in the axial direction, and hence the amount of noise decreases accordingly. Therefore, the degree of spread of this round portion is determined in consideration of factors such as magnetic field homogeneity in the imaging area formed in a static field and suppression of noise on the basis of simulations or experiments, thereby setting the amount of noise produced from the end portion in the axial direction to be equal to or less than that caused by a leak magnetic field from the remaining portion in the axial direction. In this case, the pattern length of a shield coil $4012_{shield}$ need not be changed from that in the prior art.

By forming the side end face (side end portion) 4011Aa of the static field magnet 4011 into a wide opening shape, noise can be suppressed, and at the same time, the axial length of the ASGC can be set to be shorter than that of the static field magnet, thus making the gantry compact in the axial direction.

Embodiment 3-2

Embodiment 3-2 will be described with reference to FIG. 26. In each of X, Y, and Z coil assemblies 4012X, 4012Y, and 4012Z of an ASGC 4012 in a gantry 4001 according to Embodiment 3-2, the position of a return wire (also called a connecting wire) which returns from a remote winding portion CR (coil pattern portion) in the radial direction of the bore to the feeding terminal side is determined in consideration of noise suppression. This arrangement may be implemented singly or in combination with the characteristic arrangement of Embodiment 3 or 3-1.

In general, the main coil and shield coil corresponding to each channel of an ASGC are wound at different positions in the radial direction of the bore. For this reason, the main coil itself has a return wire, and the shield coil itself has a return wire. That is, since the positions of the return wires of the main coil and shield coil differ from each other in the radial direction of the bore, even if currents flow in the return wires in opposite directions, magnetic fields cannot be canceled out completely. As a consequence, magnetic fields that cannot be canceled out leak from the main coil and shield coil to the outside, causing noise.

Figure 26:
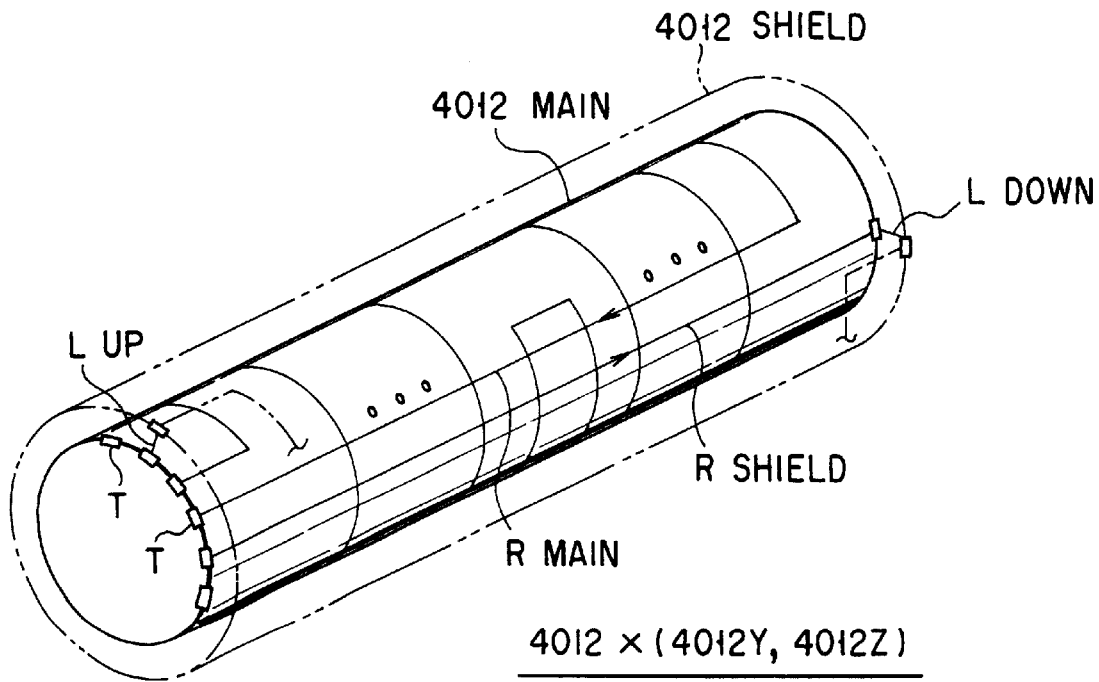
FIG. 26 is a schematic view for explaining the return wire structure of a main coil and shield coil corresponding to each channel in an ASGC according to Embodiment 3–2.

In this embodiment, therefore, as shown in FIG. 26, in the coil assembly corresponding to each channel, a return wire (connecting wire) $R_{shield}$ of a shield coil $4012_{shield}$ is formed adjacent to a return wire (connecting wire) $R_{main}$ of a main coil $4012_{main}$ at the same position in the radial direction. In addition, this wiring is performed on the bobbin on the main coil $4012_{main}$ side. The return wire $R_{shield}$ on the shield coil side may be inserted together with the main coil $4012_{main}$ when it is formed.

An up lead $L_{up}$ extending upward from a feeding terminal T in the radial direction of the bore is connected to the shield coil $4012_{shield}$. A down lead $L_{down}$ from the shield coil $4012_{shield}$ extends downward at the end portion in the radial direction on the opposite side and is connected to the above return wire $R_{main}$ to return to another feeding terminal T. FIG. 26 shows the shape of the winding portion for the Z channel. This return wire structure can equally apply to the X and Y channels.

In this structure, currents flow in the two return wires $R_{main}$ and $R_{shield}$ in opposite directions. In addition, the positions of the return wires are the same in the radial direction of the bore, and the wires are almost located side by side. As a consequence, most of the magnetic fields produced from these return wires can be canceled out reliably. Therefore, noise due to currents flowing in the return wires can be reliably reduced. In addition, the return wire $R_{shield}$ on the shield coil side is located on the main coil side, and hence is spaced apart from the static field magnet accordingly. This also contributes to a reduction in noise. Furthermore, in this embodiment, since the pattern length is shorter than the shield coil, a space for routing the return wire $R_{shield}$ of the shield coil $4012_{shield}$ can be ensured by using a space on the main coil $4012_{main}$ side having a relatively large spatial margin. Since such a space need not be ensured on the shield side, a reduction in the axial size of the ASGC can be ensured.

Fourth Embodiment

The basic arrangement of a magnetic resonance imaging apparatus will be described first with reference to FIG. 27. The magnetic resonance imaging apparatus includes a gantry 14 having an measurement space in which an object subjected to image diagnosis is to be inserted/placed, a bed 18 disposed adjacent to the gantry 14, and a control processing section (computer system) for controlling the operations of the gantry 14 and bed 18 and processing MR signals. Typically, a substantially cylindrical measurement space extends through the inner central portion of the gantry 14. With regard to this cylindrical measurement space, the axial direction is defined as a Z direction, and an X direction (horizontal direction) and Y direction (vertical direction) perpendicular to the Z direction are defined.

The gantry 14 has a static field magnet 1 which receives a current supplied from a static field power supply 2 and generates a static field H0 in the measurement space. This static field magnet 1 is typically formed by a superconductive magnet. The static field magnet 1 has a substantially cylindrical shape as a whole. A gradient field coil 3 is placed in the bore of the static field magnet 1. The gradient field coil 3 is made up of three coils 3x, 3y, and 3z which independently receive currents supplied from a gradient field power supply 4 and generate X-, Y-, and z-axis gradient fields, respectively. The gradient field coil 3 is housed in a sealed vessel in which a vacuum or a similar state is maintained by a vacuum pump.

A high-frequency (RF coil) 7 is placed inside the gradient field coil 3. A transmitter 8T and receiver 8R are connected to the RF coil 7. The transmitter 8T supplies, to the RF coil 7, a current pulse that oscillates at a Larmor frequency to excite nuclear magnetic resonance (NMR) under the control of a sequencer 5. The receiver 8R receives an MR signal (high-frequency signal) via the RF coil 7, and performs various kinds of signal processes to form a corresponding digital signal.

The sequencer 5 is set under the control of a controller 6 for controlling the overall apparatus. An input device 13 is connected to the controller 6. The operator can select a desired pulse sequence from a plurality of kinds of pulse sequences in the spin echo method (SE) and echo-planar imaging method (EPI) through the input device 13. The controller 6 sets the selected pulse sequence in the sequencer 5. The sequencer 5 controls the application timings of gradient fields in the X-axis, Y-axis, and Z-axis directions, their strengths, the application timing of a high-frequency magnetic field, amplitude, duration, and the like in accordance with the set pulse sequence.

An arithmetic unit 10 inputs the MR signal (digital data) formed by the receiver 8R, and performs processes, e.g., arrangement of measured data in a two-dimensional Fourier space formed in the internal memory and Fourier transform for image reconstruction, to generate image data and spectrum data. A storage unit 11 stores computed image data. A display unit 12 displays an image.

An embodiment of the magnetic resonance imaging apparatus having the above basic arrangement will be described next.

Figure 28:
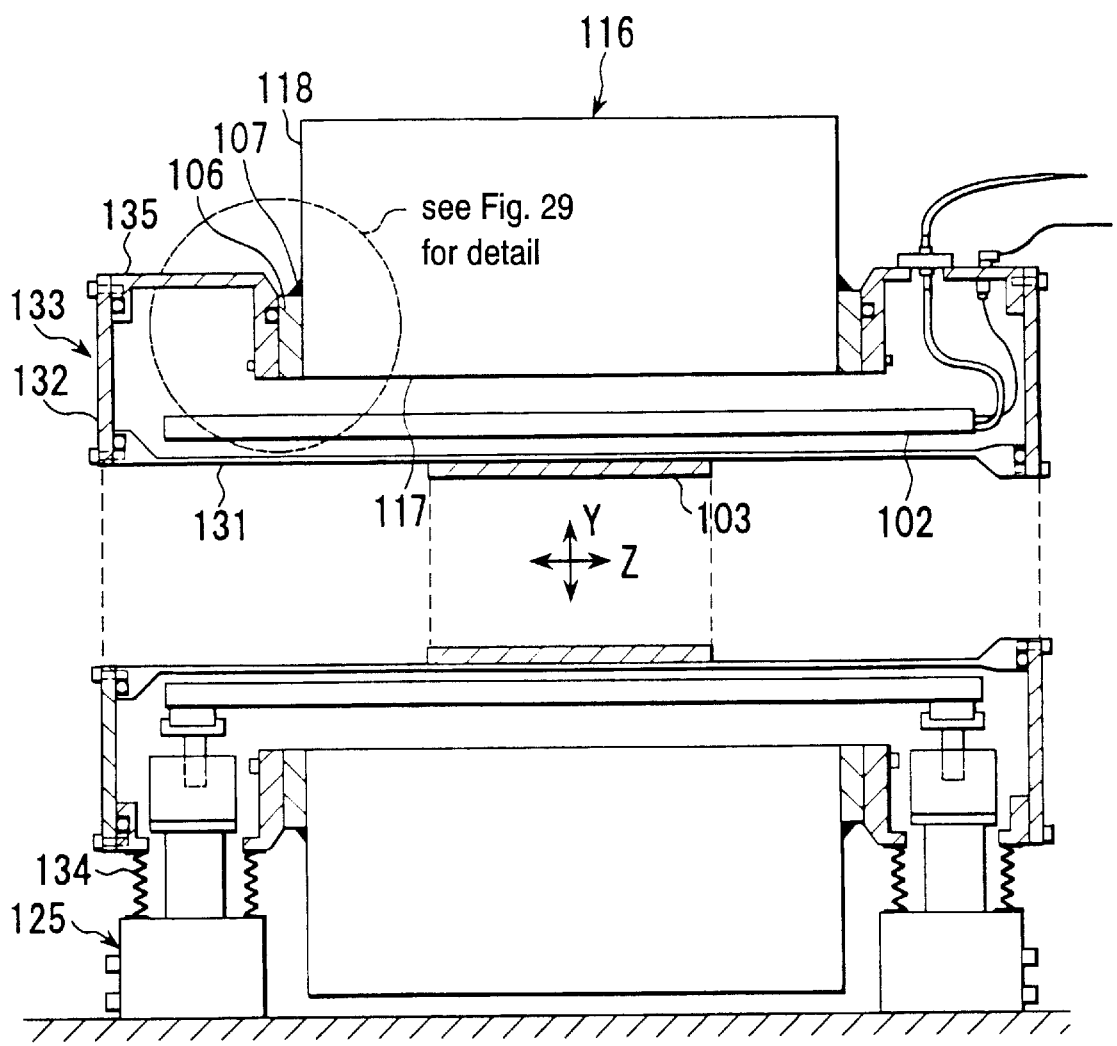
FIG. 28 is a longitudinal sectional view of a gantry according to the fourth embodiment.

FIG. 28 is a longitudinal sectional view of the gantry of the magnetic resonance imaging apparatus according to the fourth embodiment. A gradient field coil 102 may be of a non-shield type or active shield type. The gradient field coil 102 has x, y, and z coils as its windings. These x, y, and z coils are housed in a cylindrical bobbin.

The gradient field coil 102 having a substantially cylindrical shape is supported on a heavy, concrete gantry base 125 placed on the floor. The gradient field coil 102 is housed in a sealed vessel 133. The sealed vessel 133 has a liner 131 having a substantially cylindrical shape and forming the inner wall of the vessel, and a vacuum cover 132. The back surface of the sealed vessel 133 is closed with an inner wall 117 of a cryostat 116 for setting a static field magnet (superconductive coil in this case) in a cryogenic environment. A side wall 118 of the cryostat 116 is joined to the vacuum cover 132 with a joint plate 135. The sealed vessel 133 is coupled to the gantry base 125 via a vacuum bellows 134 to keep the sealed vessel 133 airtight.

The air in the sealed vessel 133 is exhausted by a vacuum pump to keep a vacuum or a similar state in the sealed vessel 133. This prevents air-born propagation of noise originating from the gradient field coil 102.

An RF coil 103 is placed on the inner surface of the liner 131. A high-frequency magnetic field is applied to an object via the RF coil 103, and an MR signal from the object is received.

In this arrangement, vacuum leakage tends to occur in the connection portion between the side wall 118 of the cryostat 116 and the joint plate 135. To prevent this vacuum leakage, an O-ring 108 for vacuum sealing is clamped between the side wall 118 of the cryostat 116 and the joint plate 135. However, the surface precision of the side wall 118 of the cryostat 116 is not very high. For this reason, the contact precision between the side wall 118 of the cryostat 116 and the O-ring 108 is not very high, and hence the sealing performance of the O-ring 108 is not sufficient.

Figure 29:
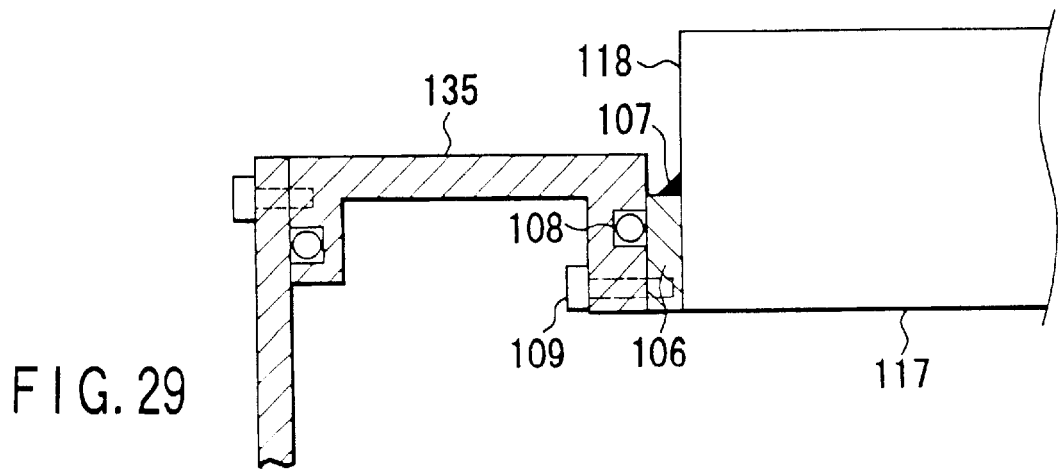
FIG. 29 is an enlarged view of the portion encircled by the dashed line in FIG. 28.

In contrast to this, according to this embodiment, as shown in FIG. 29, an annular flange 106 is welded (reference numeral 107) to the side wall 118 of the cryostat 116, and the joint plate 135 of the sealed vessel 133 is fixed to the flange 106 with a bolt 109 via the O-ring 108. The flange 106 can be formed with high precision by shaving or the like. Since the flange 106 can be brought into contact with the O-ring 108 properly, the sealing performance of the O-ring 108 can be maximized. In addition, since the side wall 118 of the cryostat 116 is connected to the flange 106 by welding, the connection portion therebetween can be kept airtight. This makes it possible to maintain a substantially vacuum state in the sealed vessel 133 and properly prevent air-born propagation of vibrations and noise.

Fifth Embodiment

FIG. 30A shows an outer appearance of the sealed vessel of a gradient field coil according to the fifth embodiment. To take a measure against noise, the gradient field coil is housed in a sealed vessel 201 held in a substantially vacuum state. In this arrangement, therefore, in the prior art, to.check the position of the gradient field coil, the sealed vessel 201 must be partly disassembled.

In contrast to this, according to this embodiment, a pair of left and right circular holes are formed in each side wall 207 of the sealed vessel 201. Windows 202 made of a glass or fiber reinforced plastic material that transmits visible light are fitted in the holes. An operator can easily make a visual check on the position of the gradient field coil in the sealed vessel 201 from the outside via the windows 202.

As shown in FIG. 30B, a gradient field coil 204 has scale marks 206 each indicating the position of the coil. The scale mark 206 can be visually checked via the window 202. The operator can objectively grasp the position of the gradient field coil 204 relative to a static field magnet 205 while seeing the scale mark 206.

As shown in FIG. 30C, leg portions 203 of the sealed vessel 201 have bases 212. Supports 213 supporting the gradient field coil 204 are fitted in holes vertically formed in the bases 212 to be vertically movable. Threads are formed on the outer surfaces of the supports 213. Screws 215 are threadably engaged with the threads at crossing axes. When a dial 214 on the distal end portion of each screw 215 is rotated, the support 213 vertically moves, together with the gradient field coil 204, in the sealed vessel 201. This makes it possible to adjust the position of the gradient field coil 204 relative to the static field magnet 205.

In this manner, the gradient field coil can be visually checked from the outside without disassembling the vessel, and position adjustment can be performed. This can reduce the chances of degrading airtightness. Therefore, the vessel can be kept airtight, and a sound insulating effect for air-borne propagation of vibrations and noise can be enhanced.

Figure 30D:
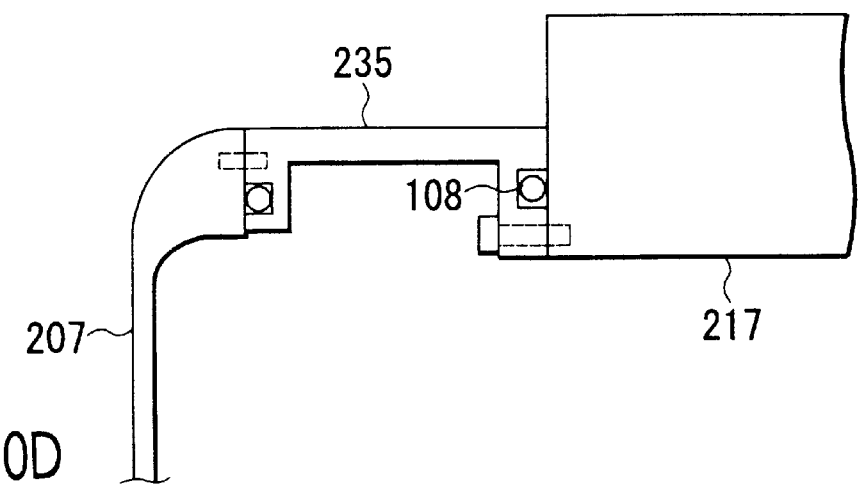
FIG. 30D is a partial sectional view of the closed vessel according to the fifth embodiment.

Further, as shown in FIG. 30D, the side walls 207 of the sealed vessel 201 are jointed to the cryostat 217 with the joint plates 235. Corners where the joint plates 235 are jointed to the side walls 207 are rounded off. Corners where the joint plates 235 are jointed to the liner of the vessel 201 are rounded off. Therefore, the vessel 201 can have a sufficient strength to atmospheric pressure.

Sixth Embodiment

Figure 31:
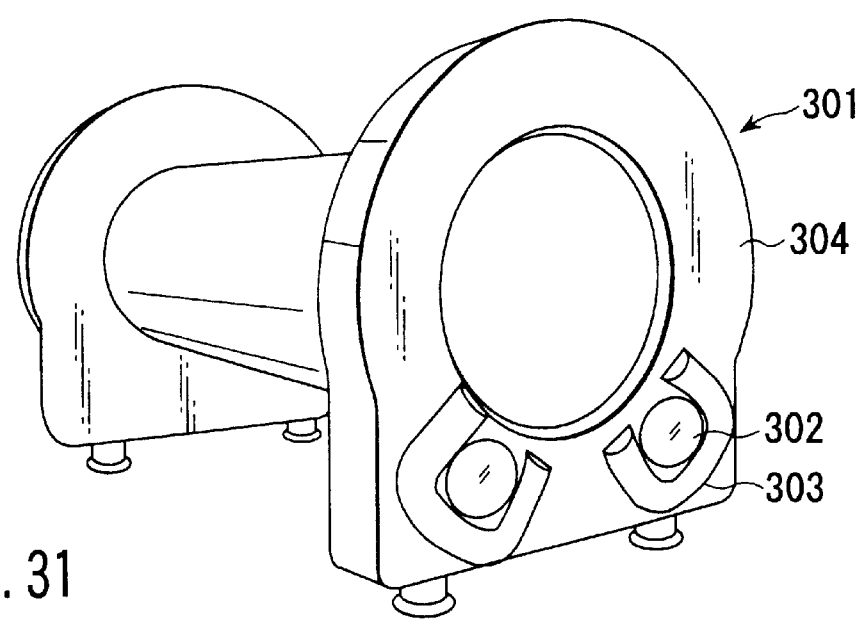
FIG. 31 is a perspective view of a sealed vessel according to the sixth embodiment.

FIG. 31 shows an outer appearance of the sealed vessel of a gradient field coil according to the sixth embodiment. The gradient field coil is housed in a sealed vessel 301. To prevent air-born propagation of noise originating from the gradient field coil 102, the air in the sealed vessel 301 is exhausted by a vacuum pump to keep a vacuum or a similar state in the sealed vessel 301. For this reason, the sealed vessel 133 receives an atmospheric pressure. The strength of the sealed vessel 133 is therefore important. In the fifth embodiment described above, the windows 302 are attached to the side walls 207 of the sealed vessel 201. In the sixth embodiment, to increase the strength of the portion of each window 302, a portion of a side wall 304 which surrounds the window 302 is formed into a convex portion 303 having a round shape like a half pipe, thereby reinforcing the portion around the window 302.

With this reinforcement, the degree of vacuum (internal pressure) in the sealed vessel 301 can be sufficiently increased, and hence a sound insulating effect for air-borne propagation of vibrations and noise can be enhanced.

Figure 32:
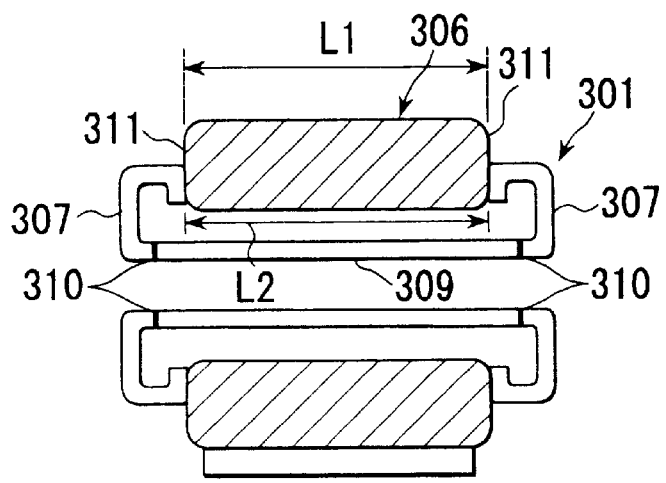
FIG. 32 is a cross-sectional view showing how the sealed vessel in FIG. 31 is joined to a static field magnet vessel.

As shown in FIG. 32, the sealed vessel 301 has a liner 309 having a substantially cylindrical shape and forming the inner wall of the vessel and a vacuum cover 307. The back surface of the sealed vessel 301 is closed with the inner wall of a cryostat 306 for setting a static field magnet (superconductive coil in this case) in a cryogenic environment. A side wall 311 of the cryostat 306 is joined to the vacuum cover 307.

In an actual manufacturing process, a length L1 of the cryostat 306 may not match with a length L2 of an opening portion of the sealed vessel 301 in which the cryostat 306 is to be fitted. In this case, the airtightness of the sealed vessel 301 deteriorates, and vacuum leakage occurs. To solve this problem, in this embodiment, an annular packing 310 is clamped between the liner 309 of the sealed vessel 301 and the vacuum cover 307. If, therefore, the length L1 of the cryostat 306 does not match with the length L2 of the opening portion of the sealed vessel 301 in which the cryostat 306 is to be fitted, the liner 309 of the sealed vessel 301 is joined to the vacuum cover 307 via the packing 310 having a proper width. This makes it possible to easily match the length L1 of the cryostat 306 with the length L2 of the opening portion of the sealed vessel 301 in which the cryostat 306 is to be fitted.

The packing 310 improves the joining precision between the sealed vessel 301 and the cryostat 306 to improve the airtightness of the sealed vessel 301. This enhances the sound insulating effect for air-borne propagation of vibrations and noise.

Seventh Embodiment

The gradient field coil is not only a source of vibrations and noise in a magnetic gantry. For example, a heat exchanger using a superconductive coil as a static field magnet produces such vibrations and noise. FIGS. 33 and 34 are sectional views of a heat exchanger according to this embodiment. A superconductive coil 401 is housed in a cryostat 404. The cryostat 404 is configured to surround a liquid nitrogen bath housing the superconductive coil 401 together with liquid nitrogen with a plurality of heat radiation shields 402, 405, and 406.

This cryostat 404 has a heat exchanger 407 for absorbing heat from the shield 402 and dissipating it outside. The heat exchanger 407 is comprised of a cylinder 408 having a bottom portion in contact with the shield 402, a cold head 411 which is cooled by helium gas He and is used to cover the cylinder 408, a displacer 409 which reciprocates like a piston between the bottom portion and the cold head 411 inside the cylinder 408 with the pressure of helium gas He, and a vacuum bellows 410.

When the displacer 409 is located on the bottom portion, the displacer 409 absorbs heat from the shield 402. When the displacer 409 is located at the top portion, the displacer 409 transfers heat to the cold head 411. By repeating this operation, heat can be dissipated from the shield 402.

As described above, since the displacer 409 reciprocates like a piston inside the cylinder 408, vibrations are produced. The vibrations mechanically propagate to the shields 402, 405, and 406. This produces noise.

To absorb the vibrations, a dynamic vibration absorber 414 is mounted on the cold head 411. An elastic member, e.g., a spring 412, of the dynamic vibration absorber 414 is connected onto the cold head 411 such that the expanding direction of the spring 412 is substantially parallel to the direction in which the displacer 409 reciprocates like a piston. A weight 413 is connected to the spring 412. As the displacer 409 reciprocates like a piston, the weight 413 moves vertically. With this operation, the vibrations of the cold head 411, originating from the displacer 409, are absorbed by the dynamic vibration absorber 414. As a consequence, noise is reduced.

The displacer 409 moves like a piston at the frequency of commercial power. The elasticity of the spring 412 and the mass of the weight 413 are set such that the dynamic vibration absorber 414 resonates with vibrations originating from the displacer 409 moving like a piston at this frequency. This makes it possible to effective absorb the vibrations.

Vibrations can also be reduced by the following arrangement. As shown in FIG. 35, two cylinders 408-1 and 408-2, two displacers 409-1 and 409-2, and two cold heads 411-1 and 411-2, i.e., two heat exchangers, are prepared, and the two heat exchangers are arranged such that the piston motion axes oppose each other, and the displacers 409-1 and 409-2 are made to move like a piston in opposite phases.

Eighth Embodiment

Figure 36:
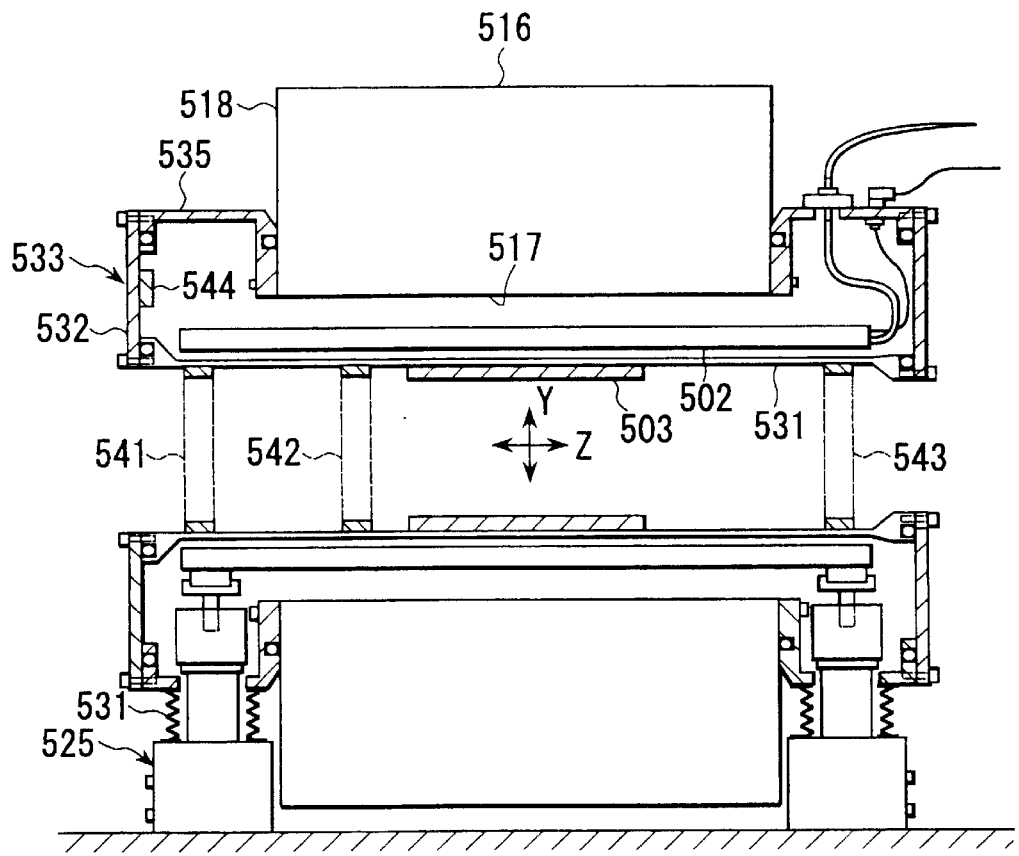
FIG. 36 is a longitudinal sectional view of a gantry according to the eighth embodiment.

FIG. 36 is a longitudinal sectional view of the gantry of a magnetic resonance imaging apparatus according to the eighth embodiment. A gradient field coil 502 includes x, y, and z coils as its windings. These x, y, and z coils are housed in a cylindrical bobbin. This substantially cylindrical gradient field coil 502 is supported on a heavy, concrete gantry base 525 installed on the floor. The gradient field coil 502 is housed in a sealed vessel 533. The sealed vessel 533 includes a liner 531 having a substantially cylindrical shape and forming the inner wall of the vessel and a vacuum cover 532. The back surface of the sealed vessel 533 is closed with an inner wall 517 of a cryostat 516 for setting a static field magnet (superconductive coil in this case) in a cryogenic environment. A side wall 518 of the cryostat 516 is joined to the vacuum cover 532 with a joint plate 535. The sealed vessel 533 is coupled to the gantry base 525 with a vacuum bellows 534 to keep the airtightness of the sealed vessel 533.

The vibrations of the gradient field coil 502 mechanically propagate to the sealed vessel 533. The frequency of the vibrations of the gradient field coil 502 is equal to the alternating frequency of a gradient field in a pulse sequence. Weights 541, 542, 543, and 544 are discretely mounted on the liner 531 and vacuum cover 532 such that the liner 531 and vacuum cover 532 of the sealed vessel 533 do not resonate with the vibrations of the gradient field coil 502, i.e., the natural frequencies of the liner 531 and vacuum cover 532 differ from the vibration frequency of the gradient field coil 502.

The weight 544 mounted on the vacuum cover 532 is, for example, a nonmagnetic metal piece. The annular gel-like substances 541, 542, and 543 are mounted along the inner wall of the liner 531. The substances 541, 542, and 543 are mounted outside an RF coil 503 to prevent a decrease in the Q value of the RF coil 503.

According to this structure, the liner 531 and vacuum cover 532 of the sealed vessel 533 do not resonate with the vibrations of the gradient field coil 502. Hence, noise is reduced.

Instead of or in addition to mounting the weights on the liner 531 and vacuum cover 532, the thicknesses of the liner 531 and vacuum cover 532 may be partly decreased. It is an important point of this embodiment that the masses of the liner 531 and vacuum cover 532 are partly increased/decreased to shift their natural frequencies. In addition to shifting the natural frequencies, beams or struts may be used to reinforce the structure.

Ninth Embodiment

Figure 37:
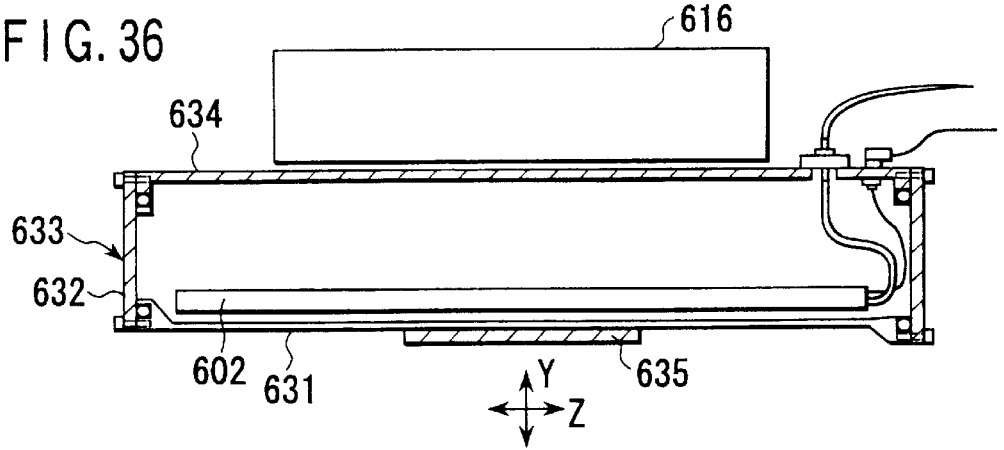
FIG. 37 is a longitudinal sectional view of a gradient field coil unit according to the ninth embodiment.
Figure 37:
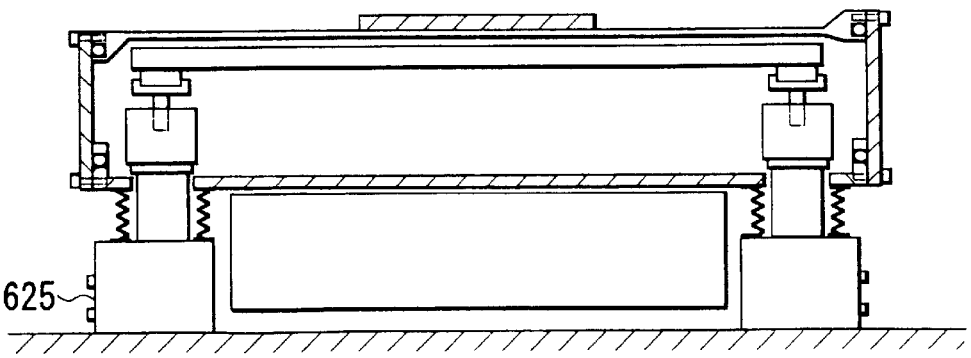

FIG. 37 is a longitudinal sectional view of the gantry of a magnetic resonance imaging apparatus according to the ninth embodiment. A gradient field coil 602 includes x, y, and z coils as its windings. These x, y, and z coils are housed in a cylindrical bobbin. This substantially cylindrical gradient field coil 602 is supported on a heavy, concrete gantry base 625 installed on the floor. The gradient field coil 602 is housed in a sealed vessel 633. The sealed vessel 633 includes a liner 631 having a substantially cylindrical shape, a vacuum cover 532 having a substantially annular, plate-like shape, and a back casing 634 having a substantially cylindrical shape. A cryostat 616 for setting a static field magnet (superconductive coil in this case) in a cryogenic environment is placed outside the back casing 634 of the sealed vessel 633. An RF coil 635 is mounted on the inner surface of the liner 631. A high-frequency magnetic field is applied to an object via the RF coil 635, and an MR signal is received from the object.

It is an important point of this embodiment that the sealed vessel 633 housing the gradient field coil 602 does not use the inner wall of the cryostat 616. In other words, the sealed vessel 633 and cryostat 616 are formed as completely discrete components. If the inner wall of the cryostat 616 is used for the sealed vessel 633 housing the gradient field coil 602, vacuum leakage tends to occur at the joint portion due to poor surface precision, dimensional errors, and the like of the cryostat 616. In this embodiment, however, the cryostat 616 is not joined to the sealed vessel 633. That is, the sealed vessel 633 is manufactured singly. Therefore, high airtightness can be attained regardless of poor surface precision, dimensional errors, and the like of the cryostat 616.

10th Embodiment

The 10th embodiment is configured to prevent type B waves and induced electrons from being produced when metal parts in the gantry rub against each other, and can be applied to fastening of all metal parts constituting the gantry of a magnetic resonance apparatus which physically vibrates or in which vibrations propagate.

The gantry is comprised of many metal parts, which are fastened to each other by mainly using metal screws. If, for example, as shown in FIG. 38A, when a copper tuner plate 724 is to be mounted on a metal gantry frame 724, a metal screw 723 and metal insert 722 are generally used in the prior art. Many capacitors are arranged in the gantry. When these capacitors are to be mounted on a tuner plate and the connector of an RF coil tuner is to be fastened to the tuner plate, many metal screws are used. As described above, in the gantry, when parts are to be fixed, metal screws are used at most portions. As shown in FIG. 38B, when these metal screws rub against the metal parts or metal parts rub against each other due to the above intense vibrations, so-called type B waves are produced. Such type B waves are picked up by the RF coil, and image artifacts may be produced. This has hardly posed a problem until recently. Recently, however, as higher voltages have been used to attain increases in the speed and strength of a gradient field, type B waves tend to increase in intensity. At present, image artifacts due to increased type B wave noise have become too large to be neglected. In addition to type B waves, electrons induced by contact between, for example, a connector and a tuner plate and vibrations directly enter a signal line to produce image artifacts, posing a problem.

It is an object of this embodiment to prevent the occurrence of type B waves and inducted electrons that cause noise.

As is known, a gantry is a magnetic apparatus mainly constituted by a static field magnet, gradient field coil, and RF coil, and includes many metal parts. These metal parts are mounted on many portions. These mounting portions can be roughly classified into two types. As shown in FIGS. 39 and 40, mounting portions of one type are portions where parts are physically fixed and must be electrically connected to each other, represented by a portion where copper plates constituting an RF coil are attached to each other, a portion where the RF coil copper plates 709 and 710 and a capacitor 711 are attached to each other, a portion where the RF coil copper plate 710 and a lead copper plate 703 are attached to each other, a portion where the lead copper plate 703 and an RF coil tuner copper plate 704 are attached to each other, a portion where the RF coil tuner copper plate 704 and a connector 706 are attached to each other, and a portion where the RF coil tuner copper plate 704 and a capacitor 715 are attached to each other. Mount portions of the other type are portions where it is a main object to physically fix parts to each other, but they need not be electrically connected to each other.

It is most preferable that parts be mounted on the former portions by using solder 705. In this case, since no parts rub against to each other, neither type B wave nor induced electrons are produced. However, solder cannot be used at some portions because of weak fastening force. Screws are used on such portions.

Figure 41:
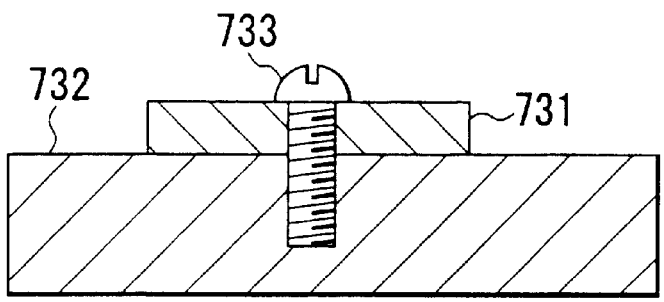
FIG. 41 is a view showing another example of how metal parts are connected to each other in the 10th embodiment.

FIG. 41 shows an example of how metal parts 731 and 732 are attached to each other by using a resin screw 733. In the prior art, since a metal screw is used, and the metal screw rubs against the metal parts 731 and 732, type B waves and induced electrons are inevitably produced. In this embodiment, however, the resin screw 733 is used, and hence generation of such waves and electrons can be prevented.

Figure 42:
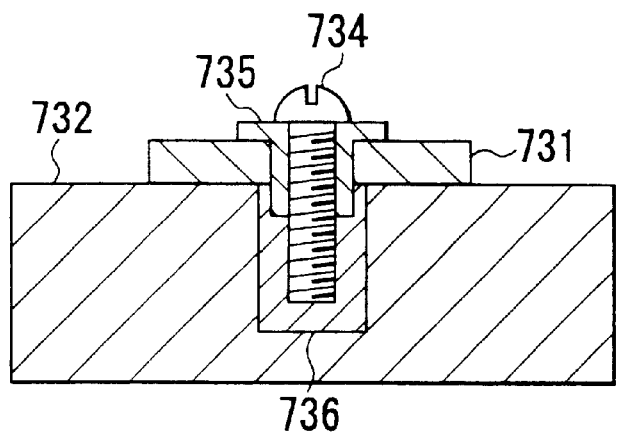
FIG. 42 is a view showing an example of how metal parts are insulated/connected from/to each other in the 10th embodiment.

FIG. 42 shows another example of how the metal parts 731 and 732 are attached to each other by using a metal screw 734. A substantially cylindrical resin spacer 735 is used to prevent direct contact between the metal screw 734 and metal part 731. In addition, a resin tap 736 is used to prevent contact between the metal screw 734 and the metal part 732. In this case, although the metal screw 734 is used, type B waves and induced electrons can be prevented by insulating the metal screw 734 from the metal parts 731 and 732 with the resin members 735 and 736.

Obviously, either of the methods shown in FIGS. 41 and 42 or a combination thereof can be used. It is expected that type B waves and inducted electrons will be suppressed by applying the mounting methods shown in FIGS. 41 and 42 to some portions in the gantry instead of all the corresponding portions.

Figure 43:
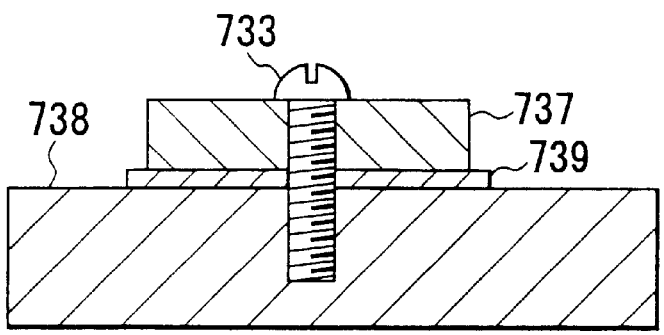
FIG. 43 is a view showing another example of how metal parts are insulated/connected from/to each other the 10th embodiment.

At the portions of the latter type, i.e., the portions where it is the main object to physically fix parts to each other, but there is no need to electrically connected them, metal parts 737 and 738 are attached to each other with the resin screw 733 as shown in, for example, FIG. 43. In this case, inserting an insulating sheet 739 between the metal parts 737 and 738 can prevent type B waves and inducted electrons generated due to friction between the metal parts 737 and 738 as well as type B waves and inducted electrons generated due to friction between the metal screw and the metal parts as in the prior art.

Figure 44:
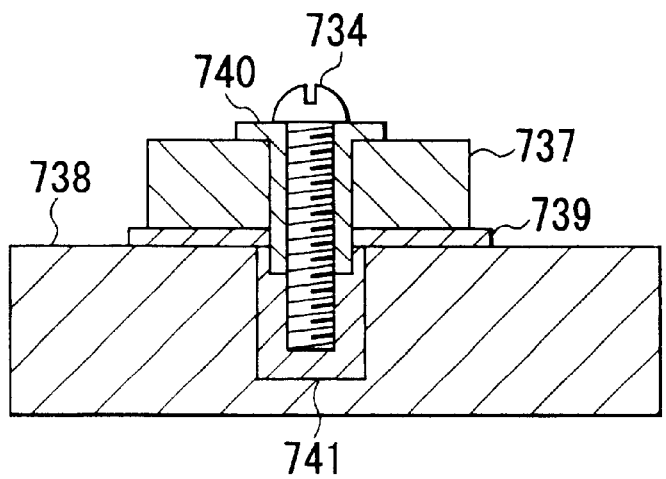
FIG. 44 is a view showing still another example of how metal parts are insulated/connected from/to each other the 10th embodiment.

FIG. 44 shows a case wherein the metal parts 737 and 738 are attached to each other by using the metal screw 734. A substantially cylindrical resin spacer 740 is used to prevent contact between the metal screw 734 and the metal part 738. In addition, a resin tap 741 is used to prevent contact between the metal screw 734 and the metal part 738. In this case, although the metal screw 734 is used, the type B waves and inducted electrons can be prevented by insulating the metal screw 734 from the metal parts 737 and 738 with the resin members 740 and 741.

Obviously, either of the methods shown in FIGS. 43 and 44 or a combination thereof can be used. It is expected that the type B waves and inducted electrons will be suppressed by applying the mounting methods shown in FIGS. 43 and 44 to some portions in the gantry instead of all the corresponding portions.

In addition, the type B waves and inducted electrons generated due to friction between metal screws and metal parts as in the prior art can be prevented by applying the mounting method shown in FIG. 43 or 44 to portions where metal parts are attached to resin parts such as a coil bobbin as well as portions where metal parts are attached to each other.

11th Embodiment

The 11th embodiment is related to an improvement in an RF shield placed around an RF coil. The RF shield is typically formed by a copper cylinder to magnetically isolate the RF coil from the outside and shield the RF coil against external electromagnetic noise. An eddy current is produced in this copper cylinder due to high-speed switching of a gradient field, distorting the gradient field. To decrease the time constant of this eddy current, many slits are formed in the copper cylinder.

In addition, capacitors are connected between copper plates across the slits to transmit a magnetic field having a relatively low frequency (up to about 100 kHz), e.g., a gradient field, and block a magnetic field having a high frequency of several MHz to several ten MHz, e.g., excitation pulses, i.e., increase a low-frequency impedance and decrease a high-frequency impedance. As another conventional RF shield, an RF shield having capacitances formed on its upper and lower surfaces is also available, which is formed by sticking a plurality of copper plates on the upper and lower surfaces of a dielectric substrate with gaps (slits).

A high-speed imaging method such as echo planar imaging (EPI) is required to image, for example, the heart. A very high response speed of a gradient field is indispensable for this operation. For this reason, many slits must be formed in very small increments (at very small intervals). If, however, many slits are formed, the capacitance decreases with a reduction in the area of each copper plate. This makes high-frequency short circuits in the respective slits imperfect. As a consequence, the shield function is made imperfect.

This embodiment is configured to achieve both an increase in the number of slits and prevention of a decrease in capacitance.

Figure 45:
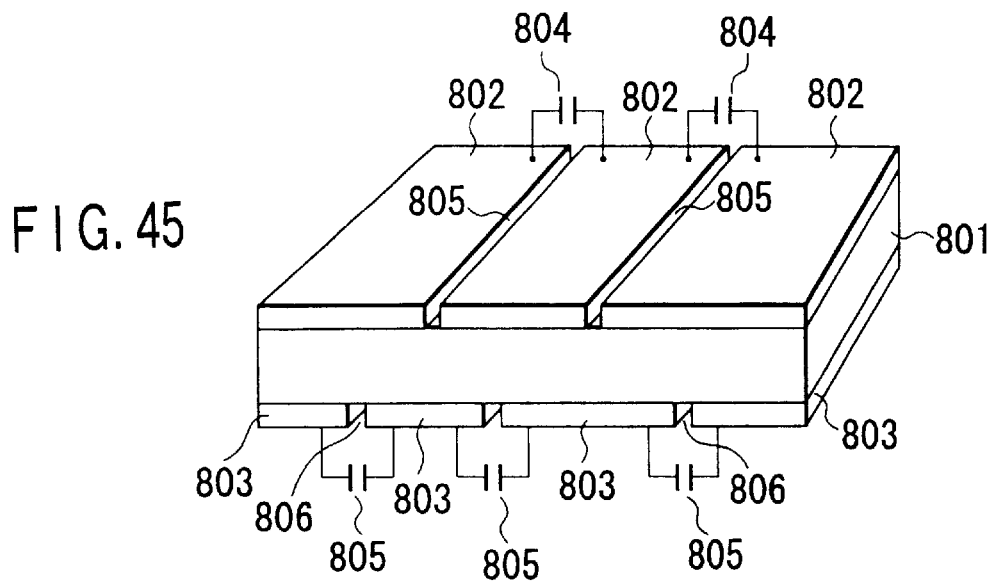
FIG. 45 is a perspective view of an RF shield according to the 11th embodiment.

FIG. 45 is a partial perspective view of an RF shield according to this embodiment. A plurality of copper plates 802 are stuck on the upper surface of a dielectric substrate 801 with predetermined gaps (slits) 805. Likewise, a plurality of copper plates 803 are formed on the lower surface of the dielectric substrate 801 with predetermined gaps (slits) 806. A capacitance is formed between the copper plates 802 and 803 opposing through the dielectric substrate 801.

In addition, capacitors 804 are formed between the adjacent copper plates 802 on the upper surface of the dielectric substrate 801. Likewise, capacitors 805 are formed between the adjacent copper plates 803 on the lower surface of the dielectric substrate 801.

In this arrangement, the total capacitance of the capacitors 804 on the upper surface, the capacitors 805 on the lower surface, and the capacitance between the copper plates 802 on the upper surface and the copper plates 803 on the lower surface is ensured as a capacitance large enough to make high-frequency short circuits perfect.

12th Embodiment

Figure 46:
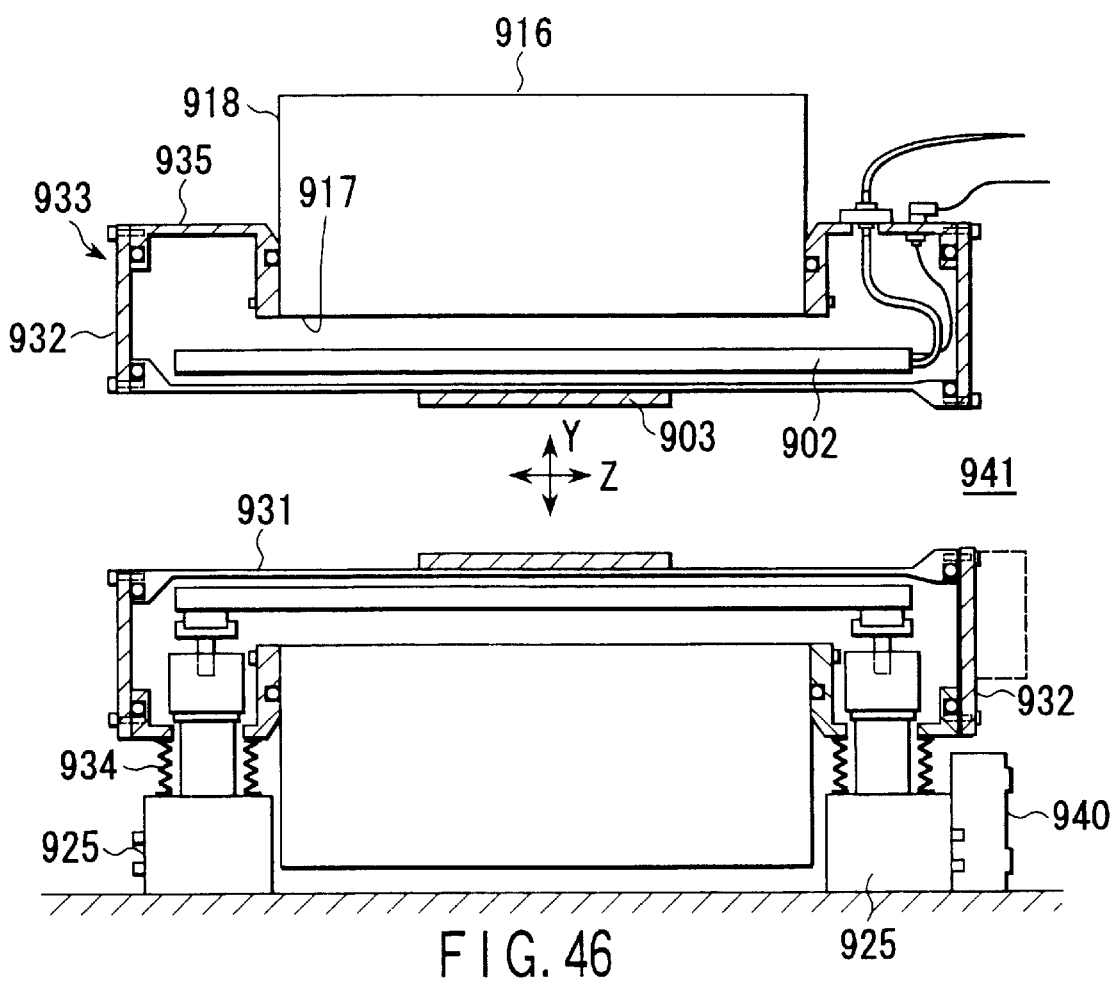
FIG. 46 is a longitudinal sectional view of the gantry of a magnetic resonance imaging apparatus according to the 12th embodiment.

FIG. 46 is a longitudinal sectional view of the gantry of a magnetic resonance imaging apparatus according to the 12th embodiment. A gradient field coil 902 includes x, y, and z coils as its windings. These x, y, and z coils are housed in a cylindrical bobbin. This substantially cylindrical gradient field coil 902 is supported on a heavy, concrete gantry base 925 installed on the floor. The gradient field coil 902 is housed in a sealed vessel 933. The sealed vessel 933 includes a liner 931 having a substantially cylindrical shape and forming the inner wall of the vessel and a vacuum cover 932. The back surface of the sealed vessel 933 is closed with an inner wall 917 of a cryostat 916 for setting a static field magnet (superconductive coil in this case) in a cryogenic environment. A side wall 918 of the cryostat 916 is joined to the vacuum cover 932 with a joint plate 935. The sealed vessel 933 is joined to the gantry base 925 with a vacuum bellows 934 to keep the sealed vessel 933 airtight.

An RF coil 903 is placed on the inner surface of the liner 931. A transmitter and receiver are connected to the RF coil 903. The transmitter supplies a high-frequency current pulse corresponding to a Larmor frequency to the RF coil 903 to excite nuclear magnetization in the object with a high-frequency magnetic field. The transmitter is typically comprised of an oscillating section, phase selecting section, frequency converting section, amplitude modulating section, and high-frequency power amplifying section. The receiver is comprised of a preamplifying section, intermediate frequency converting section, phase detecting section, low-frequency amplifying section, low-pass filter, and A/D converter to receive an MR signal from the object via the RF coil 903.

The transmitter and receiver are housed in an RF unit 940. The RF unit 940 is installed in a place near the RF coil 903 to achieve reduction in power loss and noise by shortening the cable required. In the prior art, as indicated by the dotted line in FIG. 31, the RF unit is mounted on the vacuum cover 932 near an edge portion of an opening portion 941. In this place, however, the leakage magnetic field from the gradient field coil 902 exhibits the highest strength. The RF unit 940 includes many conductive parts, and eddy currents are produced in these conductive parts due to the leakage magnetic field from the gradient field coil 902. As a consequence, the conductive parts vibrate due to the Lorents force. The vibrations propagate to the sealed vessel 933 to cause noise.

It is an object of this embodiment to reduce noise originating from the RF unit 940.

The RF unit 940 is not mounted on the vacuum cover 932 near the edge portion of the opening portion 941 but is installed in a place physically spaced apart from the sealed vessel 933, i.e., a place located outside the RF coil 903 at a position near a position directly below the opening portion 941 in the radial direction of the cylindrical gantry with reference to the central axis (Z-axis). More specifically, the RF unit 940 is installed on the heavy, concrete gantry base 925 or another dedicated base.

In this installation place, the RF unit 940 is affected less by the leakage magnetic field from the RF coil 903 than in the conventional installation place. For this reason, the vibrations of the conductive parts in the RF unit 940 are reduced. In addition, since the RF coil 903 is physically spaced apart from the sealed vessel 933 and is mounted on the heavy, concrete gantry base 925, fine vibrations of the RF coil 903 hardly propagate to the sealed vessel 933.

Noise originating from the RF unit 940 can therefore be reduced.

13th Embodiment

As described above, the gradient field is housed in the sealed vessel which is evacuated by the vacuum pump to prevent noise. As the degree of vacuum (pressure) in a sealed vessel increases (decreases), the noise insulating effect increases. To increase the degree of vacuum in the sealed vessel, the vacuum pump is continuously operated during scanning operation in the prior art. This continuous operation shortens the service life of the vacuum pump. If the vacuum pump with decreased capability is used, the degree of vacuum in the sealed vessel cannot be increased, resulting in a deterioration in noise insulating effect.

This embodiment is configured to keep a noise insulating effect as long as possible by reducing the load on the vacuum pump.

Figure 47:
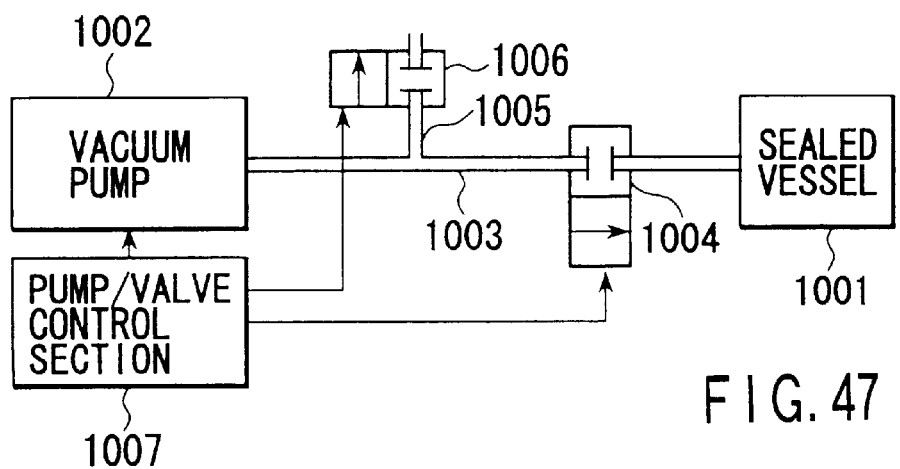
FIG. 47 is a system diagram of a vacuum pump for a sealed vessel according to the 13th embodiment.

FIG. 47 shows a vacuum pump and piping system according to this embodiment. A sealed vessel 1001 is connected to a vacuum pump 1002 via a main tube 1003. A solenoid valve 1004 is placed midway along the main tube 1003. A branch tube 1005 is coupled to the main tube 1003. The distal end of the branch tube 1005 is open to the atmosphere via a solenoid valve 1006.

Figure 48:
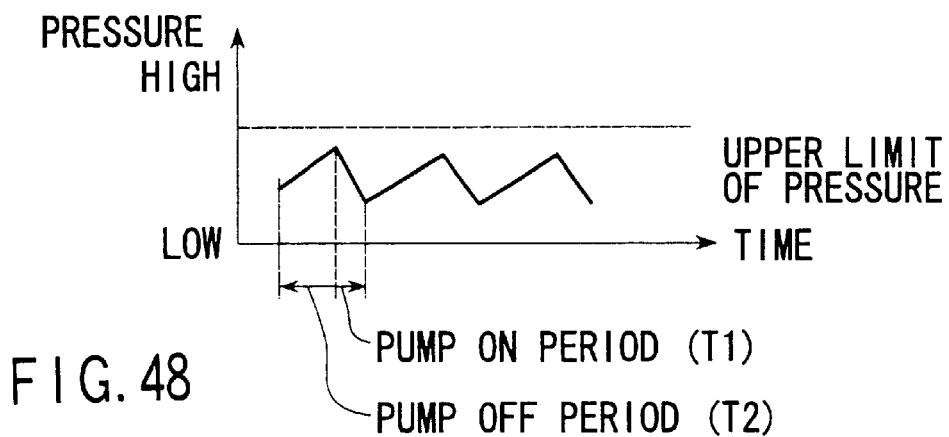
FIG. 48 is a graph showing changes in pressure in the sealed vessel in the 13th embodiment.

The vacuum pump 1002 is driven and the solenoid valves 1004 and 1006 are opened/closed under the control of a pump/valve control section 1020. The vacuum pump 1002 is alternately driven (ON) and stopped (OFF) under the control of the pump/valve control section 1020, as shown in FIG. 48. The duration of an ON period T1 and the duration of an OFF period T2 are set in advance such that the pressure in the sealed vessel 1001 does not exceed a predetermined upper limit. The duration of the ON period T1 and the duration of the OFF period T2 can be arbitrarily adjusted.

Intermittently driving the vacuum pump 1002 in this manner, instead of continuously driving it, can reduce the frequency of maintenance for oil, an oil filter, and the like as compared with a case wherein the vacuum pump 1002 is continuously driven.

Figure 49:
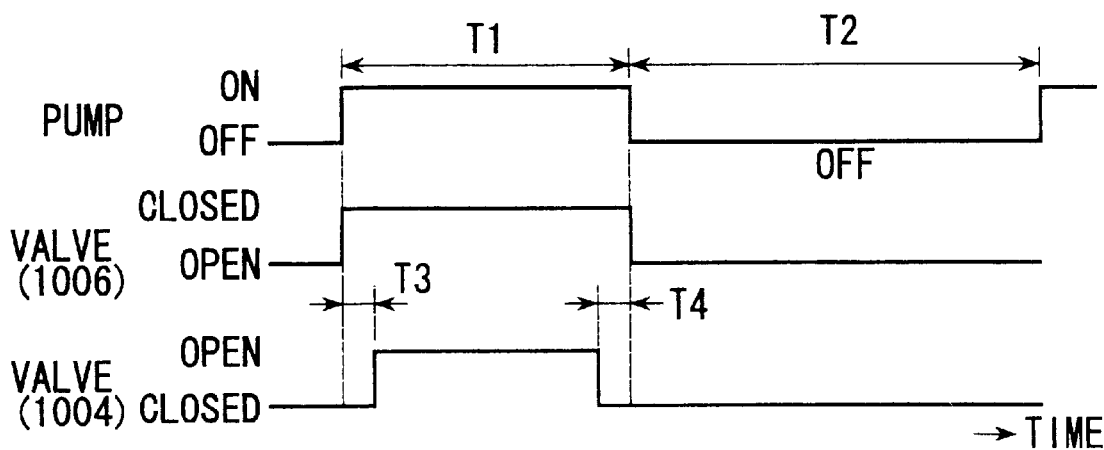
FIG. 49 is a timing chart of ON/OFF operation of the vacuum pump and the opening/closing of valves.

As shown in FIG. 49, the opening/closing of the solenoid valves 1004 and 1006 is interlocked with the intermittent driving of the vacuum pump 1002 by the pump/valve control section 1020.

First of all, the solenoid valve 1006 of the branch tube 1005 is opened/closed in synchronism with the intermittent driving of the vacuum pump 1002. That is, the solenoid valve 1006 is closed in synchronism with switching of the vacuum pump 1002 from the OFF state to the ON state, and vice versa.

To reduce the load on the vacuum pump 1002, the solenoid valve 1004 of the main tube 1003 is opened with a delay of a time T3 with respect to the switching timing of the vacuum pump 1002 at which it is switched from the OFF state to the ON state, and is closed a time T4 earlier than the switching timing of the vacuum pump 1002 at which it is switched from the ON state to the OFF state. These time differences T3 and T4 are set to arbitrary times from several sec to several min.

Since the solenoid valve 1004 is opened with the delay of the time T3 from the OFF-to-ON switching timing of the vacuum pump 1002, lubrication in the vacuum pump 1002 can be completed in a relatively short period of time (pre-vacuum period), i.e., the time T3, after the vacuum pump 1002 is started. This is because the object to be evacuated is a small-volume portion extending from the inlet of the pump to the solenoid valve 1004. When the time T3 has elapsed after the start of the pump, the solenoid valve 1004 of the main tube 1003 is opened to start evacuating operation (main vacuum) for a target having a large total volume of the volume of the portion extending from the solenoid valve 1004 to the sealed vessel 1001 and the volume of the sealed vessel 1001. At this time, lubrication in the vacuum pump 1002 has already been completed, and hence the operation can smoothly shift to the main vacuum operation. The load on the vacuum pump 1002 can therefore be reduced.

When a predetermined time (T1 to T4) has elapsed after the vacuum pump 1002 is started, i.e., at a timing the time T4 earlier than the timing at which the vacuum pump 1002 is turned off, the solenoid valve 1004 of the main tube 1003 is closed. This indicates that the sealed vessel 1001 is isolated from the vacuum pump 1002 when the pressure in the sealed vessel 1001 sufficiently decreases. This makes it possible to prevent an abrupt increase in the pressure in the sealed vessel 1001 upon stopping of the vacuum pump 1002.

14th Embodiment

FIG. 50 shows the arrangement of the main part of a magnetic resonance imaging apparatus according to the 14th embodiment. A gantry 1101 incorporates a static field magnet 1102 for generating a static field H0, a gradient field coil 1103 for receiving a current from a gradient field power supply (G-amp) 1105, an RF coil 1104, and a plurality of shim coils 1116 which receive currents from a shim coil power supply (Shim-amp) 1107 and generate magnetic fields for correcting static field inhomogeneity.

To achieve noise insulation, the gradient field coil 1103 is housed in a sealed vessel 1115 in which a vacuum or similar state is maintained by a vacuum pump 1111. A plurality of vacuum sensors (vacuum gages) 1112 are discretely arranged in the sealed vessel 1115 to measure an internal pressure. The data representing the degree of vacuum measured by the vacuum sensor 1112 is stored in a storage section 1113. Driving state data from the vacuum pump 1111 is stored in the storage section 1113, together with this degree-of-vacuum data. The driving state data indicates the driving time of the vacuum pump 1111.

A maintenance information generating section 1114 generates maintenance information of the sealed vessel 1115 and vacuum pump 1111 on the basis of the degree-of-vacuum data and driving state data stored in the storage section 1113, as needed. The maintenance information generating section 1114 generates maintenance information that prompts maintenance of the vacuum pump 1111 and sealed vessel 1115 when it is determined from the degree-of-vacuum data that the degree of vacuum (pressure) in the sealed vessel 1115 does not decrease below a predetermined pressure corresponding to, for example, a noise level of 99 dB in the imaging area. The maintenance information generating section 1114 also generates maintenance information that prompts maintenance of the vacuum pump 1111 when the cumulative driving time calculated from the driving state data exceeds a predetermined value. Each maintenance information is, for example, a message that prompts maintenance of the sealed vessel 1115 or vacuum pump 1111, and is displayed on a display 1110.

A receiver 1108 acquires an MR signal (high-frequency signal) via the RF coil 1104, performs pre-processes such as detection and A/D conversion for the signal, and outputs the resultant signal to a processor 1109. The processor 1109 processes the acquired MR data to generate an image and spectrum. The image and spectrum are sent to the display 1110 to be displayed.

The processor 1109 has the function of correcting the phase of the MR data acquired by the receiver 1108 and performing frequency shift on the basis of degree-of-vacuum data as well as the main function of generating images and spectra. As the degree of vacuum varies, the strength H0 of the static field varies. As the strength H0 of the static field varies, for example, a resonance frequency f0 of a proton varies in the static field on which no gradient field is superimposed. The processor 1109 holds data representing the relationship between the degree of vacuum measured in advance and the resonance frequency f0, and specifies the resonance frequency (corrected resonance frequency) f0 corresponding to the degree-of-vacuum data by referring to the relationship data. In MRS (MR spectroscopy), the phase of the MR data acquired by the receiver 1108 is corrected and frequency shift is performed on the basis of this corrected resonance frequency f0. The processor 1109 then generates a spectrum on the basis of this corrected data. In practice, data is repeatedly acquired, and phase correction and frequency shift are performed for each data to generates a plurality of spectra. These spectra are then added together. In EPI (Echo Planar Imaging), an EPI image is generated on the basis of acquired data, and the EPI image is shifted in the phase encoding direction (the shifting of the EPI image largely generates in the phase-encoding direction, and generates in the read-out direction in a small). In practice, data is repeatedly acquired, and an EPI image is generated for each data. Each image is then shifted in the phase encoding direction, and the resultant EPI images are added/subtracted. In the case of a phase image as well, a phase shift amount is calculated on the basis of the corrected resonance frequency f0, and the phase image is corrected on the basis of the phase shift amount.

As described above, according to this embodiment, maintenance information can be generated, as needed. In addition, phase and frequency correction can be made in accordance with variations in degree of vacuum.

15th Embodiment

FIG. 51 shows the arrangement of the main part of a magnetic resonance imaging apparatus according to the 15th embodiment. A gantry 1201 incorporates a static field magnet 1202 for generating a static field H0, a gradient field coil 1203 for receiving a current from a gradient field power supply (G-amp) 1205, an RF coil 1204 connected to a transmitter/receiver (RF-amp) 1208, and a plurality of shim coils 1216 which receive currents from a shim coil power supply (Shim-amp) 1207 and generate magnetic fields for correcting static field inhomogeneity.

To achieve noise insulation, the gradient field coil 1203 is housed in a sealed vessel 1215 in which a vacuum or similar state is maintained by a vacuum pump 1211. A plurality of vacuum sensors (vacuum gages) 1212 are discretely arranged in the sealed vessel 1215 to measure an internal pressure. On the basis of the degree-of-vacuum data measured by the vacuum sensor 1212, a real-time manager 1210 outputs an instruction, e.g., an instruction to wait for the execution of a pulse sequence to a sequence controller 1209 for controlling the gradient field power supply 1205, transmitter/receiver 1208, and shim coil power supply 1207 in accordance with the pulse sequence. The real-time manager 1210 also controls the operation of the vacuum pump 1211 on the basis of the measured degree-of-vacuum data. Note that a system manager 1213 is used to control the overall system in accordance with an instruction input by an operator through a console 1214.

Real-time control of the real-time manager 1210 will be described first. The real-time manager 1210 executes the following functions.

(1) The vacuum pump 1211 is started before scanning operation. The real-time manager 1210 does not output a scan start command to the sequence controller 1209 until the degree of vacuum in the sealed vessel 1215 (pressure in the sealed vessel) decreases below a predetermined value. That is, the real-time manager 1210 outputs a scan start command to the sequence controller 1209 only when the degree of vacuum exceeds the predetermined value.

(2) In executing a pulse sequence sensitive to magnetic field variations, e.g., MRS or EPI, the real-time manager 1210 continuously drives the vacuum pump 1211 during scanning operation.

(3) When the degree of vacuum exceeds the predetermined value during scanning operation, the real-time manager 1210 outputs a command to stop the scanning operation to the sequence controller 1209.

(4) When the degree of vacuum decreases below the predetermined value, the real-time manager 1210 drives the vacuum pump 1211 before scanning operation, and does not output a scan start command to the sequence controller 1209 until the degree of vacuum reaches a predetermined value.

(5) The real-time manager 1210 selectively uses a driving pattern for the vacuum pump 1211 in accordance with imaging conditions (e.g., the type of pulse sequence, an average number, and dynamic imaging). In executing, for example, a pulse sequence in the spin echo method or the like, which is not very sensitive to magnetic field variations, the real-time manager 1210 intermittently drives the vacuum pump 1211, as shown in FIG. 52A. For example, the real-time manager 1210 drives the vacuum pump 1211 for a period $\Delta T1$, and stops it for a period $\Delta t1$. The vacuum pump 1211 is alternately driven/stopped repeatedly in this manner. In executing a pulse sequence which is relatively sensitive to magnetic field variations, as shown in FIG. 52B, the real-time manager 1210 sets a driving period $\Delta T2$ and stop period $\Delta t2$ of the pump 1211 to be shorter than $\Delta T1$ and $\Delta t1$, thus reducing the width of magnetic field variations. In executing a pulse sequence which is very sensitive to magnetic field variations, e.g., MRS or EPI, the real-time manager 1210 continuously drives the vacuum pump 1211 as shown in FIG. 52C in the same manner as in (2). In addition, in executing a pulse sequence which is very sensitive to magnetic field variations, e.g., MRS or EPI, the real-time manager 1210 may stop the pump 1211 and set the atmospheric pressure in the sealed vessel instead of continuously driving the pump 1211. In this case, although a noise reducing effect cannot be expected, at least magnetic field variations can be eliminated. To properly reconstruct images even at the atmospheric pressure, the real-time manager 1210 holds image quality parameter (magnetic field inhomogeneity, center frequency, and phase shift) information corresponding to the atmospheric pressure in advance, and the transmitter/receiver 1208 adjusts the shim coil current, the center frequency and phase of a high-frequency current pulse in the transmitter/receiver 1208, and the reference frequency and phase of a reception system in accordance with these parameters.

(6) The real-time manager 1210 drives/stops the pump 1211 in accordance with the comparison result between the measured degree of vacuum and the predetermined value. More specifically, when the measured degree of vacuum exceeds an upper limit, the real-time manager 1210 drives the pump 1211. When the measured degree of vacuum is below a lower limit, the real-time manager 1210 stops the pump 1211. This makes it possible to suppress variations in degree of vacuum between the upper limit value and the lower limit value. The upper and lower limit values can be changed in accordance with imaging conditions as in the case of (5).

(7) If the degree of vacuum does not decrease below the predetermined value even after the pump 1211 is continuously driven, a warning is generated by sound or image display.

The real-time manager 1210 also has the function of performing the following corrections in accordance with the degree of vacuum. (1) Magnetic field inhomogeneity changes depending on the degree of vacuum. The relationship between the degree of vacuum and magnetic field inhomogeneity is measured and held in the real-time manager 1210 in advance. The real-time manager 1210 specifies magnetic field inhomogeneity in accordance with the degree of vacuum by referring to this relationship, and adjusts the shim coil current to be supplied to the shim coil power supply 1207 in accordance with the specified magnetic field inhomogeneity. This makes it possible to quickly correct magnetic field inhomogeneity. In practice, the relationship between the degree of vacuum and magnetic field inhomogeneity is discretely measured, and magnetic field inhomogeneity can be obtained by linear interpolation from the discrete value. (2) As the degree of vacuum varies, the strength of the static field varies. As a result, a resonance frequency $B0$ of a proton varies in the static field on which no gradient field is superimposed. The real-time manager 1210 adjusts the center frequency and phase of a high-frequency current pulse in the transmission system of the transmitter/receiver 1208 in accordance with the resonance frequency $B0$ corresponding to this degree of vacuum. In addition, the real-time manager 1210 adjusts the reference frequency and phase of the reception system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus for generating an MR signal from an object to be examined by applying a gradient field pulse generated by a gradient field coil and a high-frequency magnetic field pulse generated by a high-frequency coil onto the object in a static field generated by a static field magnet, and reconstructing an image on the basis of the MR signal, said apparatus comprising:

a sealed vessel housing said gradient field coil; and cables extending from an external power supply and connected to said gradient field coil, said cables being provided substantially parallel to magnetic lines of force in the static field;

wherein said static field magnet has a substantially cylindrical shape, and said cables are provided along a radial direction of the cylindrical shape.

2. A magnetic resonance imaging apparatus according to claim 1 wherein said cables are radially arranged with a central axis of said static field magnet as a center.

3. A magnetic resonance imaging apparatus for generating an MR signal from an object to be examined by applying a gradient field pulse generated by a gradient field coil and a high-frequency magnetic field pulse generated by a high-frequency coil onto the object in a static field generated by a static field magnet, and reconstructing an image on the basis of the MR signal, said apparatus comprising:

a sealed vessel housing said gradient field coil; and cables extending from an external power supply and connected to said gradient field coil, said cables being provided substantially parallel to magnetic lines of force in the static field;

wherein said cables are fixed to said static field magnet through vibration absorbing members.

4. A magnetic resonance imaging apparatus according to claim 3 wherein said cables are provided to extend through said sealed vessel.

5. A magnetic resonance imaging apparatus for generating an MR signal from an object to be examined by applying a gradient field pulse generated by a gradient field coil and a high-frequency magnetic field pulse generated by a high-frequency coil onto the object in a static field generated by a static field magnet, and reconstructing an image on the basis of the MR signal, said apparatus comprising:

a sealed vessel housing said gradient field coil; and cables extending from an external power supply and connected to said gradient field coil, said cables being provided substantially parallel to magnetic lines of force in the static field;

wherein said cables are fixed to a cable table fixed to a base.

6. A magnetic resonance imaging apparatus according to claim 5 wherein said gradient field coil is supported on a base through vibration absorbing members.

* * * * *